United States Patent
Ashikawa et al.

(10) Patent No.: US 12,075,211 B2
(45) Date of Patent: Aug. 27, 2024

(54) LAMINATED PIEZOELECTRIC ELEMENT AND ELECTROACOUSTIC TRANSDUCER

(71) Applicant: FUJIFILM Corporation, Tokyo (JP)

(72) Inventors: Teruo Ashikawa, Minamiashigara (JP); Kazuo Hiraguchi, Minamiashigara (JP); Yusuke Kagawa, Minamiashigara (JP); Tetsu Miyoshi, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 190 days.

(21) Appl. No.: 17/946,825

(22) Filed: Sep. 16, 2022

(65) Prior Publication Data
US 2023/0019706 A1   Jan. 19, 2023

Related U.S. Application Data

(63) Continuation of application No. PCT/JP2021/007901, filed on Mar. 2, 2021.

(30) Foreign Application Priority Data

Mar. 19, 2020 (JP) ................................ 2020-049274
Dec. 22, 2020 (JP) ................................ 2020-212292

(51) Int. Cl.
*H04R 17/00* (2006.01)
*H10N 30/50* (2023.01)
(Continued)

(52) U.S. Cl.
CPC ............ *H04R 17/00* (2013.01); *H10N 30/50* (2023.02); *H10N 30/872* (2023.02); *H10N 30/883* (2023.02)

(58) Field of Classification Search
CPC ....... H04R 17/00; H04R 17/005; H10N 30/50
See application file for complete search history.

(56) References Cited

U.S. PATENT DOCUMENTS 5,153,859 A * 10/1992 Chatigny ............. H10N 30/857
                                                29/25.35
5,367,500 A * 11/1994 Ng ......................... H04R 17/02
                                                310/800
(Continued)

FOREIGN PATENT DOCUMENTS

JP       2009-94259 A      4/2009
JP       2010-177867 A     8/2010
(Continued)

OTHER PUBLICATIONS

Korean Office Action for corresponding Korean Application No. 10-2022-7031142, dated Mar. 19, 2024, with an English translation.
(Continued)

*Primary Examiner* — Ryan Robinson
(74) *Attorney, Agent, or Firm* — Birch, Stewart, Kolasch & Birch, LLP

(57) ABSTRACT

Provided are a laminated piezoelectric element and an electroacoustic transducer capable of obtaining high piezoelectric characteristics and easily ensuring an electric contact to an electrode layer. A plurality of layers of piezoelectric films, each of which is formed by laminating a first protective layer, a first electrode layer, a piezoelectric layer, a second electrode layer, and a second protective layer in this order, are laminated. Each of the piezoelectric layers is polarized in a thickness direction. In each of the piezoelectric films, the first electrode is disposed on an upstream side in a polarization direction of the piezoelectric layer, and the second electrode is disposed on a downstream side. Each of the plurality of piezoelectric films has a cemented portion which is cemented to an adjacent piezoelectric film and a protruding portion which is not cemented to the adjacent piezoelectric film and in which at least the first electrode layer and the first protective layer or the second electrode layer and the second protective layer protrude from the (Continued)

cemented portion toward the outside in a plane direction. At the protruding portion of each of the piezoelectric films, at least one of a first contact, to which the first electrode layers of the piezoelectric films are electrically connected to each other, or a second contact, to which the second electrode layers of the piezoelectric films are electrically connected to each other, is formed.

20 Claims, 27 Drawing Sheets

(51) Int. Cl.
*H10N 30/87* (2023.01)
*H10N 30/88* (2023.01)

(56) References Cited

U.S. PATENT DOCUMENTS

| | | | | |
|---|---|---|---|---|
| 6,545,395 | B2* | 4/2003 | Matsui | H10N 30/093 310/365 |
| 9,748,469 | B2* | 8/2017 | Lim | H10N 30/50 |
| 11,095,989 | B2* | 8/2021 | Chen | H04R 7/04 |
| 11,140,500 | B2* | 10/2021 | Murakami | G10H 3/14 |
| 11,540,074 | B2* | 12/2022 | Murakami | H04R 17/005 |
| 2016/0014527 | A1 | 1/2016 | Miyoshi et al. | |
| 2017/0173634 | A1 | 6/2017 | Hashimoto et al. | |
| 2017/0365771 | A1 | 12/2017 | Ozawa et al. | |
| 2018/0160248 | A1 | 6/2018 | Murakami et al. | |

FOREIGN PATENT DOCUMENTS

| | | |
|---|---|---|
| JP | 2014-209724 A | 11/2014 |
| JP | 2017-228562 A | 12/2017 |
| WO | WO2016/039138 A1 | 3/2016 |
| WO | WO2017/018313 A1 | 2/2017 |
| WO | WO2019/078053 A1 | 4/2019 |

OTHER PUBLICATIONS

International Preliminary Report on Patentability and English translation of the Written Opinion of the International Searching Authority (Forms PCT/IB/326, PCT/IB/373 and PCT/ISA/237) for International Application No. PCT/JP2021/007901, dated Sep. 29, 2022.
International Search Report (Form PCT/ISA/210) for International Application No. PCT/JP2021/007901, dated May 18, 2021, with English translation.
Japanese Office Action dated Nov. 14, 2023 for corresponding Application No. 2022-508187 with an English translation.
Extended European Search Report for corresponding European Application No. 21771776.8, dated Aug. 7, 2023.
Japanese Notice of Reasons for Refusal for corresponding Japanese Application No. 2022-508187; dated Aug. 1, 2023, with an English translation.

* cited by examiner

LAMINATED PIEZOELECTRIC ELEMENT AND ELECTROACOUSTIC TRANSDUCER

CROSS-REFERENCE TO RELATED APPLICATIONS

This application is a Continuation of PCT International Application No. PCT/JP2021/007901 filed on Mar. 2, 2021, which claims priority under 35 U.S.C. § 119(a) to Japanese Patent Application No. 2020-049274 filed on Mar. 19, 2020 and Japanese Patent Application No. 2020-212292 filed on Dec. 22, 2020. Each of the above applications is hereby expressly incorporated by reference, in its entirety, into the present application.

BACKGROUND OF THE INVENTION

1. Field of the Invention

The present invention relates to a laminated piezoelectric element and an electroacoustic transducer.

2. Description of the Related Art

Piezoelectric elements are used in various applications as so-called exciters (exciton) that vibrate articles to generate sound in a case where the elements are attached in contact with various articles. For example, by attaching an exciter to an image display panel, a screen, or the like and vibrating them, sound can be generated instead of a speaker.

By the way, in a case where an exciter is attached to a flexible image display device, a rollable screen, or the like, it is necessary for the exciter itself to be flexible (rollable) at least in a case where the exciter is not in use.

As a flexible piezoelectric element, a piezoelectric film in which a piezoelectric layer is interposed between an electrode layer and a protective layer has been proposed.

For example, JP2014-209724A describes an electroacoustic conversion film having a piezoelectric laminate, a metal foil for extracting an upper electrode, and a metal foil for extracting a lower electrode. The piezoelectric laminate has a polymer-based piezoelectric composite material that is formed by dispersing piezoelectric particles in a viscoelastic matrix made of a polymer material having viscoelasticity at room temperature, an upper thin film electrode that is formed on one surface of the polymer-based piezoelectric composite material and has an area of equal to or less than that of the polymer-based piezoelectric composite material, an upper protective layer that is formed on a surface of the upper thin film electrode and has an area of equal to or greater than that of the upper thin film electrode, a lower thin film electrode that is formed on the opposite surface of the upper thin film electrode of the polymer-based piezoelectric composite material and has an area equal to or less than that of the polymer-based piezoelectric composite material, and a lower protective layer that is formed on the surface of the lower thin film electrode and has an area equal to or larger than that of the lower thin film electrode. The metal foil for extracting the upper electrode is laminated on a part of the upper thin film electrode, and at least a part thereof is located outside the plane direction of the polymer-based piezoelectric composite material. The metal foil for extracting a lower electrode is laminated on a part of the lower thin film electrode, and at least a part thereof is located outside the plane direction of the polymer-based piezoelectric composite material.

Such a piezoelectric film is in the form of a film and has a limited spring constant. Therefore, an output thereof is insufficient in a case where the piezoelectric film is used as an exciter. Therefore, it is conceivable that the spring constant is increased by laminating the piezoelectric film and the output is increased.

SUMMARY OF THE INVENTION

However, it was found that, in a case where the piezoelectric film having the piezoelectric layer interposed between the electrode layer and the protective layer as described above is laminated, the output of the laminated piezoelectric element may decrease or may not be deformed as a whole, depending on the direction of polarization of the piezoelectric layer of the piezoelectric film and the direction of the polarity of the electrode.

Further, in the piezoelectric film as described above, in a case where the electrode layer is excessively thick, the piezoelectric layer is prevented from being deformed and the output is lowered. Therefore, the electrode layer is formed extremely thin. In order to form a configuration in which the piezoelectric layer is interposed between thin electrode layers, in a case where the piezoelectric film as described above is produced, the electrode layer is provided in a state of being formed on a protective layer serving as a support. Therefore, the outermost layers on both principal surfaces of the piezoelectric film serve as protective layers, and it is difficult to ensure an electric contact on the electrode layer.

In order to solve such a problem of the prior art, an object of the present invention is to provide a laminated piezoelectric element capable of obtaining high piezoelectric characteristics and easily ensuring an electric contact to an electrode layer.

In order to solve such a problem, the present invention has the following configurations.

[1] A laminated piezoelectric element,
in which a plurality of layers of piezoelectric films, each of which is formed by laminating a first protective layer, a first electrode layer, a piezoelectric layer, a second electrode layer, and a second protective layer in this order, are laminated,
each of the piezoelectric layers is polarized in a thickness direction,
in each of the piezoelectric films, the first electrode is disposed on an upstream side in a polarization direction of the piezoelectric layer, and the second electrode is disposed on a downstream side,
each of the plurality of piezoelectric films has a cemented portion which is cemented to an adjacent piezoelectric film and a protruding portion which is not cemented to the adjacent piezoelectric film and in which at least the first electrode layer and the first protective layer or the second electrode layer and the second protective layer protrude from the cemented portion toward the outside in a plane direction, and
at the protruding portion of each of the piezoelectric films, at least one of a first contact, to which the first electrode layers of the piezoelectric films are electrically connected to each other, or a second contact, to which the second electrode layers of the piezoelectric films are electrically connected to each other, is formed.

[2] The laminated piezoelectric element according to [1], in which the protruding portion has a configuration in which the first protective layer, the first electrode layer, the piezoelectric layer, the second electrode layer, and the second protective layer are laminated.

[3] The laminated piezoelectric element according to [1] or [2], in which the protruding portions of the piezoelectric films are disposed such that at least parts thereof do not overlap with each other in the plane direction.

[4] The laminated piezoelectric element according to [1] or [2], in which the protruding portions of the piezoelectric films protrude from same positions on the cemented portions in the plane direction, and lengths thereof in a protrusion direction are different from each other.

[5] The laminated piezoelectric element according to [1] or [2], in which the protruding portion of each of the piezoelectric films has a width in a direction orthogonal to a protrusion direction being equal to a width of the cemented portion.

[6] The laminated piezoelectric element according to any one of [1] to [5], in which at least one of the plurality of piezoelectric films has a bellows shape that is folded back at least once.

[7] The laminated piezoelectric element according to any one of [1] to [6], in which a corner portion of a connection portion between the protruding portion and the cemented portion of the piezoelectric film is provided with an R structure of 0.5 mm or greater.

[8] The laminated piezoelectric element according to any one of [1] to [7], in which the adjacent piezoelectric films are disposed such that the first electrode sides or the second electrode sides face each other.

[9] The laminated piezoelectric element according to [8], in which one of the protruding portions of the adjacent piezoelectric films is bent in a protrusion direction.

[10] The laminated piezoelectric element according to any one of [1] to [9], in which a conductive film connecting the first electrode layers to each other or the second electrode layers to each other is cemented to the protruding portion of each of the piezoelectric films, and the protruding portion of each of the piezoelectric films is bent toward one principal surface side of the cemented portion.

[11] The laminated piezoelectric element according to any one of [1] to [10], in which a width of the protruding portion in a direction orthogonal to a protrusion direction is narrower on a distal end side than on a cemented portion side.

[12] The laminated piezoelectric element according to [11], in which the width of the protruding portion gradually narrows as a distance from the cemented portion increases.

[13] The laminated piezoelectric element according to [12], in which the protruding portion has a trapezoidal shape as viewed from a direction perpendicular to a principal surface of the cemented portion.

[14] An electroacoustic transducer comprising: the laminated piezoelectric element according to any one of [1] to [13]; and a vibration plate to which the laminated piezoelectric element is fixed.

[15] The electro acoustic transducer according to [14], in which the vibration plate and the laminated piezoelectric element are cemented by a cementing agent.

[16] The electroacoustic transducer according to [15], in which the vibration plate has a quadrangular shape of which at least one group of two facing sides is fixed, and in a case where a distance between fixed ends of the two facing sides is L, cementing of the laminated piezoelectric element to the vibration plate is performed at positions separated from the fixed ends by "0.1×L" or greater.

[17] The electroacoustic transducer according to [16], in which the vibration plate has a rectangular shape or a square shape.

[18] The electroacoustic transducer according to [16] or [17], in which a spring constant of the vibration plate is equal to or greater than $1 \times 10^4$ and equal to or less than $1 \times 10^7$ N/m.

According to the present invention as described above, it is possible to provide a laminated piezoelectric element capable of obtaining high piezoelectric characteristics and easily ensuring an electric contact on the electrode layer.

DESCRIPTION OF THE PREFERRED EMBODIMENTS

Hereinafter, a laminated piezoelectric element of the present invention will be described in detail on the basis of the preferred embodiments shown in the accompanying drawings.

Descriptions of the constituent requirements described below may be made on the basis of representative embodiments of the present invention, but the present invention is not limited to such embodiments.

In the present specification, a numerical range expressed using "to" means a range including numerical values described before and after "to" as a lower limit and an upper limit.

In the laminated piezoelectric material of the present invention,
a plurality of layers of piezoelectric films, each of which is formed by laminating a first protective layer, a first electrode layer, a piezoelectric layer, a second electrode layer, and a second protective layer in this order, are laminated,
each of the piezoelectric layers is polarized in a thickness direction,
in each of the piezoelectric films, the first electrode is disposed on an upstream side in a polarization direction of the piezoelectric layer, and the second electrode is disposed on a downstream side,
each of the plurality of piezoelectric films has a cemented portion which is cemented to an adjacent piezoelectric film and a protruding portion which is not cemented to the adjacent piezoelectric film and in which at least the first electrode layer and the first protective layer or the second electrode layer and the second protective layer protrude from the cemented portion toward the outside in a plane direction, and
at the protruding portion of each of the piezoelectric films, at least one of a first contact, to which the first electrode layers of the piezoelectric films are electrically connected to each other, or a second contact, to which the second electrode layers of the piezoelectric films are electrically connected to each other, is formed.

Figure 1:
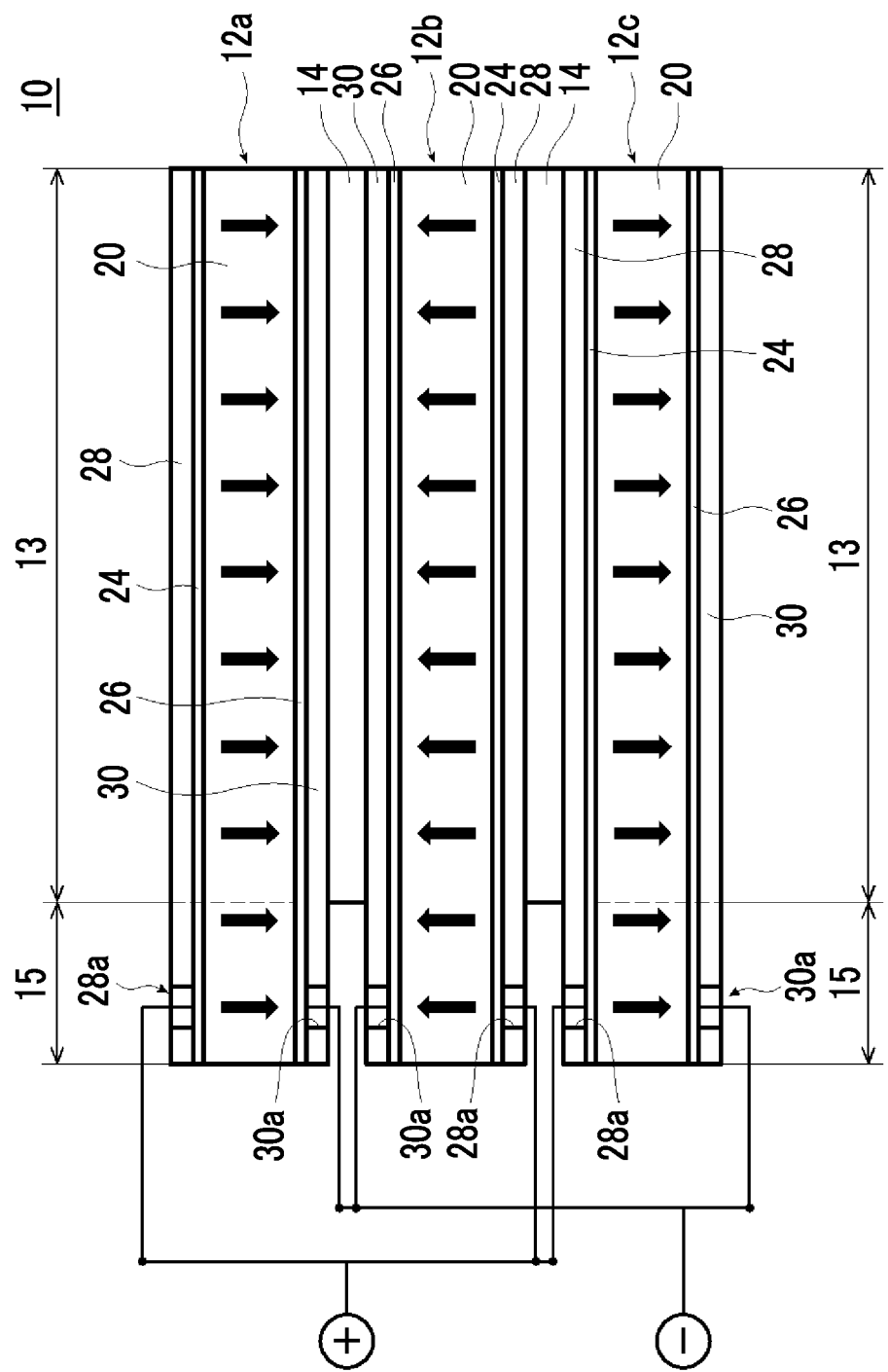
FIG. 1 is a diagram conceptually illustrating an example of a laminated piezoelectric element of the present invention.

FIG. 1 conceptually shows an example of the laminated piezoelectric element of the present invention.

The laminated piezoelectric element 10 shown in FIG. 1 has a configuration in which three piezoelectric films 12a, 12b, and 12c are laminated, and adjacent piezoelectric films are cemented by an adhesive layer (cementing layer) 14. A power source for applying a driving voltage for stretching and contracting the piezoelectric film is connected to each piezoelectric film.

The laminated piezoelectric element 10 shown in FIG. 1 is formed by laminating three piezoelectric films, but the present invention is not limited thereto. That is, the number of laminated piezoelectric films may be two layers or four or greater layers as long as the laminated piezoelectric element of the present invention is formed by laminating a plurality of layers of the piezoelectric films. In this regard, the same applies to a laminated piezoelectric element, which will be described later.

Figure 2:
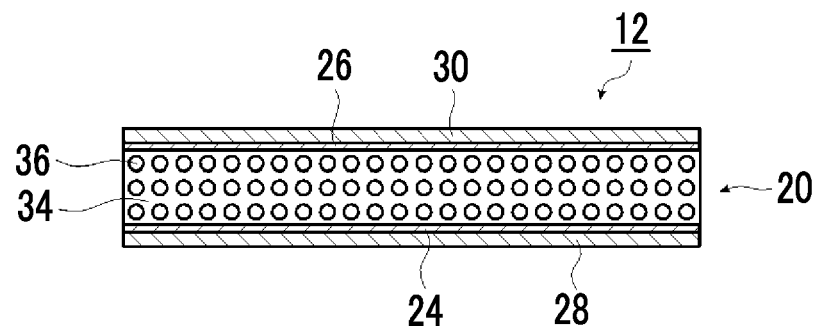
FIG. 2 is a diagram conceptually showing an example of a piezoelectric film included in the laminated piezoelectric element shown in FIG. 1.

FIG. 2 conceptually shows a piezoelectric film 12 in a cross-sectional view. In addition, in FIG. 1, the piezoelectric films 12a, 12b and 12c have the same configuration except that the lamination order and the vertical direction are different. Therefore, in the following description, in a case where it is not necessary to distinguish the piezoelectric films, the piezoelectric films may be collectively referred to as the piezoelectric film 12.

As shown in FIG. 2, the piezoelectric film 12 has a piezoelectric layer 20 which is a sheet-like member having piezoelectric characteristics, a first electrode layer 24 laminated on one surface of the piezoelectric layer 20, a first protective layer 28 laminated on the first electrode layer 24, a second electrode layer 26 laminated on the other surface of the piezoelectric layer 20, and a second protective layer 30 laminated on the second electrode layer 26. That is, the piezoelectric film 12 has a configuration in which the first protective layer 28, the first electrode layer 24, the piezoelectric layer 20, the second electrode layer 26, and the second protective layer 30 are laminated in this order. As will be described later, the piezoelectric film 12 (piezoelectric layer 20) is polarized in a thickness direction. The electrode layer and the protective layer on the upstream side in the polarization direction of the piezoelectric film 12 are the first electrode layer 24 and the first protective layer 28, and the electrode layer and the protective layer on the downstream side are the second electrode layer 26 and the second protective layer 30.

In the piezoelectric film 12, as a preferable aspect, as conceptually shown in FIG. 2, the piezoelectric layer 20 consists of a polymer-based piezoelectric composite material in which piezoelectric particles 36 are dispersed in a viscoelastic matrix 34 consisting of a polymer material having viscoelasticity at room temperature. Furthermore, in this specification, the "room temperature" indicates a temperature range of approximately 0° C. to 50° C.

Here, it is preferable that the polymer-based piezoelectric composite material (the piezoelectric layer 20) has the following requisites.
(i) Flexibility For example, in a case of being gripped in a state of being loosely bent like a newspaper or a magazine as a portable device, the polymer-based piezoelectric composite material is continuously subjected to large bending deformation from the outside at a comparatively slow vibration of equal to or less than a few Hz. At this time, in a case where the polymer-based piezoelectric composite material is hard, large bending stress is generated to that extent, and a crack is generated at the interface between the polymer matrix and the piezoelectric particles, possibly leading to breakage. Accordingly, the polymer-based piezoelectric composite material is required to have suitable flexibility. In addition, in a case where strain energy is diffused into the outside as heat, the stress is able to be relieved. Accordingly, the loss tangent of the polymer-based piezoelectric composite material is required to be suitably large.

As described above, a flexible polymer-based piezoelectric composite material used as an exciter is required to be rigid with respect to vibration of 20 Hz to 20 kHz, and be flexible with respect to vibration of equal to or less than a few Hz. In addition, the loss tangent of the polymer-based piezoelectric composite material is required to be suitably large with respect to the vibration of all frequencies of equal to or less than 20 kHz.

Furthermore, it is preferable that the spring constant can be easily adjusted by lamination in accordance with the rigidity (hardness, stiffness, spring constant) of the mating material (vibration plate) to be cemented. At that time, the thinner the adhesive layer 14 is, the higher energy efficiency can be.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (the piezoelectric layer 20), the polymer material of which the glass transition point is room temperature, in other words, the polymer material having viscoelasticity at room temperature is used in the matrix, and thus the polymer-based piezoelectric composite material which is rigid with respect to vibration of 20 Hz to 20 kHz and is flexible with respect to vibration of equal to or less than a few Hz is realized. In particular, from a viewpoint of suitably exhibiting such behavior, it is preferable that a polymer material of which the glass transition point at a frequency of 1 Hz is room temperature, that is, equal to or greater than 0° C. and equal to or less than 50° C. is used in the matrix of the polymer-based piezoelectric composite material.

As the polymer material having viscoelasticity at room temperature, various known materials are able to be used. Preferably, a polymer material of which the local maximum value of a loss tangent Tan δ at a frequency of 1 Hz at room temperature, that is, equal to or greater than 0° C. and equal to or less than 50° C. in a dynamic viscoelasticity test is greater than or equal to 0.5 is used.

Accordingly, in a case where the polymer-based piezoelectric composite material is slowly bent due to an external force, stress concentration on the interface between the polymer matrix and the piezoelectric particles at the maximum bending moment portion is relieved, and thus high flexibility is able to be expected.

In addition, it is preferable that, in the polymer material having viscoelasticity at room temperature, a storage elastic modulus (E') at a frequency of 1 Hz in accordance with dynamic viscoelasticity measurement is greater than or equal to 100 MPa at 0° C. and is equal to or less than 10 MPa at 50° C.

Accordingly, it is possible to reduce a bending moment which is generated in a case where the polymer-based piezoelectric composite material is slowly bent due to the external force, and it is possible to make the polymer-based piezoelectric composite material rigid with respect to acoustic vibration of 20 Hz to 20 kHz.

In addition, it is more suitable that the relative permittivity of the polymer material having viscoelasticity at room temperature is greater than or equal to 10 at 25° C. Accordingly, in a case where a voltage is applied to the polymer-based piezoelectric composite material, a higher electric field is applied to the piezoelectric particles in the polymer matrix, and thus a large deformation amount is able to be expected.

However, in consideration of ensuring favorable moisture resistance or the like, it is suitable that the relative permittivity of the polymer material is equal to or less than 10 at 25° C.

As the polymer material having viscoelasticity at room temperature and satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, as the polymer material, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 34 using such a polymer material having viscoelasticity at room temperature, as necessary, may use a plurality of polymer materials in combination.

That is, in order to control dielectric properties or mechanical properties, other dielectric polymer materials may be added to the viscoelastic matrix 34 in addition to the viscoelastic material such as cyanoethylated PVA, as necessary.

As the dielectric polymer material which is able to be added to the viscoelastic matrix, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyano ethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, and a synthetic rubber such as nitrile rubber or chloroprene rubber are exemplified.

Among them, a polymer material having a cyanoethyl group is suitably used.

Furthermore, the dielectric polymer added to the viscoelastic matrix 34 of the piezoelectric layer 20 in addition to the material having viscoelasticity at room temperature such as cyanoethylated PVA is not limited to one dielectric polymer, and a plurality of dielectric polymers may be added.

In addition, for the purpose of controlling the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, or mica may be added to the viscoelastic matrix 34 in addition to the dielectric polymer.

Furthermore, for the purpose of improving pressure sensitive adhesiveness, a viscosity imparting agent such as rosin ester, rosin, terpene, terpene phenol, and a petroleum resin may be added.

The amount of materials added to the viscoelastic matrix 34 of the piezoelectric layer 20 in a case where materials other than the polymer material having viscoelasticity such as cyanoethylated PVA is not particularly limited, and it is preferable that a ratio of the added materials to the viscoelastic matrix 34 is equal to or less than 30 mass %.

Accordingly, it is possible to exhibit properties of the polymer material to be added without impairing the viscoelasticity relieving mechanism of the viscoelastic matrix 34, and thus a preferable result is able to be obtained from a viewpoint of increasing a dielectric constant, of improving heat resistance, and of improving adhesiveness between the piezoelectric particles 36 and the electrode layer.

The piezoelectric particles 36 consist of ceramics particles having a perovskite type or wurtzite type crystal structure.

As the ceramics particles forming the piezoelectric particles 36, for example, lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$) are exemplified.

The particle diameter of the piezoelectric particles 36 is not limited, and may be appropriately selected depending on the size of the piezoelectric film 12 and the usage of the laminated piezoelectric element 10. The particle diameter of the piezoelectric particles 36 is preferably equal to or greater than 1 μm and equal to or less than 10 μm.

By setting the particle diameter of the piezoelectric particles 36 to be in the range described above, a preferable result is able to be obtained from a viewpoint of allowing the piezoelectric film 12 to achieve both high piezoelectric characteristics and flexibility.

In addition, in FIG. 2, the piezoelectric particles 36 in the piezoelectric layer 20 are uniformly dispersed in the viscoelastic matrix 34 with regularity. However, the present invention is not limited thereto.

That is, in the viscoelastic matrix 34, it is preferable that the piezoelectric particles 36 in the piezoelectric layer 20 are uniformly dispersed, and may also be irregularly dispersed.

In the piezoelectric film 12, a quantitative ratio of the viscoelastic matrix 34 and the piezoelectric particles 36 in the piezoelectric layer 20 is not limited, and may be appropriately set in accordance with the size in the plane direction or the thickness of the piezoelectric film 12, the usage of the laminated piezoelectric element 10, properties required for the piezoelectric film 12, and the like.

The volume fraction of the piezoelectric particles 36 in the piezoelectric layer 20 is set to preferably equal to or greater than 30% and equal to or less than 80%, more preferably equal to or greater than 50%, and therefore even more preferably equal to or greater than 50% and equal to or less than 80%.

By setting the quantitative ratio of the viscoelastic matrix 34 and the piezoelectric particles 36 to be in the range described above, it is possible to obtain a preferable result from a viewpoint of making high piezoelectric characteristics and flexibility compatible.

In the above-mentioned piezoelectric film 12, as a preferable aspect, the piezoelectric layer 20 is a polymer-based piezoelectric composite layer formed by dispersing piezoelectric particles in a viscoelastic matrix containing a polymer material having viscoelasticity at room temperature. However, the present invention is not limited thereto, and various known piezoelectric layers used in known piezoelectric elements are able to be used as the piezoelectric layer of the piezoelectric film.

For example, a piezoelectric layer consisting of the above-mentioned dielectric polymer material such as polyvinylidene fluoride (PVDF) and a vinylidene fluoride-tetrafluoroethylene copolymer, and a piezoelectric layer consisting of the above-mentioned piezoelectric body such as PZT, PLZT, barium titanate, zinc oxide, or BFBT are exemplified.

In the piezoelectric film 12, the thickness of the piezoelectric layer 20 is not particularly limited, and may be appropriately set in accordance with the usage of the laminated piezoelectric element 10, the number of laminated piezoelectric films in the laminated piezoelectric element 10, properties required for the piezoelectric film 12, and the like.

The thicker the piezoelectric layer 20, the more advantageous it is in terms of rigidity such as the stiffness of a so-called sheet-like member, but the voltage (potential difference) required to stretch and contract the piezoelectric film 12 by the same amount increases.

The thickness of the piezoelectric layer 20 is preferably equal to or greater than 10 μm and equal to or less than 300 μm, more preferably equal to or greater than 20 μm and equal to or less than 200 μm, and even more preferably equal to or greater than 30 μm and equal to or less than 150 μm.

By setting the thickness of the piezoelectric layer 20 to be in the range described above, it is possible to obtain a preferable result from a viewpoint of compatibility between ensuring the rigidity and appropriate flexibility, or the like.

As shown in FIG. 2, the piezoelectric film 12 in the shown example has a configuration in which the first electrode layer 24 is provided on one surface of the piezoelectric layer 20, the first protective layer 28 is provided thereon, the second electrode layer 26 is provided on the other surface of the piezoelectric layer 20, and the second protective layer 30 is provided thereon. Here, the second electrode layer 26 and the first electrode layer 24 form an electrode pair.

In addition to these layers, the piezoelectric film 12 may have, for example, an insulation layer or the like that covers a region such as a side surface where the piezoelectric layer 20 is exposed to prevent a short circuit or the like.

That is, the piezoelectric film 12 has a configuration in which both surfaces of the piezoelectric layer 20 are interposed between the electrode pair, that is, the first electrode layer 24 and the second electrode layer 26 and the laminate is further interposed between the first protective layer 28 and the second protective layer 30.

As described above, in the piezoelectric film 12, the region interposed between the first electrode layer 24 and the second electrode layer 26 is stretched and contracted according to an applied voltage.

As described above, the first electrode layer 24 and the first protective layer 28, and the second electrode layer 26 and the second protective layer 30 are named in accordance with the polarization direction of the piezoelectric layer 20. Accordingly, the first electrode layer 24 and the second electrode layer 26, and the first protective layer 28 and the second protective layer 30 have basically the same configuration.

In the piezoelectric film 12, the first protective layer 28 and the second protective layer 30 have a function of covering the first electrode layer 24 and the second electrode layer 26 and applying appropriate rigidity and mechanical strength to the piezoelectric layer 20. That is, there may be a case where, in the piezoelectric film 12, the piezoelectric layer 20 consisting of the viscoelastic matrix 34 and the piezoelectric particles 36 exhibits extremely superior flexibility under bending deformation at slow vibration but has insufficient rigidity or mechanical strength depending on the usage. As a compensation for this, the piezoelectric film 12 is provided with the first protective layer 28 and the second protective layer 30.

The first protective layer 28 and the second protective layer 30 are not limited, and may use various sheet-like members. For example, various resin films are suitably exemplified.

Among them, by the reason of excellent mechanical properties and heat resistance, a resin film consisting of polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), or a cyclic olefin-based resin is suitably used.

There is no limitation on the thicknesses of the first protective layer 28 and the second protective layer 30. In addition, the thicknesses of the first protective layer 28 and the second protective layer 30 may basically be identical to each other or different from each other from each other.

Here, in a case where the rigidity of the first protective layer 28 and the second protective layer 30 is too high, not only is the stretching and contracting of the piezoelectric layer 20 constrained, but also the flexibility is impaired. Therefore, there is an advantage in a case where the thicknesses of first protective layer 28 and the second protective layer 30 are smaller unless mechanical strength or favorable handleability as a sheet-like member is required.

In the piezoelectric film 12, in a case where the thickness of the first protective layer 28 and the second protective layer 30 is equal to or less than twice the thickness of the piezoelectric layer 20, it is possible to obtain a preferable result from a viewpoint of compatibility between ensuring the rigidity and appropriate flexibility, or the like.

For example, in a case where the thickness of the piezoelectric layer 20 is 50 μm and the first protective layer 28 and the second protective layer 30 consist of PET, the thickness of the second protective layer 30 and the first protective layer 28 is preferably equal to or less than 100 μm, more preferably equal to or less than 50 μm, and even more preferably equal to or less than 25 μm.

In the piezoelectric film 12, the first electrode layer 24 is formed between the piezoelectric layer 20 and the first protective layer 28, and the second electrode layer 26 is formed between the piezoelectric layer 20 and the second protective layer 30. The first electrode layer 24 and the second electrode layer 26 are provided to apply a voltage to the piezoelectric layer 20 (the piezoelectric film 12).

In the present invention, a forming material of the first electrode layer 24 and the second electrode layer 26 is not limited, and as the forming material, various conductive bodies are able to be used. Specifically, metals such as carbon, palladium, iron, tin, aluminum, nickel, platinum, gold, silver, copper, titanium, chromium, and molybdenum, alloys thereof, laminates and composites of these metals and alloys, indium-tin oxide, and the like are exemplified. Among them, copper, aluminum, gold, silver, platinum, and indium-tin oxide are suitably exemplified as the first electrode layer 24 and the second electrode layer 26.

In addition, a forming method of the first electrode layer 24 and the second electrode layer 26 is not limited, and various known methods such as a vapor-phase deposition method (a vacuum film forming method) such as vacuum vapor deposition or sputtering, film formation using plating, and a method of cementing a foil formed of the materials described above are able to be used.

Among them, in particular, by the reason that the flexibility of the piezoelectric film 12 is able to be ensured, a thin film made of copper, aluminum, or the like formed by using the vacuum vapor deposition is suitably used as the first electrode layer 24 and the second electrode layer 26. Among them, in particular, the copper thin film formed by using the vacuum vapor deposition is suitably used.

There is no limitation on the thicknesses of the first electrode layer 24 and the second electrode layer 26. Further, the thicknesses of the first electrode layer 24 and the second electrode layer 26 may basically be identical to each other or different from each other.

Here, similarly to the first protective layer 28 and second protective layer 30 mentioned above, in a case where the rigidity of the first electrode layer 24 and the second electrode layer 26 is too high, not only is the stretching and contracting of the piezoelectric layer 20 constrained, but also the flexibility is impaired. Therefore, there is an advantage in a case where the thicknesses of first electrode layer 24 and the second electrode layer 26 are smaller as long as electrical resistance is not excessively high.

In the piezoelectric film 12, in a case where the product of the thicknesses of the first electrode layer 24 and the second electrode layer 26 and the Young's modulus is less than the product of the thicknesses of the first protective layer 28 and the second protective layer 30 and the Young's modulus, the flexibility is not considerably impaired, which is suitable.

For example, in a case of a combination consisting of the first protective layer 28 and the second protective layer 30 formed of PET (Young's modulus: approximately 6.2 GPa) and the first electrode layer 24 and the second electrode layer 26 formed of copper (Young's modulus: approximately 130 GPa), in a case where the thickness of the first protective layer 28 and the second protective layer 30 is 25 μm, the thickness of the second electrode layer 26 and the first electrode layer 24 is preferably equal to or less than 1.2 μm, more preferably equal to or less than 0.3 μm, and particularly preferably equal to or less than 0.1 μm.

As described above, the piezoelectric film 12 has a configuration in which the piezoelectric layer 20 in which the piezoelectric particles 36 are dispersed in the viscoelastic matrix 34 containing the polymer material having viscoelasticity at room temperature is interposed between the first electrode layer 24 and the second electrode layer 26 and the laminate is interposed between the first protective layer 28 and the second protective layer 30.

In the piezoelectric film 12, it is preferable that the local maximum value of the loss tangent (Tan δ) at a frequency of 1 Hz in accordance with the dynamic viscoelasticity measurement exists at room temperature, and it is more preferable that a local maximum value of greater than or equal to 0.1 exists at room temperature.

Accordingly, even in a case where the piezoelectric film 12 is subjected to large bending deformation from the outside at a comparatively slow vibration of equal to or less than a few Hz, it is possible to effectively diffuse the strain energy to the outside as heat, and thus it is possible to prevent a crack from being generated on the interface between the polymer matrix and the piezoelectric particles.

In the piezoelectric film 12, it is preferable that the storage elastic modulus (E') at a frequency of 1 Hz in accordance with the dynamic viscoelasticity measurement is 10 to 30 GPa at 0° C., and 1 to 10 GPa at 50° C.

Accordingly, the piezoelectric film 12 is able to have large frequency dispersion in the storage elastic modulus (E') at room temperature. That is, the piezoelectric film 12 is able to be rigid with respect to vibration equal to or greater than 20 Hz and equal to or less than 20 kHz, and is able to be flexible with respect to vibration of equal to or less than a few Hz.

In addition, in the piezoelectric film 12, it is preferable that the product of the thickness and the storage elastic modulus (E') at a frequency of 1 Hz in accordance with the dynamic viscoelasticity measurement is $1.0 \times 10^6$ to $2.0 \times 10^6$ N/m at 0° C., and $1.0 \times 10^5$ to $1.0 \times 10^6$ N/m at 50° C.

Accordingly, the piezoelectric film 12 is able to have appropriate rigidity and mechanical strength within a range not impairing the flexibility and the acoustic properties.

Furthermore, in the piezoelectric film 12, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of a speaker using the piezoelectric film 12 are smoothened, and thus it is also possible to decrease the changed amount of acoustic quality in a case where the lowest resonance frequency $f_0$ is changed in accordance with a change in the curvature of the speaker.

Next, an example of a manufacturing method of the piezoelectric film 12 will be described with reference to FIGS. 3 to 7.

Figure 3:
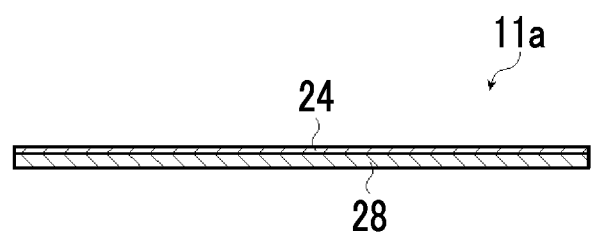
FIG. 3 is a conceptual diagram for describing an example of a production method of the piezoelectric film.

First, as shown in FIG. 3, a sheet-like member 11a is provided in which the first electrode layer 24 is formed on the first protective layer 28. The sheet-like member 11a may be produced by forming a copper thin film or the like as the first electrode layer 24 on the surface of the first protective layer 28 using vacuum vapor deposition, sputtering, plating, or the like.

In a case where the first protective layer 28 is extremely thin, and thus the handleability is degraded, the first protective layer 28 with a separator (temporary support) may be used as necessary. As the separator, a PET film having a thickness of 25 to 100 μm, and the like are able to be used. The separator may be removed after thermal compression bonding of the second electrode layer 26 and the second protective layer 30 and before laminating any member on the first protective layer 28.

On the other hand, a coating material is provided by dissolving a polymer material having viscoelasticity at room temperature, such as cyanoethylated PVA, in an organic solvent, further adding the piezoelectric particles 36 such as PZT particles thereto, and stirring and dispersing the resultant. In the following description, the polymer material having viscoelasticity at room temperature, such as cyanoethylated PVA, is also referred to as a "viscoelastic material".

The organic solvent is not limited, and various organic solvents such as dimethylformamide (DMF), methyl ethyl ketone, and cyclohexanone are able to be used.

In a case where the sheet-like member 11a is provided and the coating material is provided, the coating material is cast (applied) onto the sheet-like member 11a, and the organic solvent is evaporated and dried. Accordingly, as shown in FIG. 4, a laminate 11b in which the first electrode layer 24 is provided on the first protective layer 28 and the piezoelectric layer 20 is formed on the first electrode layer 24 is produced.

A casting method of the coating material is not particularly limited, and all known coating methods (coating devices) such as a slide coater or a doctor knife are able to be used.

Figure 4:
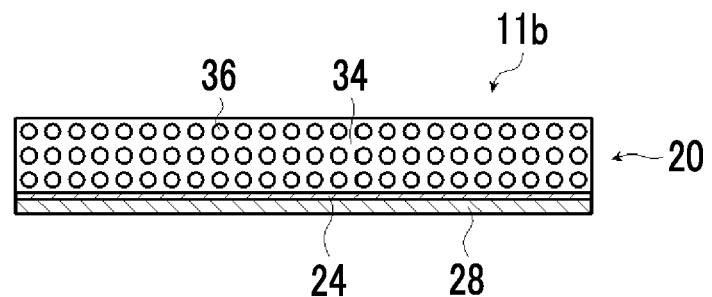
FIG. 4 is a conceptual diagram for describing an example of the production method of the piezoelectric film.

Alternatively, in a case where the viscoelastic material is a material that is able to be heated and melted like cyanoethylated PVA, a melted material may be produced by heating and melting the viscoelastic material and adding and dispersing the piezoelectric particles 36 therein, extruded into a sheet shape on the sheet-like member 11a shown in FIG. 3 by extrusion molding or the like, and cooled, thereby producing the laminate 11b in which the first electrode layer 24 is provided on the first protective layer 28 and the piezoelectric layer 20 is formed on the first electrode layer 24 as shown in FIG. 4.

As described above, in the piezoelectric film 12, in addition to the viscoelastic material such as cyanoethylated PVA, a polymer piezoelectric material such as PVDF may be added to the viscoelastic matrix 34.

In a case where the polymer piezoelectric material is added to the viscoelastic matrix 34, the polymer piezoelectric material added to the coating material may be dissolved. Alternatively, the polymer piezoelectric material to be added may be added to the heated and melted viscoelastic material and may be heated and melted.

After the laminate 11b in which the first electrode layer 24 is provided on the first protective layer 28 and the piezoelectric layer 20 is formed on the first electrode layer 24 is produced, the piezoelectric layer 20 is subjected to polarization processing (poling).

A polarization processing method of the piezoelectric layer 20 is not limited, and a known method is able to be used. As a preferable polarization processing method, a method shown in FIGS. 5 and 6 is exemplified.

Figure 5:
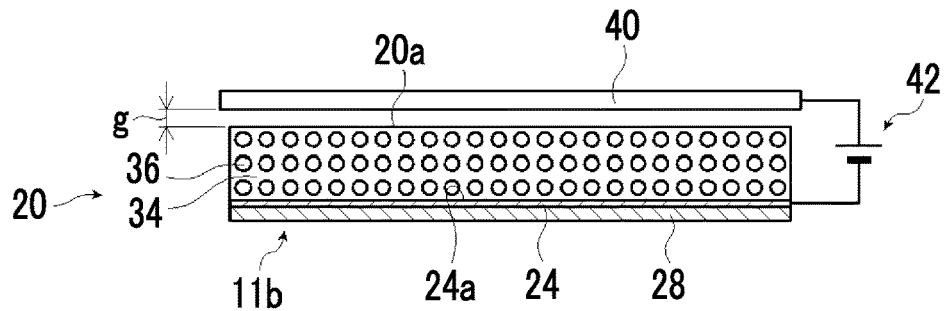
FIG. 5 is a conceptual diagram for describing an example of the production method of the piezoelectric film.
Figure 6:
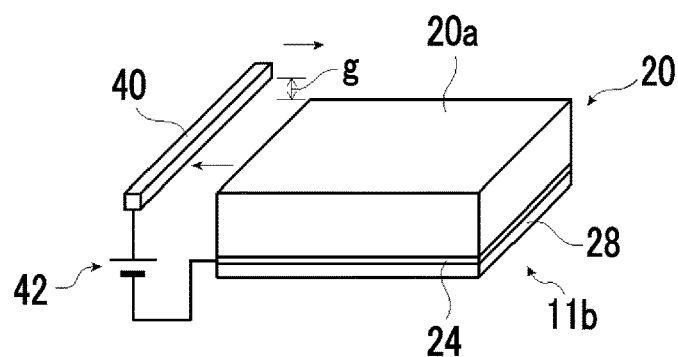
FIG. 6 is a conceptual diagram for describing an example of the production method of the piezoelectric film.

In this method, as shown in FIGS. 5 and 6, for example, an interval g of 1 mm is opened on an upper surface 20a of the piezoelectric layer 20 of the laminate 11b, and a rod-like or wire-like corona electrode 40 which is able to be moved along the upper surface 20a is provided. Then, the corona electrode 40 and the first electrode layer 24 are connected to a direct-current power source 42.

Furthermore, a heating unit for heating and holding the laminate 11b, for example, a hot plate, is provided.

Then, in a state where the piezoelectric layer 20 is heated and held by the heating unit, for example, at a temperature of 100° C., a direct-current voltage of a few kV, for example, 6 kV, is applied between the first electrode layer 24 and the corona electrode 40 from the direct-current power source 42, and thus a corona discharge occurs. Furthermore, in a state where the interval g is maintained, the corona electrode 40 is moved (scanned) along the upper surface 20a of the piezoelectric layer 20, and the piezoelectric layer 20 is subjected to the polarization processing.

Accordingly, the piezoelectric layer 20 is polarized in the thickness direction. By this polarization processing, the side of the first electrode layer 24 is the upstream side in the polarization direction.

In the polarization processing using such corona discharge, a known rod-like moving unit may be used to move the corona electrode 40. In the following description, for convenience, the polarization processing using corona discharge is also referred to as corona poling processing.

In addition, in the corona poling processing, a method of moving the corona electrode 40 is not limited. That is, the corona electrode 40 is fixed, a moving mechanism for moving the laminate 11b is provided, and the polarization processing may be performed by moving the laminate 11b. A known moving unit for moving a sheet-like member may be used to move the laminate 11b.

In addition, the polarization processing is not limited to the corona poling processing, and normal electric field poling processing in which a direct-current electric field is directly applied to an object to be subjected to the polarization processing may also be used. However, in a case where this normal electric field poling processing is performed, it is necessary that the second electrode layer 26 is formed before the polarization processing.

In such a manner, while the piezoelectric layer 20 of the laminate 11b is subjected to the polarization processing, a sheet-like member 11c is provided in which the second electrode layer 26 is formed on the second protective layer 30. The sheet-like member 11c may be produced by forming a copper thin film or the like as the second electrode layer 26 on the surface of the second protective layer 30 using vacuum vapor deposition, sputtering, plating, or the like.

Figure 7:
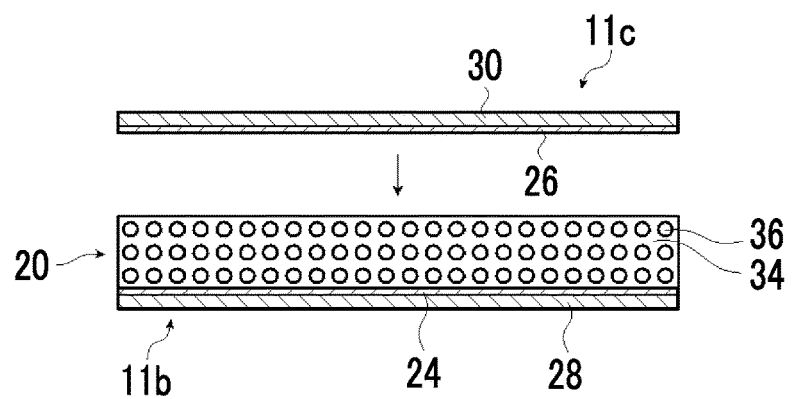
FIG. 7 is a conceptual diagram for describing an example of the production method of the piezoelectric film.

Next, as shown in FIG. 7, the sheet-like member 11c is laminated on the laminate 11b in which the piezoelectric layer 20 is subjected to the polarization processing while the second electrode layer 26 faces the piezoelectric layer 20.

Furthermore, a laminate of the laminate 11b and the sheet-like member 11c is interposed between the second protective layer 30 and the first protective layer 28, and is subjected to the thermal compression bonding using a heating press device, a heating roller pair, or the like. Then, the laminate is cut into a desired shape to produce a piezoelectric film 12 having a protruding portion 15.

It should be noted that the processes up to this point can be performed not only in the form of a sheet but also in the form of a web, that is, a sheet rolled in a state where the sheets are connected longitudinally. Both the laminate 11b and the sheet-like member 11c are in the form of a web, and can be thermocompression-cemented as described above. In such a case, the piezoelectric film 12 is made into a web shape at this point.

Further, a special glue layer may be provided in a case where the laminate 11b and the sheet-like member 11c are cemented together. For example, a glue layer may be provided on the surface of the second electrode layer 26 of the sheet-like member 11c. The most suitable glue layer is the same material as the viscoelastic matrix 34. It is also possible to apply the same material to the surface of the second electrode layer 26 and cement them together.

As described above, the laminated piezoelectric element 10 of the present invention has a configuration in which the piezoelectric film 12 is laminated and cemented by an adhesive layer 14. Here, in the example shown in FIG. 1, as indicated by the arrows cemented to the piezoelectric layer 20, the polarization directions of the adjacent piezoelectric films 12 are opposite to each other. In the example shown in FIG. 1, the laminated piezoelectric element 10 has a configuration in which three layers of piezoelectric films 12 are laminated so that the polarization directions of adjacent piezoelectric films 12 are opposite to each other, and the adjacent piezoelectric films 12 are cemented by the adhesive layer 14.

Specifically, in the example shown in FIG. 1, the first layer piezoelectric film 12a in FIG. 1 has a downward polarization direction as indicated by an arrow in the drawing. Accordingly, the first electrode layer 24 and the first protective layer 28 are disposed on the upper side in FIG. 1, and the second electrode 26 and the second protective layer 30 are disposed on the lower side in FIG. 1. Further, the second layer piezoelectric film 12b disposed adjacent to the surface of the first layer piezoelectric film 12a on the second protective layer 30 side has an upward polarization direction as indicated by an arrow in the drawing. Accordingly, the first electrode layer 24 and the first protective layer 28 are disposed on the lower side in FIG. 1, and the second electrode 26 and the second protective layer 30 are disposed on the upper side in FIG. 1. Further, the third layer piezoelectric film 12c disposed adjacent to the surface of the second layer piezoelectric film 12b on the first protective layer 28 side has a downward polarization direction as indicated by an arrow in the drawing. Accordingly, the first electrode layer 24 and the first protective layer 28 are disposed on the upper side in FIG. 1, and the second electrode 26 and the second protective layer 30 are disposed on the lower side in FIG. 1.

Here, in the laminated piezoelectric element 10 of the present invention, each piezoelectric film has a cemented portion that is cemented to the adjacent piezoelectric film and a protruding portion that protrudes outward from the cemented portion in the plane direction and is not cemented to the adjacent piezoelectric film.

In the example shown in FIG. 1, in each of the first layer piezoelectric film 12a and the second layer piezoelectric film 12b, a region other than the left side end part in FIG. 1 is cemented by the adhesive layer 14, and the region of the left side end part in FIG. 1 is not cemented. In the following description, the region of each piezoelectric film that is cemented to the adjacent piezoelectric film is referred to as a cemented portion 13, and the region that is not cemented is referred to as the protruding portion 15. It can be said that the protruding portion 15 is a region protruding outward from the cemented portion 13 in the plane direction of the principal surface of the piezoelectric film.

In a similar manner, in each of the second layer piezoelectric film 12b and the third layer piezoelectric film 12c, the region other than the left side end part in FIG. 1 is cemented by the adhesive layer 14, and the region of the left side end part in FIG. 1 is not cemented.

An electric contact is provided on the protruding portion 15 of each piezoelectric film. In the example shown in FIG. 1, in the protruding portion 15 of each piezoelectric film, a hole portion 28a penetrating the first protective layer 28 is formed, and a hole portion 30a penetrating the second protective layer 30 is formed. The first electrode portion 24 is exposed by forming the hole portion 28a in the first protective layer 28. Further, the protruding portion 15 is not cemented to the adjacent piezoelectric film. Accordingly, wiring or the like can be connected to the first electrode layer 24 in the hole portion 28a. In the following description, the hole portion 28a (the first electrode layer 24 in the hole portion 28a) is also referred to as a first contact. In a similar manner, the second electrode portion 26 is exposed by forming the hole portion 30a in the second protective layer 30. Further, the protruding portion 15 is not cemented to the adjacent piezoelectric film. Accordingly, wiring or the like can be connected to the second electrode layer 26 in the hole portion 30a. In the following description, the hole portion 30a (second electrode layer 26 in the hole portion 30a) is also referred to as a second contact.

In the example shown in FIG. 1, since the first layer piezoelectric film 12a is disposed such that the first electrode layer 24 side is on the upper side in FIG. 1. Therefore, a first contact 28a is provided on the upper surface of the protruding portion 15, and a second contact 30a is provided on the lower surface thereof. Since the second layer piezoelectric film 12b is disposed such that the first electrode layer 24 side is on the lower side in FIG. 1, the second contact 30a is provided on the upper surface of the protruding portion 15 and the first contact 28a is provided on the lower surface. Since the third layer piezoelectric film 12c is disposed such that the first electrode layer 24 side is on the upper side in FIG. 1, the first contact 28a is provided on the upper surface of the protruding portion 15 and the second contact 30a is provided on the lower surface. The vertical direction in the above description corresponds to the vertical direction in FIG. 1, and the upper piezoelectric film in the drawing is the first layer piezoelectric film, and the first layer piezoelectric film side is the upper side. This point is the same in the following description.

As shown in FIG. 1, in the laminated piezoelectric element 10 of the present invention, the first contacts 28a, which are provided on the protruding portions 15 of the piezoelectric films, are connected to each other, and the second contacts 30a are connected to each other. In the example shown in FIG. 1, the first contact 28a is connected to a positive polarity and the second contact 30a is connected to a negative polarity, but the first contact 28a is connected to the same polarity of the power source, and the first contact 28a is connected to the same polarity. Further, the second contacts 30a are connected to each other with the other same polarity of the power source. For example, in a case where the contacts are connected to an alternating-current power source, all first contacts 28a are connected to one polarity of the alternating-current power source and all second contacts 30a are connected to the other polarity of the alternating-current power source.

A power source for applying a driving voltage for stretching and contracting the piezoelectric film 12 is connected to the first electrode layer 24 and the second electrode layer 26 of each piezoelectric film 12 through the first contact 28a and the second contact 30a.

The power source is not limited and may be a direct-current power source or an alternating-current power source. In addition, as for the driving voltage, a driving voltage capable of appropriately driving each of the piezoelectric films may be appropriately set in accordance with the thickness, forming material, and the like of the piezoelectric film of the piezoelectric layer 20.

As described above, in a case where the piezoelectric film having the piezoelectric layer interposed between the electrode layer and the protective layer is laminated, the output of the laminated piezoelectric element may decrease or may not be deformed as a whole, depending on the direction of polarization of the piezoelectric layer of the piezoelectric film and the direction of the polarity of the electrode. Specifically, for example, in a case where two piezoelectric films are laminated such that the polarization directions thereof are opposite to each other, the electrode layers on the same side may be connected to each other. Then, in a case where a voltage is applied, one of the piezoelectric films contracts and the other piezoelectric film stretches, in a certain phase. That is, the stretch and contraction behaviors of the two piezoelectric films have opposite phases. Therefore, the stretch and contraction of the piezoelectric films cancel each other, and the deformation of the laminated piezoelectric element as a whole is reduced.

Further, in such a piezoelectric film, in a case where the electrode layer is excessively thick, the piezoelectric layer is prevented from being deformed and the output is reduced. Therefore, the electrode layer is formed extremely thin. In order to form a configuration in which the piezoelectric layer is interposed between thin electrode layers, as described above, in a case where the piezoelectric film is produced, the electrode layer is provided in a state of being formed on a protective layer serving as a support. Therefore, the outermost layers on both principal surfaces of the piezoelectric film serve as protective layers, and there is a problem that it is difficult to ensure an electric contact on the electrode layer.

For example, it is conceivable to pull out only the electrode layer from each piezoelectric film, but as described above, since the electrode layer is extremely thin in the piezoelectric film, it is difficult to pull out only the electrode layer from the piezoelectric film.

On the other hand, in the laminated piezoelectric element of the present invention, in each piezoelectric film, the first electrode 24 is disposed on the upstream side in the polarization direction of the piezoelectric layer 20, and the second electrode 26 is disposed on the downstream side. Each piezoelectric film has the protruding portion 15 that is not cemented to an adjacent piezoelectric film. At the protruding portion 15 of each piezoelectric film, the first contact 28a, in which the first electrode layers 24 of the piezoelectric films are electrically connected to each other, and the second contact 30a, in which the second electrode layers 26 of the piezoelectric films are electrically connected to each other, are formed.

By providing the protruding portion 15 that is not cemented to the adjacent piezoelectric film and providing the first contact 28a and the second contact 30a on the protruding portion 15, the first electrode layers 24 can be easily connected to each other and the second electrode layers 26 can be easily connected to each other.

Further, by setting the relationship between the polarization direction of each piezoelectric film and the polarity of the electrode layer to be the same for all the piezoelectric films, it is possible to apply a voltage having the same phase to each piezoelectric film. That is, in a case where a voltage is applied to the laminated piezoelectric element, the stretch and contraction behaviors of all the piezoelectric films have the same phase. Therefore, the stretch and contraction of each piezoelectric film can be strengthened, and the deformation (output) of the laminated piezoelectric element as a whole can be increased. Consequently, it is possible to obtain high piezoelectric characteristics.

Further, in the present invention, each piezoelectric film has a protective layer. For example, the following points can be exemplified as advantages in a case of forming an electric contact by providing a hole portion in the protective layer of the protruding portion 15. In a case where the polarization directions are opposite in the adjacent layers, the contacts having the same electric polarity face each other. Therefore, the parts other than the necessary contacts are insulated by the protective layer. Thus, there is an advantage that the protective layers come into contact with each other in a case where only the contact parts are displaced, and the insulation processing is unnecessary. Further, in a case where the polarization directions are the same in the adjacent layers, the electrode layers having different electric polarities face each other. However, since there is a protective layer, the insulation processing is unnecessary.

In the present invention, various known adhesive layers 14 can be used as long as the adjacent piezoelectric films 12 can be cemented.

Accordingly, the adhesive layer 14 may be a layer consisting of an adhesive, which has fluidity during cementing and thereafter is a solid, a layer consisting of a pressure sensitive adhesive which is a gel-like (rubber-like) flexible solid during cementing and does not change in the gel-like state thereafter, or a layer consisting of a material having characteristics of both an adhesive and a pressure sensitive adhesive.

Here, for example, the laminated piezoelectric element 10 of the present invention vibrates a vibration plate 50 as described later and generates a sound by stretching and contracting the plurality of laminated piezoelectric films.

Accordingly, in the laminated piezoelectric element 10 of the present invention, it is preferable that the stretching and contracting of each piezoelectric film is directly transmitted. In a case where a substance having a viscosity that attenuates vibration is present between the piezoelectric films, the efficiency of transmitting the stretching and contracting energy of the piezoelectric film is lowered, and the driving efficiency of the laminated piezoelectric element 10 is also decreased.

In consideration of this point, the adhesive layer 14 is preferably an adhesive layer consisting of an adhesive with which a solid and hard adhesive layer 14 is obtained, rather than a pressure sensitive adhesive layer consisting of a pressure sensitive adhesive. As a more preferable adhesive layer 14, specifically, a cementing layer consisting of a thermoplastic type adhesive such as a polyester-based adhesive or a styrene-butadiene rubber (SBR)-based adhesive is suitably exemplified.

Adhesion, unlike pressure sensitive adhesion, is useful in a case where a high adhesion temperature is required. Furthermore, the thermoplastic type adhesive has "relatively low temperature, short time, and strong adhesion" and is suitable.

In the laminated piezoelectric element 10 of the present invention, the thickness of the adhesive layer 14 is not limited, and a thickness capable of exhibiting sufficient cementing force (adhesive force or pressure sensitive adhesive force) may be appropriately set depending on the forming material of the adhesive layer 14.

Here, in the laminated piezoelectric element 10 of the present invention, the thinner the adhesive layer 14, the higher the transmission effect of the stretching and contracting energy (vibration energy) of the piezoelectric layer 20, and the higher the energy efficiency. In addition, in a case where the adhesive layer 14 is thick and has high rigidity, there is a possibility that the stretching and contracting of the piezoelectric film may be constrained. Furthermore, as will be described later, in the laminated piezoelectric element 10 of the present invention, since there is no concern that the adjacent piezoelectric films 12 may be short-circuited, the adhesive layer 14 can be made thin.

In consideration of this point, the adhesive layer 14 is preferably thinner than the piezoelectric layer 20. That is, in the laminated piezoelectric element 10 of the present invention, the adhesive layer 14 is preferably hard and thin.

Specifically, the thickness of the adhesive layer 14 is preferably equal to or greater than 0.1 µm and equal to or less than 50 µm, more preferably equal to or greater than 0.1 µm and equal to or less than 30 µm, and even more preferably equal to or greater than 0.1 µm and equal to or less than 10 µm in terms of thickness after cementing.

In the laminated piezoelectric element 10 of the present invention, in a case where the spring constant of the adhesive layer 14 is high, there is a possibility that the stretching and contracting of the piezoelectric film 12 may be constrained. Accordingly, the spring constant of the adhesive layer 14 is preferably equal to or less than the spring constant of the piezoelectric film 12. The spring constant is "thickness×Young's modulus".

Specifically, the product of the thickness of the adhesive layer 14 and the storage elastic modulus (E') at a frequency of 1 Hz in accordance with the dynamic viscoelasticity measurement is preferably $2.0 \times 10^6$ N/m or less at 0° C. and $1.0 \times 10^6$ N/m or less at 50° C.

It is preferable that the internal loss of the cementing layer at a frequency of 1 Hz in accordance with the dynamic viscoelasticity measurement is 1.0 or less at 25° C. in the case of the adhesive layer 14 consisting of a pressure sensitive adhesive, and is 0.1 or less at 25° C. in the case of the adhesive layer 14 consisting of an adhesive.

Figure 8:
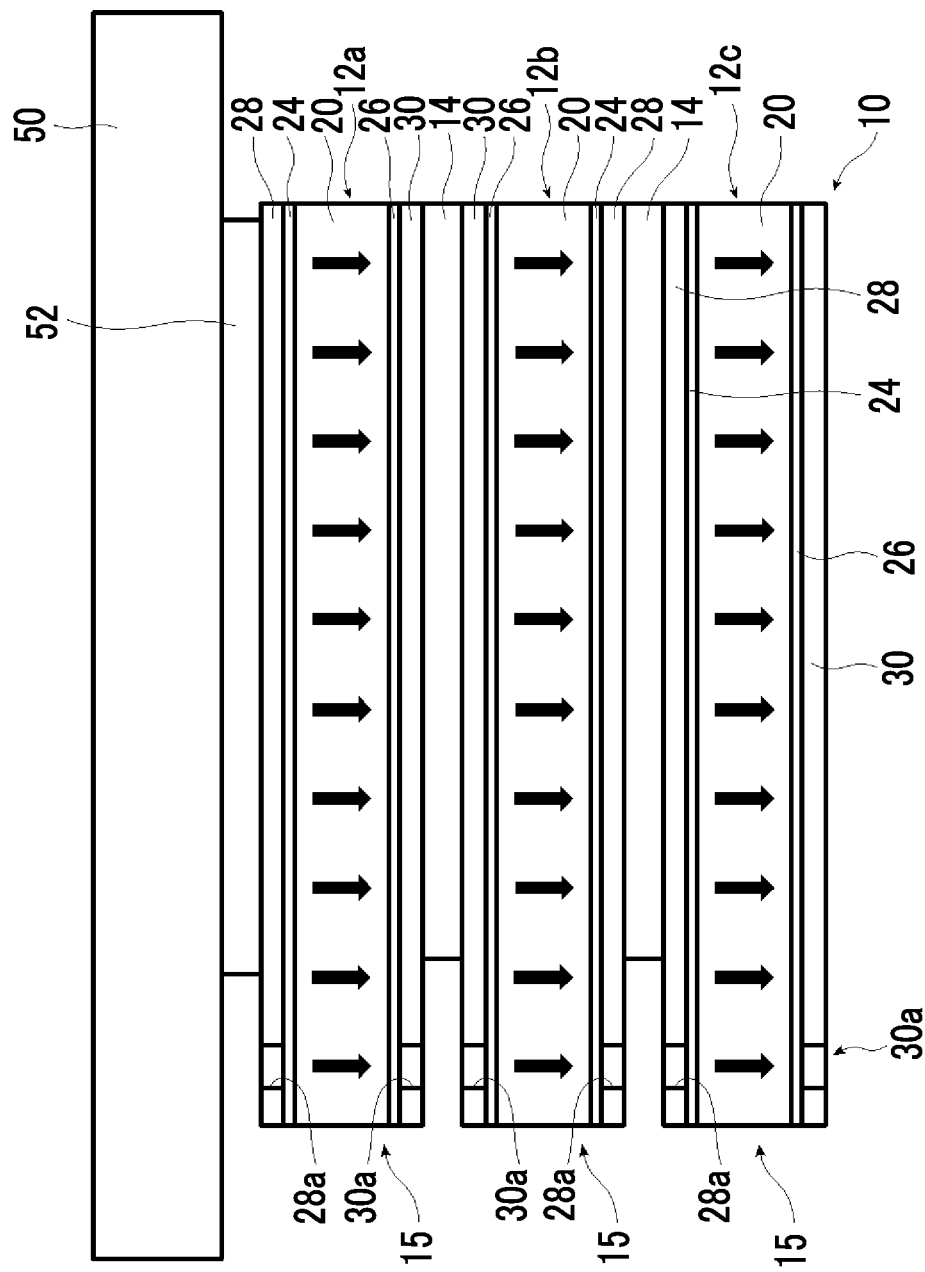
FIG. 8 is a diagram conceptually showing an example of an electroacoustic transducer using the laminated piezoelectric element of the present invention.

For example, as conceptually shown in FIG. 8, the laminated piezoelectric element 10 of the present invention is cemented to the vibration plate 50 by an adhesive layer 52, and is used as an exciter for generating a sound from the vibration plate 50. In other words, the vibration plate 50 and the laminated piezoelectric element 10 are in contact with each other and fixed to each other through the adhesive layer 52, and the laminated piezoelectric element 10 functions as an exciter for generating sound from the vibration plate 50. Consequently, FIG. 8 shows an example of the electroacoustic transducer of the present invention having the laminated piezoelectric element 10 of the present invention.

As described above, in the laminated piezoelectric element 10 of the present invention, the piezoelectric layer 20 included in the piezoelectric films which are laminated in a plurality of layers is formed by dispersing the piezoelectric particles 36 in the viscoelastic matrix 34. Further, the first electrode layer 24 and the second electrode layer 26 are provided with the piezoelectric layer 20 interposed therebetween in the thickness direction.

In a case where a voltage is applied to the first electrode layer 24 and the second electrode layer 26 of the piezoelectric film having the piezoelectric layer 20, the piezoelectric particles 36 stretch and contract in the polarization direction according to the applied voltage. As a result, the piezoelectric film (piezoelectric layer 20) contracts in the thickness direction. At the same time, the piezoelectric film stretches and contracts in the plane direction due to the Poisson's ratio.

The degree of stretching and contracting is equal to or greater than about 0.01% and equal to or less than about 0.1%.

As described above, the thickness of the piezoelectric layer 20 is preferably equal to or greater than about 10 μm and equal to or less than about 300 μm. Accordingly, the degree of stretching and contracting in the thickness direction is as extremely small as about 0.3 μm at the maximum.

Contrary to this, the piezoelectric film, that is, the piezoelectric layer 20, has a size much larger than the thickness in the plane direction. Accordingly, for example, in a case where the length of the piezoelectric film is 20 cm, the piezoelectric film stretches and contracts by a maximum of about 0.2 mm as a voltage is applied.

As described above, the vibration plate 50 is cemented to the laminated piezoelectric element 10 by the adhesive layer 52. Accordingly, the stretching and contracting of the piezoelectric film causes the vibration plate 50 to bend, and as a result, the vibration plate 50 vibrates in the thickness direction.

The vibration plate 50 emits a sound due to the vibration in the thickness direction. That is, the vibration plate 50 vibrates in accordance with the magnitude of the voltage (driving voltage) applied to the piezoelectric film, and generates a sound in accordance with the driving voltage applied to the piezoelectric film.

Here, it is known that in a case where a general piezoelectric film consisting of a polymer material such as PVDF is stretched in a uniaxial direction after being subjected to polarization processing, the molecular chains are oriented with respect to the stretching direction, and as a result, high piezoelectric characteristics are obtained in the stretching direction. Therefore, a general piezoelectric film has in-plane anisotropy in the piezoelectric characteristics, and has anisotropy in the amount of stretching and contracting in the plane direction in a case where a voltage is applied.

On the other hand, a piezoelectric film having a polymer-based piezoelectric composite material in which piezoelectric particles are dispersed in a viscoelastic matrix is able to obtain large piezoelectric characteristics without stretching processing after polarization processing. Therefore, the piezoelectric film has no in-plane anisotropy in the piezoelectric characteristics, and stretches and contracts isotropically in all directions in the plane direction. That is, the piezoelectric film stretches and contracts isotropically and two-dimensionally. In the laminated piezoelectric element 10 in which such piezoelectric films that stretch and contract isotropically and two-dimensionally are laminated, compared to a case where general piezoelectric films made of PVDF or the like that stretch and contract greatly in only one direction are laminated, the vibration plate 50 can be vibrated with a large force, and a louder and more beautiful sound can be generated.

As described above, the laminated piezoelectric element of the present invention is a laminate of a plurality of such piezoelectric films.

Therefore, even though the rigidity of each piezoelectric film is low and the stretching and contracting force thereof is small, the rigidity is increased by laminating the piezoelectric films, and the stretching and contracting force as the laminated piezoelectric element 10 is increased. As a result, in the laminated piezoelectric element 10 of the present invention, even in a case where the vibration plate 50 has a certain degree of rigidity, the vibration plate 50 is sufficiently bent with a large force and the vibration plate 50 can be sufficiently vibrated in the thickness direction, whereby the vibration plate 50 can generate a sound.

In addition, the thicker the piezoelectric layer 20, the larger the stretching and contracting force of the piezoelectric film, but the larger the driving voltage required for stretching and contracting by the same amount. Here, as described above, in the laminated piezoelectric element 10 of the present invention, a preferable thickness of the piezoelectric layer 20 is about 300 μm at the maximum. Therefore, even in a case where the voltage applied to each piezoelectric film is small, it is possible to sufficiently stretch and contract the piezoelectric films.

In the electroacoustic transducer of the present invention using the laminated piezoelectric element of the present invention, the adhesive layer 52 that cements the laminated piezoelectric element 10 to the vibration plate 50 is not limited, and various known cementing agent and adhesives can be used.

For example, the same as the above-mentioned adhesive layer 14 is exemplified. The preferred adhesive layer 52 (cementing agent) is the same as that of the adhesive layer 14.

In the electroacoustic transducer of the present invention using the laminated piezoelectric element of the present invention, the vibration plate 50 is not limited, and various articles can be used.

As the vibration plate 50, for example, plate materials such as resin plates and glass plates, advertisement or notification media such as signboards, office devices and furniture such as tables, whiteboards, and projection screens, display devices such as organic electroluminescence (organic light emitting diode (OLED)) displays and liquid crystal displays, members for vehicles including automobiles such as consoles, A-pillars, roofs, and bumpers, and building materials such as walls of houses are exemplified.

In the electroacoustic transducer of the present invention, the vibration plate 50 to which the laminated piezoelectric element 10 of the present invention is cemented preferably has flexibility, and more preferably rollable.

As the flexible vibration plate 50, a flexible panel-shaped display device such as a flexible display panel is particularly suitably exemplified. Further, it is more preferable that the display device is also rollable.

Here, the electro acoustic transducer of the present invention responds to the curvature of roll of the vibration plate 50 such that the laminated piezoelectric element 10 does not peel off from the vibration plate 50 in a case where the vibration plate 50 is rolled. Therefore, it is preferable that the laminated piezoelectric element 10 also bends together with the vibration plate 50. The piezoelectric film 12 has suitable flexibility. Therefore, the laminated piezoelectric element 10 of the present invention also basically exhibits favorable flexibility.

In such a case, the curvature of roll of the vibration plate 50 is basically a specific curvature, but the curvature of roll of the vibration plate 50 may be variable.

In the electroacoustic transducer of the present invention, in a case where the display device is a vibration plate 50, it is preferable that the laminated piezoelectric element 10 is cemented to the rear side of the display device, that is, the non-image display surface side of the display device.

In such a case, the size of the adhesive layer 52 in the plane direction is preferably the same size as or smaller than the size of the planar shape of the laminated piezoelectric element 10.

In the electroacoustic transducer of the present invention, in a case where the display device is used as the vibration plate 50, the display device itself such as a flexible display panel may be the vibration plate 50, or a plate-shaped display device provided on the display device or a plate-shaped member that engages with the member or the display device may be the vibration plate 50.

Further, in a case where the electroacoustic transducer of the present invention is used as a display device, the electroacoustic transducer of the present invention may be incorporated in the display device. Alternatively, the vibration plate 50 of the electroacoustic transducer of the present invention may vibrate the plate-shaped member provided in the display device. Alternatively, the electroacoustic transducer of the present invention may be incorporated in a casing or the like together with the display device.

In the electroacoustic transducer of the present invention, in a case where the vibration plate 50 can be rolled, a drive current is applied to the laminated piezoelectric element 10 in a state where the vibration plate 50 is not rolled, and the vibration plate 50 is rolled. At that time, it is preferable that the current is not applied to the laminated piezoelectric element 10. Further, in the electroacoustic transducer of the present invention, in a case where the vibration plate 50 is electrically driven like a display device, the drive current is applied to the laminated piezoelectric element 10 and/or the vibration plate 50 without rolling the vibration plate 50, and the vibration plate 50 is rolled. At that time, it is preferable not to apply the current to the laminated piezoelectric element 10 and/or the vibration plate 50.

As a method for switching between current application and non-current application, various known methods can be used.

As described above, the electroacoustic transducer of the present invention is formed by cementing (fixing) the laminated piezoelectric element 10 to the vibration plate 50 by using the adhesive layer 52.

In such an electroacoustic transducer of the present invention, the end part (end side) of the vibration plate 50 may be fixed to a wall or the like, and/or the end part may be fixed by a fixing unit such as a beam.

Further, in the electroacoustic transducer of the present invention, the shape of the vibration plate 50 is not limited, but in most cases, the shape may be a quadrangle. For example, as described above, in the electroacoustic transducer of the present invention, a display device such as an organic electroluminescence display can be suitably used as the vibration plate 50. In a case where the display device is a vibration plate, the vibration plate 50 is usually rectangular.

Figure 45:
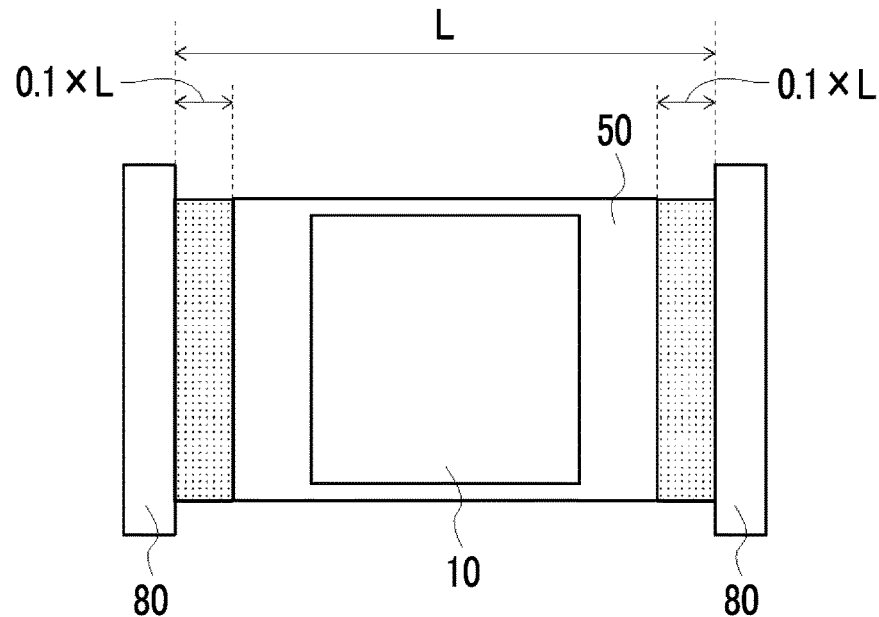
FIG. 45 is a diagram conceptually showing another example of the electroacoustic transducer of the present invention.

In a case where the vibration plate 50 is a rectangle such as a rectangle or a square, in order to stably fix the vibration plate 50, in most cases, the two facing sides are fixed by the fixing unit 80 as conceptually shown in FIG. 45, and the vibration plate 50 is supported.

Here, as conceptually shown in FIG. 45, the distance between the two fixing units 80 for fixing the two facing sides of the quadrangular vibration plate 50, that is, the distance between the fixed ends of the vibration plate 50 is L.

In the electroacoustic transducer of the present invention, in a case where the two facing sides of the quadrangular vibration plate 50 are fixed, it is preferable that the laminated piezoelectric element 10 is cemented to the vibration plate 50 in a state where the two facing sides are separated by 0.1×L or greater from the inner end parts of the vibration plate of the fixing unit 80, that is, from the fixed ends of the vibration plate 50.

That is, in a case where fixing the two facing sides of the quadrangular vibration plate 50, it is preferable to have a slight gap between the fixed end of the vibration plate 50 and the laminated piezoelectric element 10.

By adopting such a configuration, fixing of the vibration plate 50 suppresses the stretch and contraction of the laminated piezoelectric element 10 described above, and more suitably vibrates the vibration plate 50. As a result, it is possible to output a sound having a higher sound pressure.

In such a case, as shown in FIG. 8, in a case where the end part of the laminated piezoelectric element 10 protrudes outward of the adhesive layer 52 in the plane direction, the end part of the adhesive layer 52 is regarded as the end part of the laminated piezoelectric element 10. That is, in such a case, the laminated piezoelectric element is cemented such that the end part of the adhesive layer 52 is separated from the fixed end of the vibration plate 50 by 0.1×L or greater.

On the contrary, in a case where the end part of the laminated piezoelectric element 10 is located inside the adhesive layer 52 in the plane direction, the laminated piezoelectric element may be cemented such that the end part of the laminated piezoelectric element 10 is separated from the fixed end of the vibration plate 50 by 0.1×L or greater.

Figure 49:
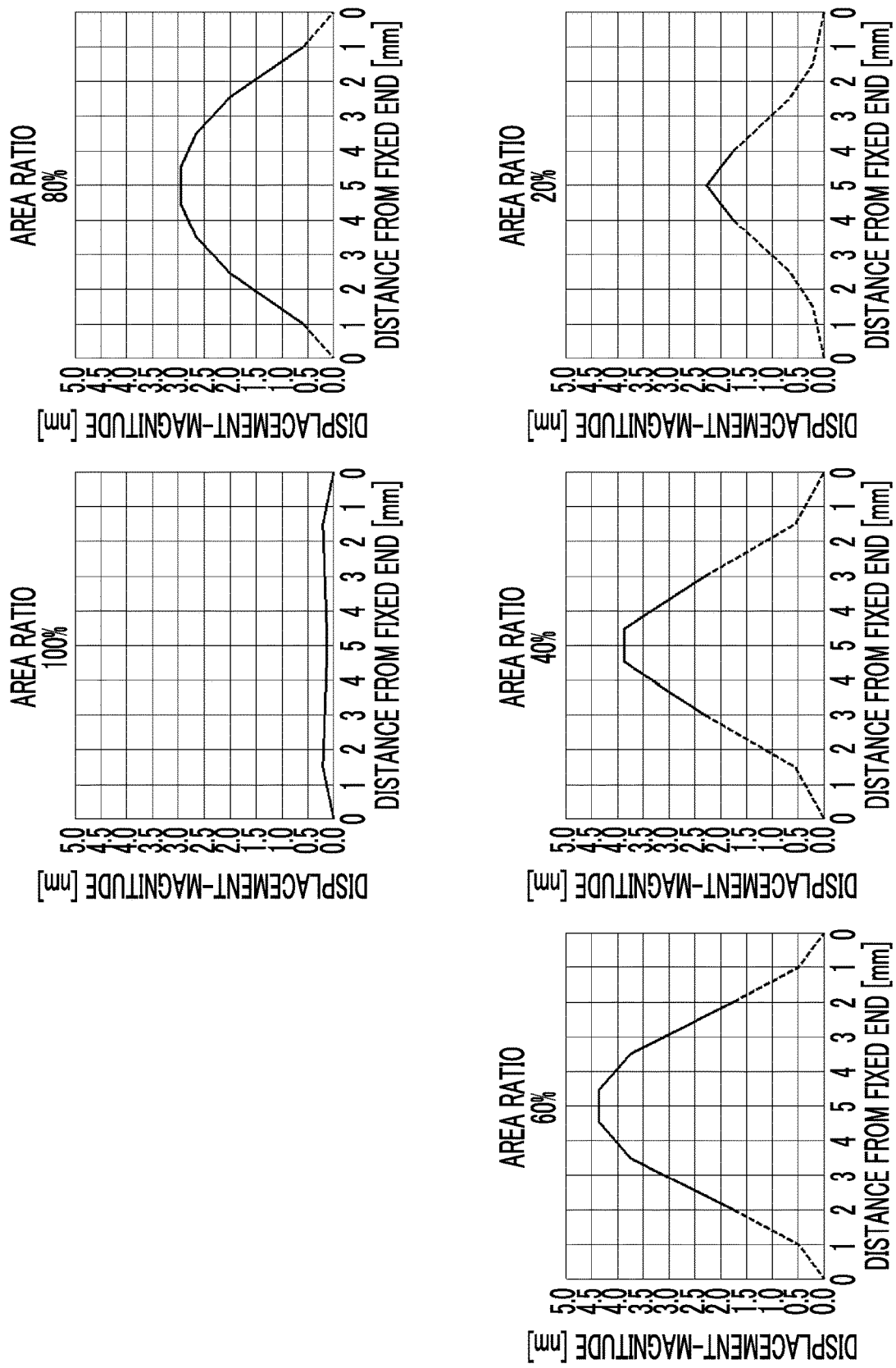
FIG. 49 is a simulation result of vibration of a vibration plate by the electroacoustic transducer shown in FIG. 45.

FIG. 49 shows the simulation results of the relationship between the distance from the fixed end of the vibration plate to the laminated piezoelectric element and the displacement of the vibration plate in a case where laminated piezoelectric elements of various sizes are cemented to the rectangular vibration plate.

The ends (end sides) of the two facing sides of the vibration plate were fixed using a stainless steel square plate having a size of 10×10 mm and a thickness of 0.3 mm.

In the laminated piezoelectric element, four layers of the square piezoelectric film 12 shown in FIG. 2 were laminated, and each layer was cemented by a cementing layer.

The laminated piezoelectric element was provided with a cementing layer on the entire surface, and the laminated piezoelectric element was cemented to the center of the vibration plate in a state where the directions of the respective sides were matched. Accordingly, in a case where the size of the laminated piezoelectric element is different, the distance from the fixed end of the vibration plate to the laminated piezoelectric element is different.

Figure 50:
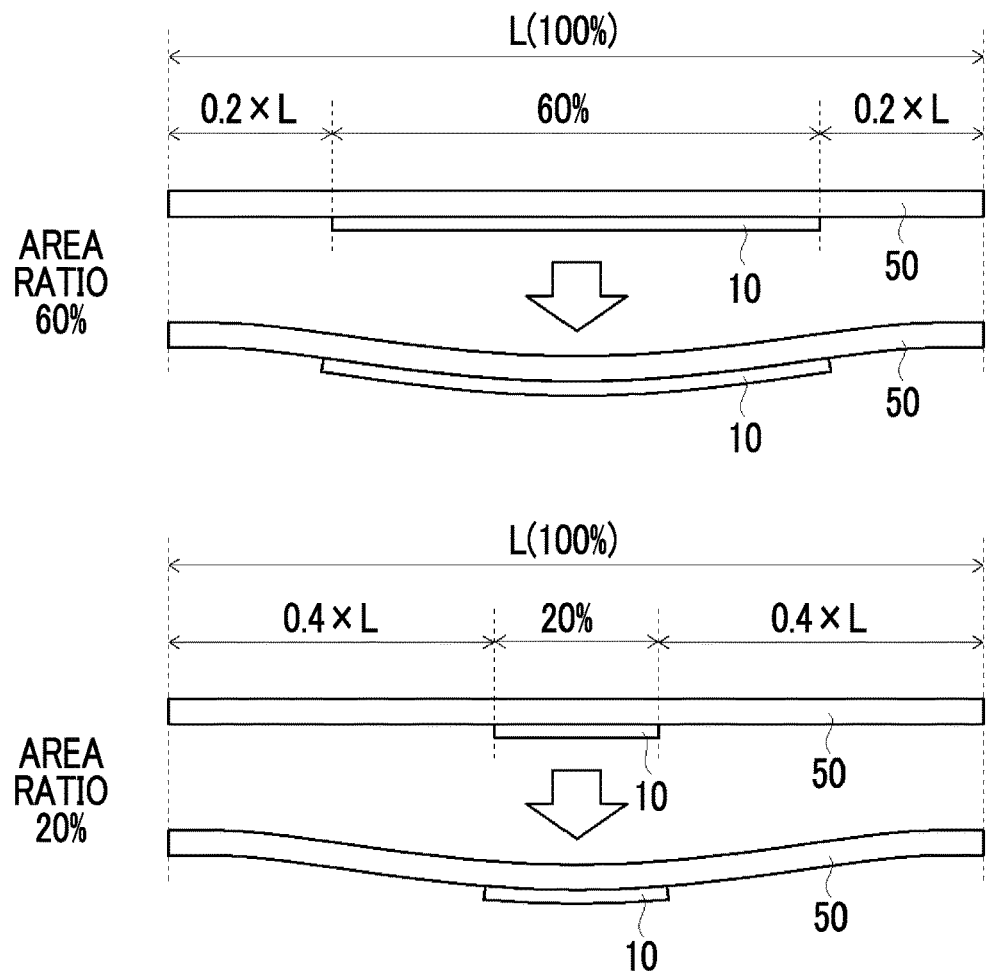
FIG. 50 is a conceptual diagram for explaining FIG. 49.

As conceptually shown in FIG. 50, an area ratio in FIG. 49 is a one-dimensional area ratio in a case where the distance L between the fixed ends of the vibration plate is 100%. That is, the area ratio of 100% is a case where the laminated piezoelectric element is cemented to the entire surface from the fixed end to the fixed end of the vibration plate. Further, the area ratio of 60% is a case where the laminated piezoelectric element is cemented to the vibration plate at a distance of 0.2×L from the fixed end of the vibration plate, as shown in the upper part of FIG. 50. Further, the area ratio of 20% is a case where the laminated piezoelectric element is cemented to the vibration plate at a distance of 0.4×L from the fixed end of the vibration plate, as shown in the lower part of FIG. 50.

In FIG. 49, the broken line is a region where the laminated piezoelectric element is not present in the vibration plate, and the solid line is a region where the laminated piezoelectric element is cemented to the vibration plate.

As shown in FIG. 49, in a case where the area ratio is 100%, that is, in a case where the laminated piezoelectric element is cemented from the fixed end to the fixed end of the vibration plate, the displacement, that is, the vibration of the vibration plate is small.

On the other hand, the vibration plate can be vibrated sufficiently large by cementing the laminated piezoelectric element to the vibration plate at an area ratio of 80%, that is, a distance of 0.1×L from the fixed end of the vibration plate. Consequently, a high sound pressure can be obtained.

Further, in this example, in a case where the area ratio is 60%, that is, in a case where the laminated piezoelectric element is cemented to the vibration plate at a distance of 0.2×L from the fixed end of the vibration plate, the vibration plate 50 is displaced by a larger amount. Consequently, a higher sound pressure can be obtained.

As described above, in the electroacoustic transducer of the present invention, in a case where fixing the two facing sides of the vibration plate, by cementing the laminated piezoelectric element to the vibration plate at a distance of 0.1×L or greater from the fixed end of the vibration plate, it is possible to more suitably vibrate the vibration plate and output a sound having a higher sound pressure.

In the electroacoustic transducer of the present invention, there is no limitation on the fixing unit 80 for fixing the side of the vibration plate 50, and various known fixing units for fixing the side (end side) of the plate-like member (sheet-like member, film) are available. Examples of the fixing unit include a beam that is able to support the sides of a plate-like member (including a cantilever), a fixing member that is used to support the sides of a projection screen, a fixing mechanism for a sheet-like member that is provided at a sheet drawer port of a container which draws out and contains the rolled sheet-like member such as a cartridge to be freely rolled, and the like.

Further, the fixing of the vibration plate 50 is not limited to the use of the fixing unit 80. For example, the vibration plate 50 may be fixed by directly cementing the end part (end surface) of the vibration plate 50 to a wall, a plate-like member serving as a support, or the like through a cementing agent or the like. In such a case, the end part of the vibration plate is the fixed end of the vibration plate 50.

The electroacoustic transducer of the present invention is not limited to having one laminated piezoelectric element 10.

Figure 46:
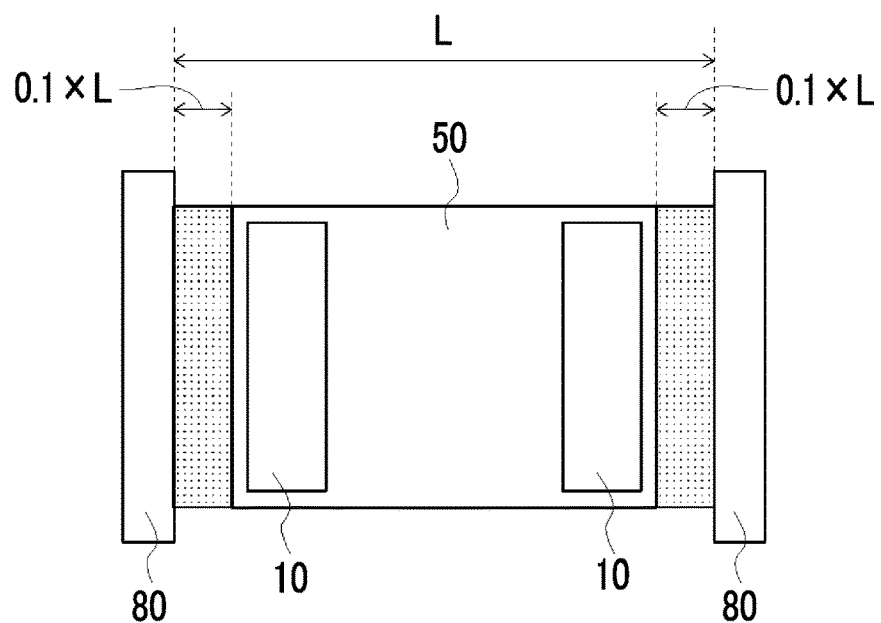
FIG. 46 is a diagram conceptually showing another example of the electroacoustic transducer of the present invention.

For example, in an electroacoustic transducer, in a case where audio is reproduced in stereo, that is, in two channels, as conceptually shown in FIG. 46, the distance between the fixed ends is separated in the L direction, and the two laminated piezoelectric elements 10 may be cemented to the vibration plate 50. Even in such a case, it is preferable that the laminated piezoelectric element 10 is cemented to the vibration plate 50 at a distance of 0.1×L or greater from the fixed end of the vibration plate 50, where L is the distance between the two fixing units 80, that is, the distance between the fixed ends of the vibration plate 50.

Further, in the electroacoustic transducer of the present invention, all four sides of the rectangular (square) vibration plate 50 may be fixed, for example, like a picture frame.

In this case as well, similarly, it is preferable that the fixed position of the laminated piezoelectric element 10 is determined to correspond to each of the fixing unit 80a for fixing one facing two sides and the fixing unit 80b for fixing the other two facing sides.

Figure 47:
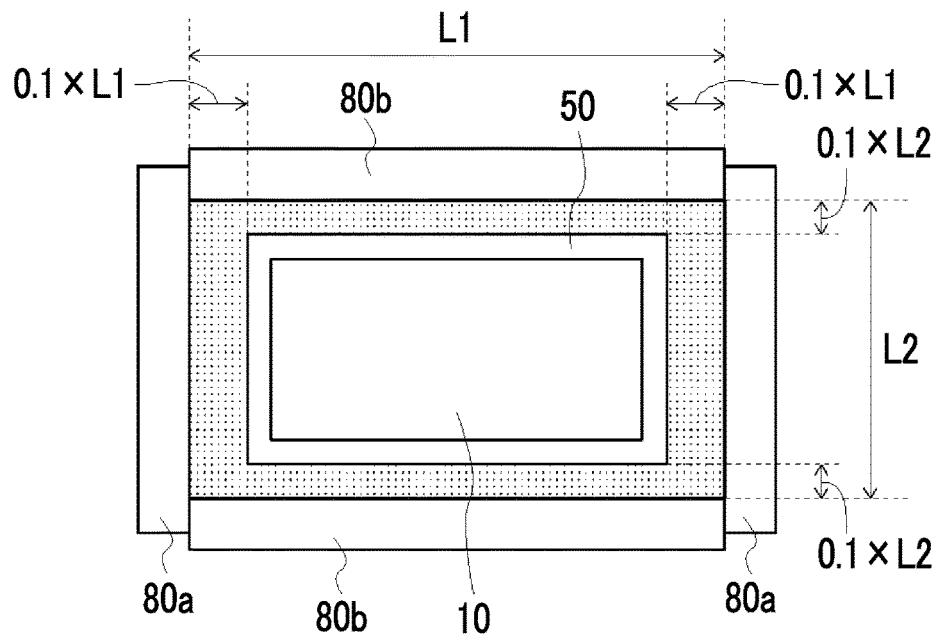
FIG. 47 is a diagram conceptually showing another example of the electroacoustic transducer of the present invention.

In such a case, as conceptually shown in FIG. 47, it is assumed that the distance between the two fixing units 80a for fixing one of the facing sides of the vibration plate 50, that is, the distance between the fixed ends of the vibration plate 50 on the facing sides is L1. Further, it is assumed that the distance between the two fixing units 80b for fixing the other facing sides of the vibration plate 50, that is, the distance between the fixed ends of the vibration plate 50 on the facing sides is L2.

Then, as shown in FIG. 47, in the vibration plate 50, it is preferable that the laminated piezoelectric element 50 is cemented at a distance of 0.1×L1 or greater from the end part of the fixing unit 80a, that is, the fixed end by the fixing unit 80a, and at a distance of 0.1×L2 or greater from the end part of the fixing unit 80b, that is, from the fixed end by the fixing unit 80b.

In the electroacoustic transducer of the present invention, even in a case where all four sides of the quadrangular vibration plate 50 are fixed, there is no limitation on having only one laminated piezoelectric element 10.

Figure 48:
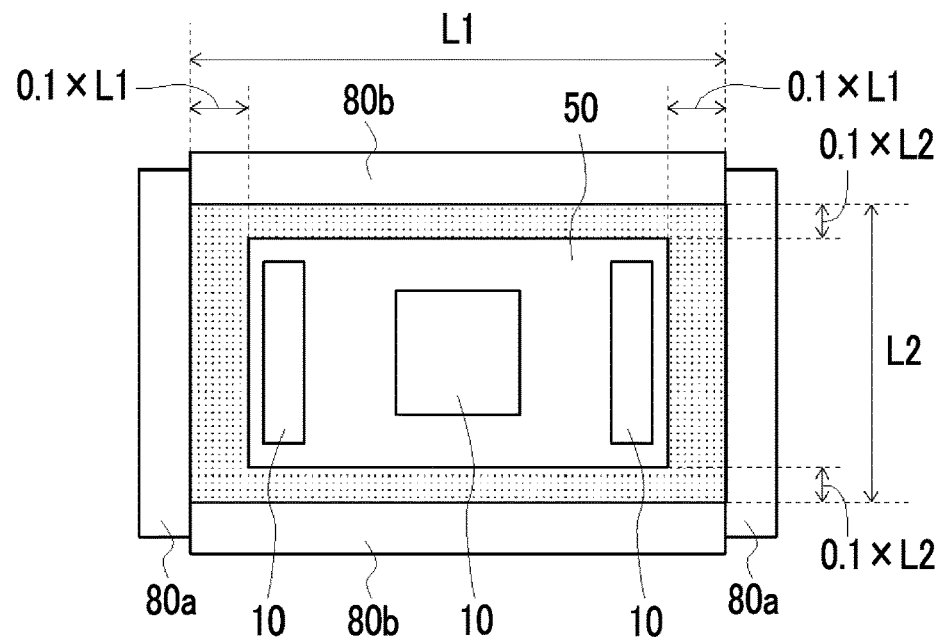
FIG. 48 is a diagram conceptually showing another example of the electroacoustic transducer of the present invention.

For example, in an electroacoustic transducer, audio may be reproduced in stereo and reproduced in 2.5 channels such as providing a center speaker. In such a case, as conceptually shown in FIG. 48, two laminated piezoelectric elements 10 for stereo reproduction may be provided near the ends in the direction of the distance L1 between the long fixed ends, and the laminated piezoelectric element 10 for the center speaker is provided in the center thereof.

Even in such a case, regarding the laminated piezoelectric element 10, it is preferable that three laminated piezoelectric elements 50 are cemented at positions separated by a distance of 0.1×L1 or greater from the fixed end by the fixing unit 80a and a distance of 0.1×L2 or greater from the fixed end by the fixing unit 80b, in accordance with the distance L1 between the fixed ends by the fixing unit 80a for fixing one opposite side and the distance L2 between the fixed ends by the fixing unit 80b for fixing the other opposite side.

As described above, in the electroacoustic transducer of the present invention, it is preferable that the laminated piezoelectric element 10 is cemented to the vibration plate at a distance of 0.1×L or greater from the end part of the fixing unit for fixing the facing sides of the quadrangular vibration plate 50, that is, from the fixed ends of the facing sides of the square vibration plate 50.

Here, it is preferable that the distance from the fixed end of the vibration plate 50 to the laminated piezoelectric element 10 is more preferably 0.15×L or greater and yet more preferably 0.2×L or greater in that a higher sound pressure, that is, a higher displacement amount of the vibration plate 50 can be obtained.

On the other hand, in a case where the position of the laminated piezoelectric element 10 is excessively far from the fixed end of the vibration plate 50, there are the following disadvantages: the laminated piezoelectric element 10 of a required size cannot be cemented to the vibration plate 50; the required number of laminated piezoelectric elements 10 cannot be cemented to the vibration plate 50; multi-channel reproduction such as stereo reproduction is difficult; and the distance between the laminated piezoelectric elements 10 is excessively close and cross talk may occur in a case where the number of channels is increased.

Considering this point, the distance from the fixed end of the vibration plate 50 to the laminated piezoelectric element 10 is preferably 0.4×L or less, and more preferably 0.3×L or less.

The effect of fixing the vibration plate 50 on the vibration of the vibration plate depends on the rigidity of the vibration plate 50, and the higher the rigidity of the vibration plate 50, the greater the effect. That is, the effect of separating the fixed position of the laminated piezoelectric element 10 from the fixed end of the vibration plate 50 can be obtained more in a case where the rigidity of the vibration plate 50 is high.

Considering this point, the two facing sides of the quadrangular vibration plate 50 are fixed, and the laminated piezoelectric element 10 may be cemented to the vibration plate 50 at a distance of 0.1×L or greater from the fixed end of the vibration plate 50. In such a case, it is preferable that the rigidity of the vibration plate 50 is high to some extent.

Specifically, in a case where the two facing sides of the vibration plate 50 are fixed and the fixed position of the laminated piezoelectric element 10 is separated by 0.1×L or greater from the fixed end of the vibration plate 50, the spring constant of the vibration plate 50 is preferably equal to or greater than about $1\times10^4$ N/m and equal to or less than about $1\times10^7$ N/m, and more preferably equal to or greater than about $1\times10^5$ N/m and equal to or less than about $1\times10^6$ N/m. The spring constant of a plate-like member such as a vibration plate can be calculated by multiplying the Young's modulus of the forming material by the thickness of the plate-like member.

In the present invention, the shape of the vibration plate is not limited to rectangles and squares, and it is possible to use various shaped quadrangles such as rhombuses, trapezoids, and parallelograms.

Figure 51:
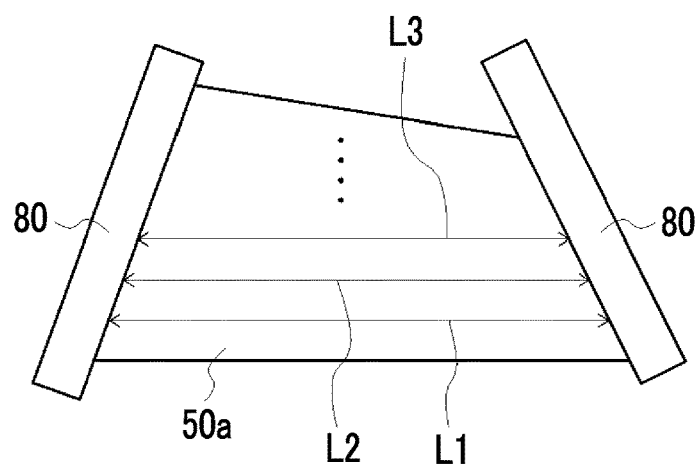
FIG. 51 is a conceptual diagram for explaining another example of the electroacoustic transducer of the present invention.

In such a case, as conceptually shown by exemplifying the vibration plate 50a in FIG. 51, the distance L between the fixed ends is set as in L1, L2, L3 . . . at various positions in the separation direction of the other facing sides between the two facing sides fixed by the fixing unit 80.

Further, the cementing position of the laminated piezoelectric element 10 on the vibration plate 50a may be determined such that the laminated piezoelectric element 10 is separated by 0.1×L1 or greater from the fixed end at a position where the distance between the fixed ends is L1, the laminated piezoelectric element 10 is separated by 0.1×L2 or greater from the fixed end at a position where the distance between the fixed ends is L2, the laminated piezoelectric element 10 is separated by 0.1×L3 or greater from the fixed end at the position where the distance between the fixed ends is L3 . . . .

In the electroacoustic transducer of the present invention, the quadrangle of the vibration plate 50, particularly, the rectangle and the square are not limited to a perfect quadrangle.

Consequently, in the present invention, the quadrangular vibration plate 50 may have a chamfered corner portion, a curved (R-shaped, round) corner portion, or an oval corner portion.

Further, in the electroacoustic transducer of the present invention, the fixing of the two facing sides in the square vibration plate is not limited to the entire region of the side, and partial regions of the sides may be fixed in accordance with the rigidity of the vibration plate, the size of the vibration plate, and the like.

In such a case, it is preferable to fix a region of 50% or greater of one side, it is more preferable to fix a region of 70% or greater of one side, it is yet more preferable to fix a region of 90% or greater of one side, and it is especially preferable to fix the entire region of one side.

Further, as described above, in a case where the corner portions of the quadrangle are chamfered or curved, the region not chamfered may be the entire region of one side, or may be the entire region of one side including the chamfered region.

In the electroacoustic transducer of the present invention, the shape of the vibration plate is not limited to a quadrangle, and it is possible to use vibration plates having various shapes such as a circle, an ellipse, and a polygon other than the quadrangle.

Here, in a case where the vibration plate is fixed, high sound pressure or the like can be obtained by cementing the laminated piezoelectric element 10 to the vibration plate at a certain distance from the fixed end of the vibration plate. This preferable effect can also be obtained similarly using various vibration plates other than the quadrangular vibration plate, regardless of the shape of the vibration plate.

For example, in a case where the vibration plate has a polygonal shape having facing sides such as a hexagon and an octagon, it is preferable that the two facing sides are fixed, the distance L between the fixed ends is set as in the quadrangular vibration plate 50, and the laminated piezoelectric element 10 is cemented to the vibration plate 50 at the distance of 0.1×L or greater from the fixed end.

Figure 52:
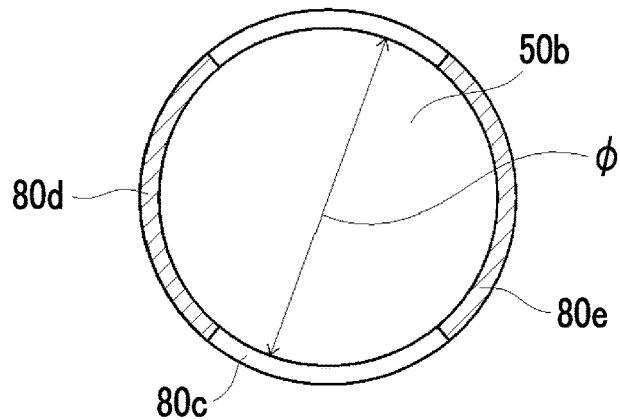
FIG. 52 is a conceptual diagram for explaining another example of the electroacoustic transducer of the present invention.

Further, in the case of the circular vibration plate 50b as conceptually shown in FIG. 52, it is conceivable to provide a circular (annular) fixing unit 80c so as to surround the entire circumference of the vibration plate 50b. In such a case, the inside of the fixing unit 80c is the fixed end. Therefore, the inner diameter 9 of the fixing unit 80c is set as the distance L between the fixed ends, and the laminated piezoelectric element 10 may be cemented at a position separated by 0.1×L or greater from the fixed end of the vibration plate 50.

Further, in the circular vibration plate 50b as shown in FIG. 52, it is also conceivable that the vibration plate 50b is fixed by an arc-shaped fixing unit such as the fixing unit 80d and the fixing unit 80e which are overlapped with the annular fixing unit 80c in FIG. 52 and indicated by the hatch. In a similar manner, in such a case as well, the laminated piezoelectric element 10 may be cemented at a position separated by 0.1×L or greater from the fixed end of the vibration plate 50b, where the inner diameter q of the arc of the fixing unit is the distance L between the fixed ends.

The vibration plate may be a polygon with no facing sides, such as a triangle or a pentagon. In such a case, it is conceivable to fix one side of the polygon and the opposite vertices.

Figure 53:
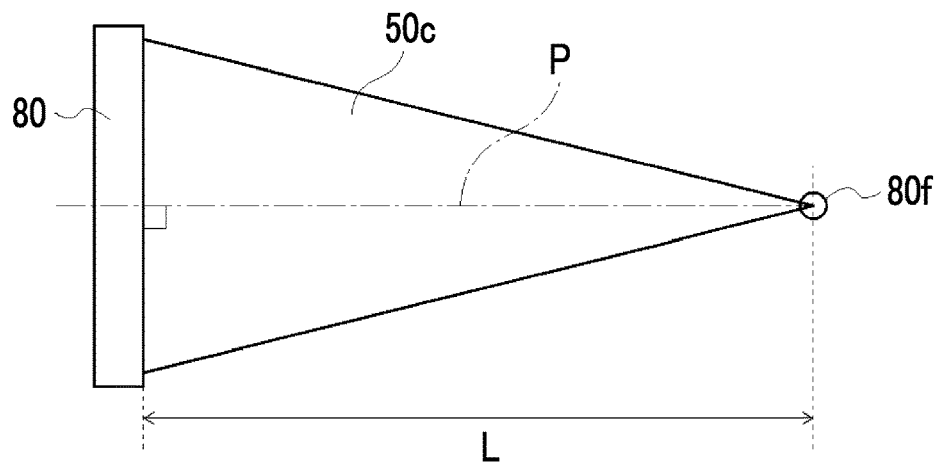
FIG. 53 is a conceptual diagram for explaining another example of the electroacoustic transducer of the present invention.

For example, as conceptually shown in FIG. 53, in a case where the vibration plate 50c is a triangle, it is conceivable to fix one side of the triangle with the fixing unit 80 and fix the vertex facing the one side with the fixing unit 80$f_0$.

In such a case, the vertical line P is drawn from the vertex fixed by the fixing unit 80f to the opposite side to be fixed, and the distance of the vertical line from the vertex to the fixed side is set as the distance L between the fixed ends, and the laminated piezoelectric element 10 may be cemented to a position separated from the fixed end (one of which is the vertex) of the vibration plate 50c by 0.1×L or greater.

The position where the piezoelectric element acting as an exciter is cemented to the vibration plate is set in the same manner, in a case where the piezoelectric element acting as an exciter is constituted of one piece of piezoelectric film, and in a case where the piezoelectric element acting as an exciter is a laminated piezoelectric element in which a cut sheet-shaped piezoelectric film is laminated and preferably an adjacent piezoelectric film is cemented.

Here, in the example shown in FIG. 1, the polarization directions of the adjacent piezoelectric films are opposite to each other. That is, the piezoelectric films are laminated such that the polarization directions are alternated. However, the present invention is not limited to this. As in the example shown in FIG. 9, the polarization directions of the adjacent piezoelectric films may coincide with each other.

Figure 9:
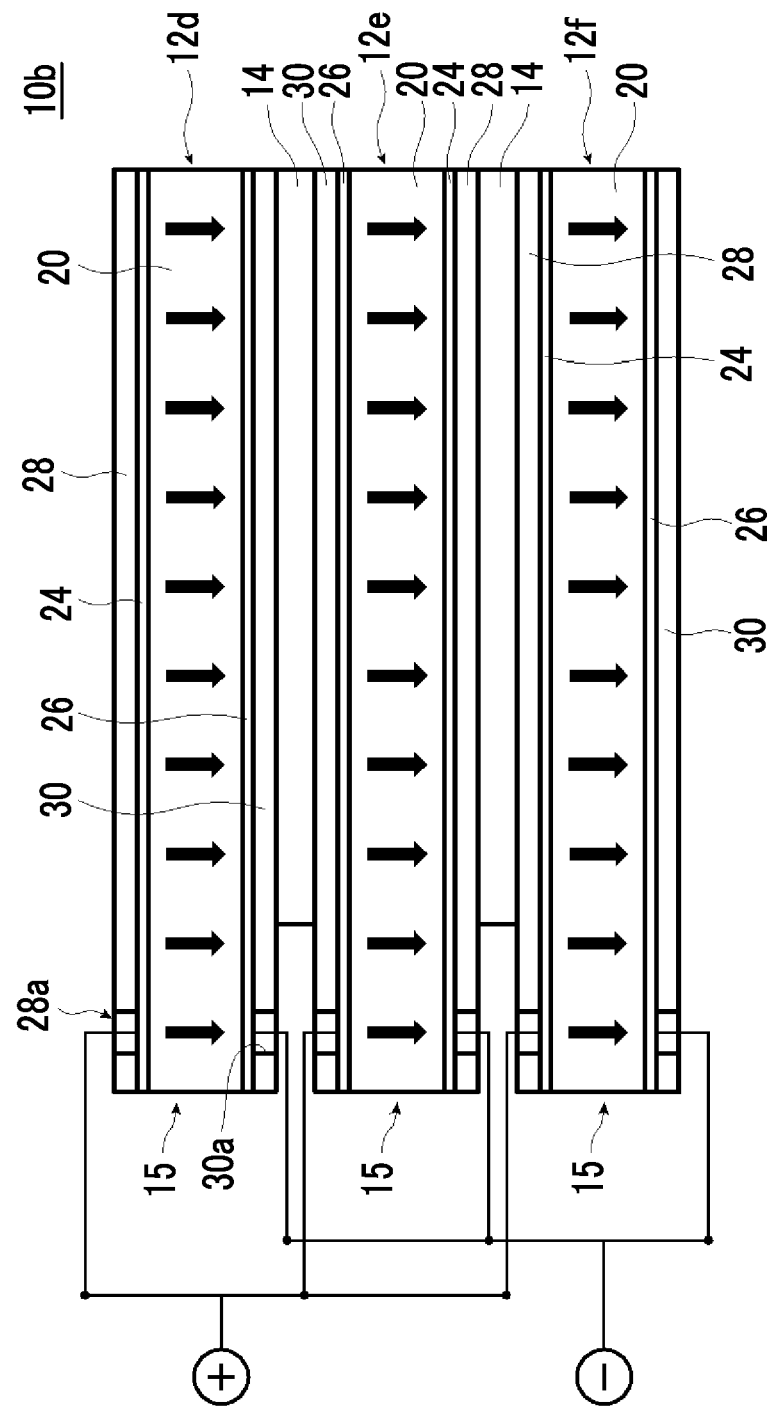
FIG. 9 is a diagram conceptually showing another example of the laminated piezoelectric element of the present invention.

In the example shown in FIG. 9, the first layer piezoelectric film 12d in FIG. 9 has a downward polarization direction as indicated by an arrow in the drawing. Accordingly, the first electrode layer 24 and the first protective layer 28 are disposed on the upper side in FIG. 9, and the second electrode 26 and the second protective layer 30 are disposed on the lower side in FIG. 9. Further, the second layer piezoelectric film 12e disposed adjacent to the surface of the first layer piezoelectric film 12d on the second protective layer 30 side has a downward polarization direction as indicated by an arrow in the drawing. Accordingly, the first electrode layer 24 and the first protective layer 28 are disposed on the upper side in FIG. 9, and the second electrode 26 and the second protective layer 30 are disposed on the lower side in FIG. 9. Further, the third layer piezoelectric film 12f disposed adjacent to the surface of the second layer piezoelectric film 12e on the second protective layer 30 side has a downward polarization direction as indicated by an arrow in the drawing. Accordingly, the first electrode layer 24 and the first protective layer 28 are disposed on the upper side in FIG. 9, and the second electrode 26 and the second protective layer 30 are disposed on the lower side in FIG. 9.

In the example shown in FIG. 9, the first layer piezoelectric film 12d is disposed such that the first electrode layer 24 side is on the upper side in FIG. 9. Therefore, a hole portion serving as the first contact 28a is provided on the first protective layer 28 on the upper surface of the protruding portion 15, and a hole portion serving as the second contact 30a is provided on the second protective layer 30 on the lower surface. The second layer piezoelectric film 12e is disposed such that the first electrode layer 24 side is on the upper side in FIG. 9. Therefore, a hole portion serving as the first contact 28a is provided on the first protective layer 28 on the upper surface of the protruding portion 15, and a hole portion serving as the second contact 30a is provided on the second protective layer 30 on the lower surface. The third layer piezoelectric film 12f is disposed such that the first electrode layer 24 side is on the upper side in FIG. 9. Therefore, a hole portion serving as the first contact 28a is provided on the first protective layer 28 on the upper surface of the protruding portion 15, and a hole portion serving as the second contact 30a is provided on the second protective layer 30 on the lower surface.

As shown in FIG. 9, the first contacts 28a provided on the protruding portions 15 of the piezoelectric films are connected to each other, and the second contacts 30a are connected to each other.

In the laminated piezoelectric element 10 in which the polarization directions of the piezoelectric layers 20 of the adjacent piezoelectric films are opposite to each other, in the adjacent piezoelectric film 12, the second electrode layers 26 face each other on one surface, and the first electrode layers 24 face each other on the other surface. Therefore, this configuration is preferable in that there is no risk of short-circuiting even in a case where the electrode layers of the adjacent piezoelectric films come into contact with each other.

Further, as described above, in order to stretch and contract the laminated piezoelectric element 10 with favorable energy efficiency, it is preferable to make the adhesive layer 14 thin such that the adhesive layer 14 does not interfere with the stretching and contracting of the piezoelectric layer 20. On the other hand, the laminated piezoelectric element 10, in which the polarization directions of the piezoelectric layers 20 of the adjacent piezoelectric films are opposite to each other, is not short-circuited even in a case where the electrode layers of the adjacent piezoelectric films come into contact with each other. Therefore, the adhesive layer 14 can be made extremely thin. Therefore, the laminated piezoelectric element 10 can be stretched and contracted with higher energy efficiency.

As described above, in the piezoelectric film, the absolute amount of stretching and contracting of the piezoelectric layer 20 in the thickness direction is extremely small, and the stretching and contracting of the piezoelectric film is substantially only in the plane direction.

Accordingly, even in a case where the polarization directions of the laminated piezoelectric films are opposite to each other, all the piezoelectric films stretch and contract in the same direction as long as the polarities of the voltages applied to the first electrode layer 24 and the second electrode layer 26 are correct.

In the laminated piezoelectric element 10 of the present invention, the polarization direction of the piezoelectric film may be detected by a d33 meter or the like.

Alternatively, the polarization direction of the piezoelectric layer 20 may be known from the processing conditions of the corona poling processing described above.

In the electroacoustic transducer using the laminated piezoelectric element of the present invention, the adhesive layer that cements the laminated piezoelectric element 10 to the vibration plate 50 is not limited, and various known pressure sensitive adhesives and adhesives can be used. For example, the same as the above-mentioned adhesive layer 14 is exemplified.

In the electroacoustic transducer using the laminated piezoelectric element of the present invention, the vibration plate 50 is not limited, and various articles can be used.

As the vibration plate 50, for example, plate materials such as resin plates and glass plates, advertisement or notification media such as signboards, office devices and furniture such as tables, whiteboards, and projection screens, display devices such as organic electroluminescence (organic light emitting diode (OLED)) displays and liquid crystal displays, members for vehicles including automobiles such as consoles, A-pillars, roofs, and bumpers, and building materials such as walls of houses are exemplified.

In the laminated piezoelectric element 10 of the example shown in the drawing, preferably, a long (large-area) piezoelectric film is produced, and the long piezoelectric film is cut into individual piezoelectric films. Accordingly, in such a case, the plurality of piezoelectric films constituting the laminated piezoelectric element 10 are all the same.

However, the present invention is not limited thereto. That is, the laminated piezoelectric element of the present invention can be used in various configurations, such as a configuration in which piezoelectric films having different layer configurations are laminated, and a configuration in which piezoelectric films having different thicknesses of the piezoelectric layer 20 are laminated.

Next, an example of the configuration of the protruding portion of the piezoelectric film and the method of connecting the contacts to each other will be described in detail.

Figure 10:
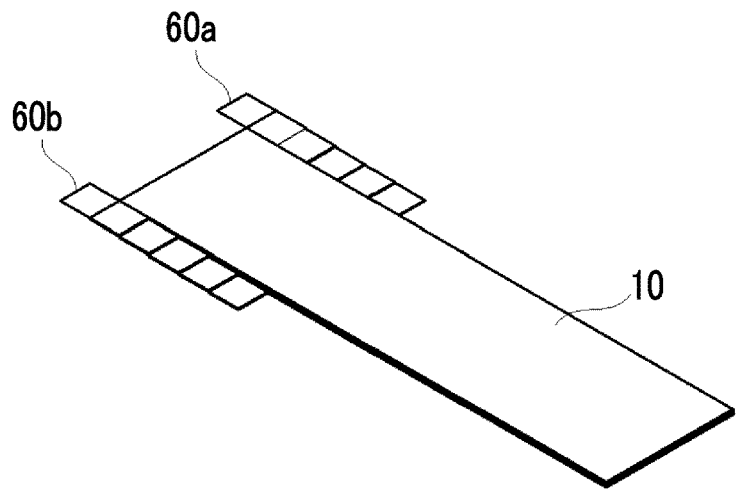
FIG. 10 is a diagram conceptually showing another example of the laminated piezoelectric element of the present invention.
Figure 11:
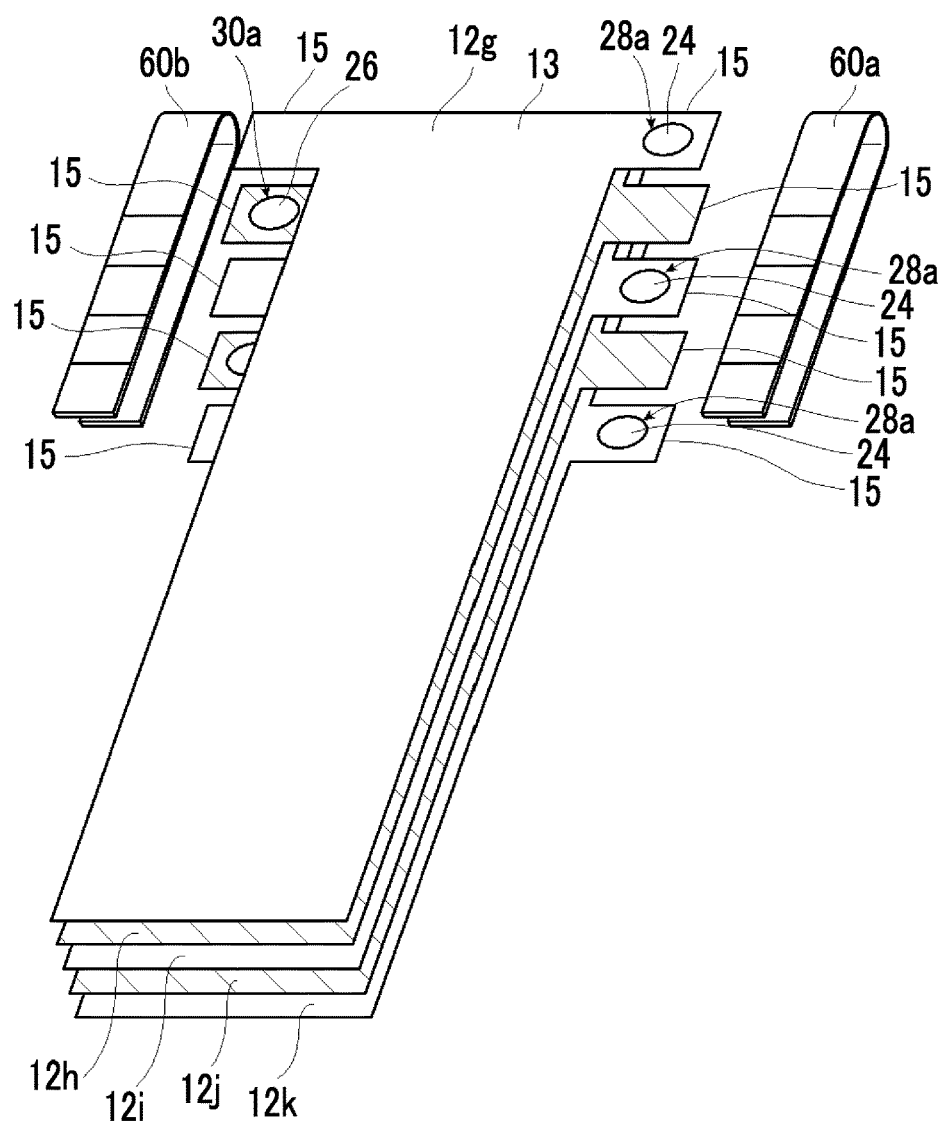
FIG. 11 is an exploded view of FIG. 10.
Figure 12:
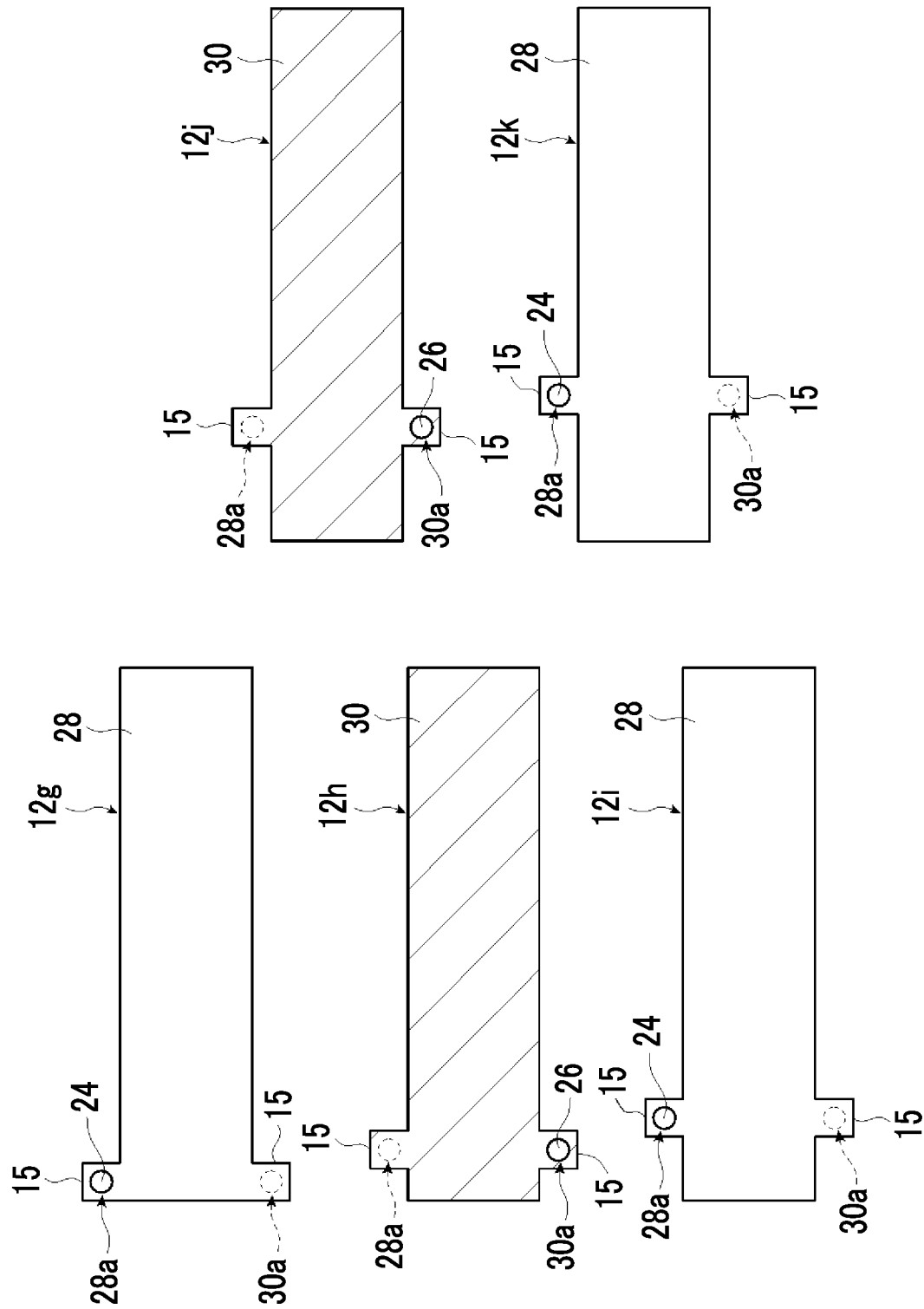
FIG. 12 is a diagram showing a piezoelectric film included in the laminated piezoelectric element of FIG. 10.

FIG. 10 is a diagram conceptually showing an example of a laminated piezoelectric element of the present invention. FIG. 11 is an exploded view of FIG. 10. FIG. 12 is a diagram showing a plurality of piezoelectric films included in the laminated piezoelectric element of FIG. 10.

The examples shown in FIGS. 10 and 11 have a configuration in which five piezoelectric films are laminated. The piezoelectric films are laminated such that the polarization directions are alternated. In FIGS. 11 and 12, the surface of the piezoelectric film on the second protective layer side is shown with hatching. That is, in FIG. 11, the first layer piezoelectric film 12g in FIG. 11 is laminated with the first protective layer 28 side facing upward, the second layer piezoelectric film 12h is laminated with the second protective layer 30 side facing upward, the third layer piezoelectric film 12i is laminated with the first protective layer 28 side facing upward, the fourth layer piezoelectric film 12j is laminated with the second protective layer 30 side facing upward, and the fifth layer piezoelectric film 12k is laminated with the first protective layer 28 side facing upward.

As shown in FIGS. 11 and 12, each piezoelectric film has a rectangular cemented portion 13 and two protruding portions 15 protruding outward from the long side of the cemented portion 13 in the plane direction. The two protruding portions 15 are provided so as to protrude from the opposite long sides of the cemented portion 13. In the example shown in the drawing, the size of the cemented portion 13 of each piezoelectric film is substantially the same.

As shown in FIG. 12, the first layer piezoelectric film 12g has the protruding portion 15 formed on one end side on the long side. In the second layer piezoelectric film 12h, the protruding portion 15 is formed at a position shifted from the position of the first layer protruding portion 15 piezoelectric film 12g toward the other end side. In the third layer piezoelectric film 12i, the protruding portion 15 is formed at a position shifted from the position of the second layer protruding portion 15 piezoelectric film 12h to the other end side. In the fourth layer piezoelectric film 12j, the protruding portion 15 is formed at a position shifted from the position of the third layer protruding portion 15 piezoelectric film 12i to the other end side. In the fifth layer piezoelectric film 12k, the protruding portion 15 is formed at a position shifted from the position of the fourth layer protruding portion 15 piezoelectric film 12j to the other end side.

In the example shown in FIG. 12, the protruding portions of the piezoelectric films have substantially the same size and shape. Further, the protruding portion of each piezoelectric film is formed at a position shifted by one protruding portion from the position of the protruding portion of the adjacent piezoelectric film.

Further, a hole portion 28a penetrating the first protective layer 28 is provided in the protruding portion 15 on one long side of each piezoelectric film, and the first electrode layer 24 is exposed in the hole portion 28a. Further, the protruding portion 15 on the other long side of each piezoelectric film is provided with a hole portion 30a penetrating the second protective layer 30, and the second electrode layer 26 is exposed in the hole portion 30a. That is, the first contact 28a is formed on the protruding portion 15 on one long side of each piezoelectric film, and the second contact 30a is formed on the protruding portion 15 on the other long side.

In a case where such five piezoelectric films are laminated such that the positions of the cemented portions 13 in the plane direction are aligned, as shown in FIG. 11, the protruding portions 15 of the piezoelectric films do not overlap with each other in the plane direction.

In addition, the first contact 28a is formed on each of the protruding portions 15 on the long side (the long side on the right side in FIG. 11) of each piezoelectric film. As described above, the first, third, and fifth layer piezoelectric films and the second and fourth layer piezoelectric films are laminated in opposite directions. Therefore, the first contacts 28a are formed on the surfaces opposite to each other.

A conductive film 60a is cemented to the five protruding portions 15 on which the first contacts 28a are formed from the front surface to the rear surface. Thereby, the first contact 28a of each piezoelectric film is easily electrically connected.

In a similar manner, the second contact 30a is formed on each of the protruding portions 15 on the other long side (the long side on the left side in FIG. 11) of each piezoelectric film. As described above, the first, third, and fifth layer piezoelectric films and the second and fourth layer piezoelectric films are laminated in opposite directions. Therefore, the second contacts 30a are formed on the surfaces opposite to each other.

A conductive film 60b is cemented to the five protruding portions 15 on which the second contacts 30a are formed from the front surface to the rear surface. Thereby, the second contact 30a of each piezoelectric film is easily electrically connected.

The shapes of the hole portion 28a formed in the first protective layer 28 of the protruding portion 15 and the hole portion 30a formed in the second protective layer 30 are not particularly limited as long as they can be reliably connected to the electrode layer, and can have various shapes such as a circular shape, an elliptical shape, a rectangular shape, a polygonal shape, and an indefinite shape.

In addition, the sizes of the hole portion 28a and the hole portion 30a are not particularly limited as long as they can be reliably connected to the electrode layer. The diameter equivalent to a circle is preferably equal to or greater than 0.5 mm and equal to or less than 10 mm and more preferably equal to or greater than 1 mm and equal to or less than 5 mm.

Further, the formation positions of the hole portion (first contact) 28a and the hole portion (second contact) 30a are not particularly limited. However, in order to make each piezoelectric film be able to be easily connected to each other, it is preferable that the hole portion (first contact) 28a and the hole portion (second contact) 30a of the film are each formed on the same side of the cemented portion 13.

As the conductive films 60a and 60b, sheet-like members formed of a conductive metal material such as a copper foil film may be used. Further, the conductive film and the first contact 28a and the second contact 30a may be connected through a conductive coating material such as silver paste.

Here, in the examples shown in FIGS. 10 to 12, each piezoelectric film has two protruding portions, the first contact 28a is formed on one of the two protruding portions 15, and the second contact 30a is formed on the other. However, the configuration is not limited to this. Each piezoelectric film may have one protruding portion, and the first contact 28a and the second contact 30a may be formed on one protruding portion 15. Further, in such a case, the first contact 28a and the second contact 30a may be configured to be formed at an overlapping position in the plane direction, but it is preferable that the first contact 28a and the second contact 30a may be formed at different positions as shown in FIGS. 13 and 14.

Figure 13:
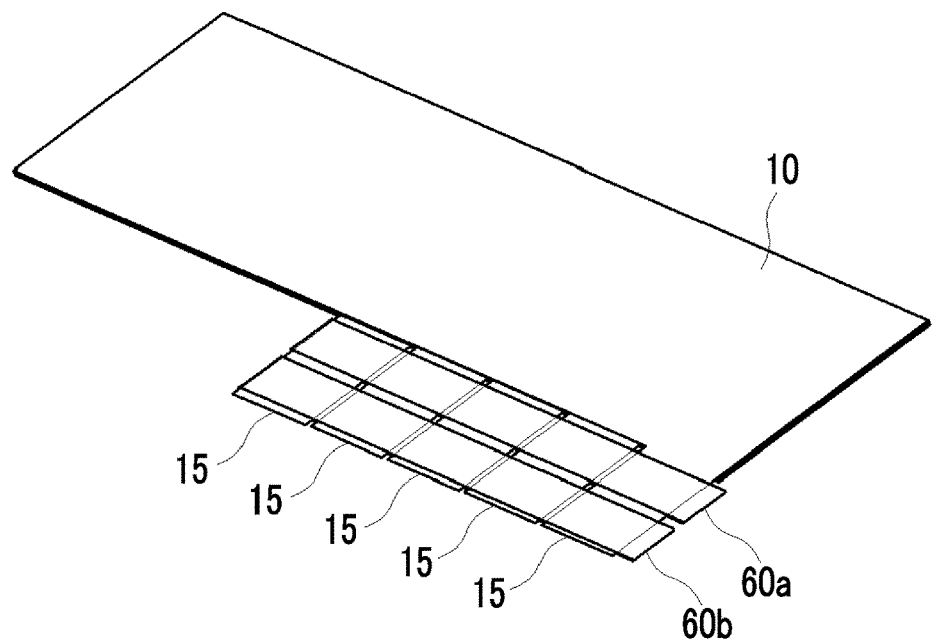
FIG. 13 is a diagram conceptually showing another example of the laminated piezoelectric element of the present invention.

FIG. 13 is a perspective view conceptually showing another example of the laminated piezoelectric element of the present invention. FIG. 14 is an enlarged exploded view of a part of FIG. 13.

Figure 14:
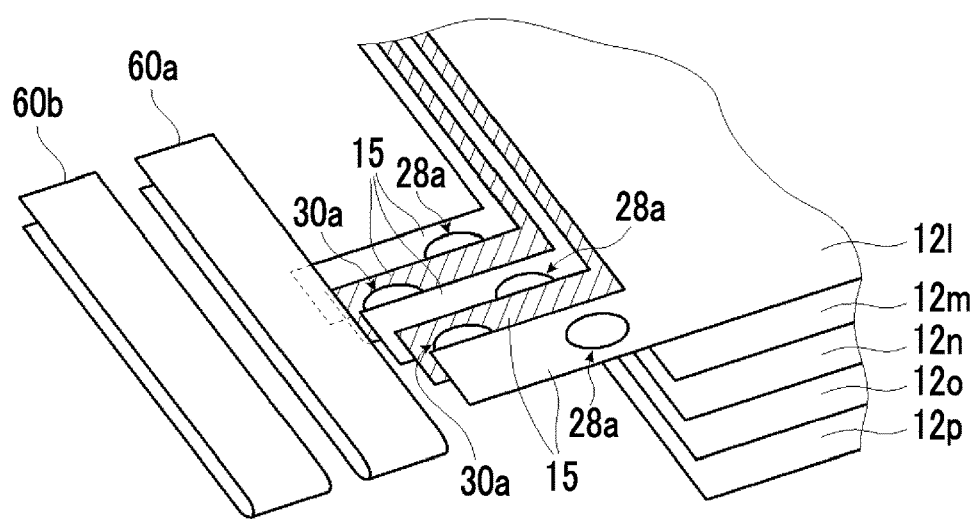
FIG. 14 is an exploded view of FIG. 13.

The laminated piezoelectric elements shown in FIGS. 13 and 14 have a configuration in which five piezoelectric films (12l to 12p) are laminated. The piezoelectric films are laminated such that the polarization directions are alternated. That is, in FIG. 14, the first layer piezoelectric film 12l in FIG. 14 is laminated with the first protective layer 28 side facing upward, the second layer piezoelectric film 12m is laminated with the second protective layer 30 side facing upward, the third layer piezoelectric film 12n is laminated with the first protective layer 28 side facing upward, the fourth layer piezoelectric film 12o is laminated with the second protective layer 30 side facing upward, and the fifth layer piezoelectric film 12p is laminated with the first protective layer 28 side facing upward.

As shown in FIGS. 13 and 14, each piezoelectric film has a rectangular cemented portion and one protruding portion 15 protruding outward from the long side of the cemented portion in the plane direction. One protruding portion 15 is provided so as to protrude from one long side of the cemented portion in a direction away from the cemented portion. In the example shown in the drawing, the size of the cemented portion of each piezoelectric film is substantially the same.

As shown in FIG. 14, the first layer piezoelectric film 12l has the protruding portion 15 formed on one end side on the long side. In the second layer piezoelectric film 12m, the protruding portion 15 is formed at a position shifted from the position of the first layer protruding portion 15 piezoelectric film 12l to the other end side. In the third layer piezoelectric film 12n, the protruding portion 15 is formed at a position shifted from the position of the second layer protruding portion 15 piezoelectric film 12m toward the other end side. In the fourth layer piezoelectric film 12o, the protruding portion 15 is formed at a position shifted from the position of the third layer protruding portion 15 piezoelectric film 12n to the other end side. In the fifth layer piezoelectric film 12p, the protruding portion 15 is formed at a position shifted from the position of the fourth layer protruding portion 15 piezoelectric film 12o to the other end side.

In the example shown in FIG. 14, the protruding portions of the piezoelectric films have substantially the same size and shape. Further, the protruding portion of each piezoelectric film is formed at a position shifted by one protruding portion from the position of the protruding portion of the adjacent piezoelectric film.

Further, as shown in FIG. 14, the hole portion 28a penetrating the first protective layer 28 is provided on the root side (cemented portion side) of the protruding portion 15 of each piezoelectric film, and the first electrode layer 24 is exposed in the hole portion 28a. Further, the hole portion 30a penetrating the second protective layer 30 is provided on the distal end side of the protruding portion 15 of each piezoelectric film, and the second electrode layer 26 is exposed in the hole portion 30a. That is, the first contact 28a and the second contact 30a are formed on the front surface and the rear surface of the protruding portion 15 of each piezoelectric film, respectively.

In a case where such five piezoelectric films are laminated such that the positions of the cemented portions in the plane direction are aligned, as shown in FIG. 14, the protruding portions 15 of the piezoelectric films do not overlap with each other in the plane direction.

Further, the first contact 28a is formed on the root side of each of the protruding portions 15 of each piezoelectric film. As described above, the first, third, and fifth layer piezoelectric films and the second and fourth layer piezoelectric films are laminated in opposite directions. Therefore, the first contacts 28a are formed on the surfaces opposite to each other in the laminated state. In a similar manner, the second contact 30a is formed on the distal end side of each of the protruding portions 15 of each piezoelectric film. As described above, the first, third, and fifth layer piezoelectric films and the second and fourth layer piezoelectric films are laminated in opposite directions. Therefore, the second contacts 30a are formed on the surfaces opposite to each other in the laminated state.

A conductive film 60a is cemented to the position of the first contact 28a on the root side of these five protruding portions 15 from the front surface to the rear surface. Thereby, the first contact 28a of each piezoelectric film is easily electrically connected. In a similar manner, the conductive film 60b is cemented from the front surface to the rear surface at the position of the second contact 30a on the distal end side of the five protruding portions 15. Thereby, the second contact 30a of each piezoelectric film is easily electrically connected. At that time, the conductive film connecting the first contact 28a and the conductive film connecting the second contact 30a are disposed so as not to be connected.

Here, in the examples shown in FIGS. 10 to 12, the piezoelectric films are laminated such that the polarization directions of the piezoelectric layers are alternated. On the other hand, in a case where the piezoelectric films are laminated such that the polarization directions of the piezoelectric layers are the same, the first contact 28a formed on the protruding portion 15 of the piezoelectric film is formed so as to face one same surface side, and the second contact 30a is formed so as to face the other same surface side.

Figure 15:
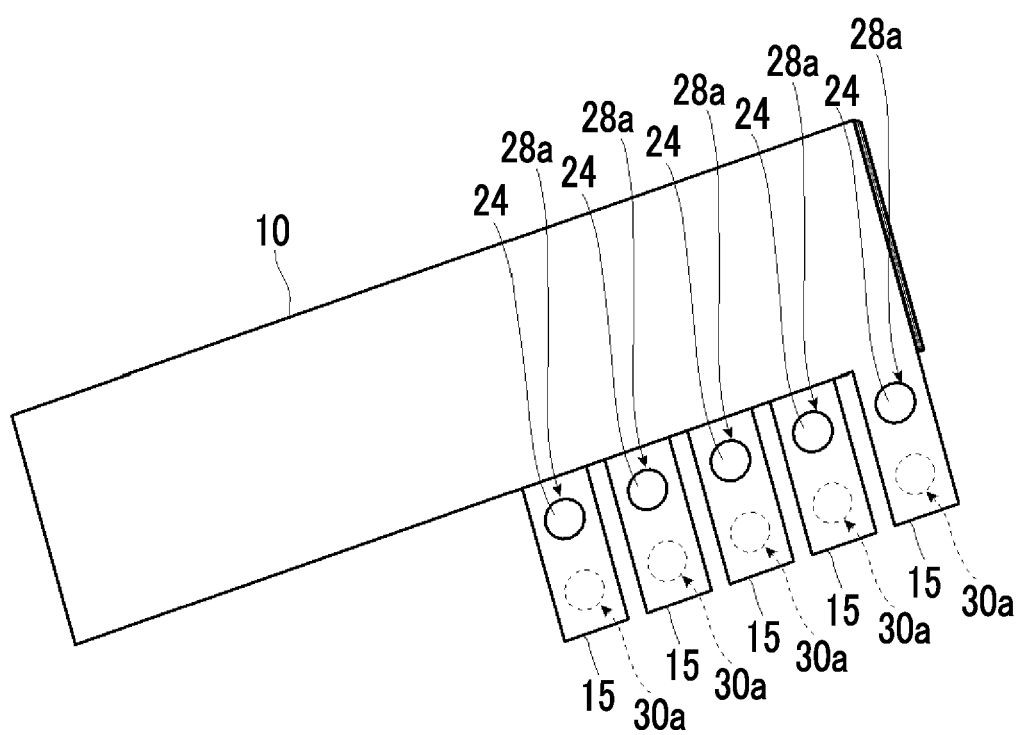
FIG. 15 is a diagram conceptually showing another example of the laminated piezoelectric element of the present invention.

For example, FIG. 15 is a perspective view conceptually showing another example of the laminated piezoelectric element of the present invention.

The laminated piezoelectric element shown in FIG. 15 has a configuration in which five piezoelectric films are laminated. The piezoelectric films are laminated such that the polarization directions are the same.

As shown in FIG. 15, each piezoelectric film has a rectangular cemented portion and one protruding portion 15 protruding outward in the plane direction from the long side of the cemented portion. One protruding portion 15 is provided so as to protrude from one long side of the cemented portion in a direction away from the cemented portion. In the example shown in the drawing, the size of the cemented portion of each piezoelectric film is substantially the same.

The configuration of each piezoelectric film shown in FIG. 15 is the same as that of the piezoelectric films shown in FIGS. 13 and 14 except that the orientations of the second and fourth layers are different. That is, each piezoelectric film has the protruding portion 15 formed on one end side on the long side. The protruding portion 15 of each piezoelectric film is formed at a position shifted by one protruding portion from the position of the protruding portion 15 of the adjacent piezoelectric film in the length direction of the end side of the cemented portion where the protruding portion 15 is formed.

As shown in FIG. 15, the hole portion 28a penetrating the first protective layer 28 is provided on the root side (cemented portion side) of the protruding portion 15 of each piezoelectric film, and the first electrode layer 24 is exposed in the hole portion 28a. Further, the hole portion 30a penetrating the second protective layer 30 is provided on the distal end side of the protruding portion 15 of each piezoelectric film, and the second electrode layer 26 is exposed in the hole portion 30a. That is, the first contact 28a and the second contact 30a are formed on the front surface and the rear surface of the protruding portion 15 of each piezoelectric film, respectively.

In a case where such five piezoelectric films are laminated such that the positions of the cemented portions in the plane direction are aligned, as shown in FIG. 15, the protruding portions 15 of the piezoelectric films do not overlap with each other in the plane direction.

Further, the first contact 28a is formed on the root side of each of the protruding portions 15 of each piezoelectric film. As described above, all the piezoelectric films are laminated in the same direction, in the laminated state. Therefore, all the first contacts 28a are formed on the surfaces in the same direction. In a similar manner, the second contact 30a is formed on the distal end side of each of the protruding portions 15 of each piezoelectric film. As described above, all the piezoelectric films are laminated in the same direction, in the laminated state. Therefore, all the second contacts 30a are formed on the surfaces in the same direction.

The conductive film is cemented to the surface of these five protruding portions 15 on the side where the first contact 28a on the root side is formed. Thereby, the first contact 28a of each piezoelectric film is easily electrically connected. In a similar manner, another conductive film is cemented to the surface on which the second contact 30a on the distal end side of the five protruding portions 15 is formed. Thereby, the second contact 30a of each piezoelectric film is easily electrically connected. At that time, the conductive film connecting the first contact 28a and the conductive film connecting the second contact 30a are disposed so as not to be connected.

Further, in the examples shown in FIGS. 10 to 12, all the protruding portions 15 of the piezoelectric films are disposed at positions that do not overlap with each other in the plane direction, but the configuration is not limited to this.

Figure 16:
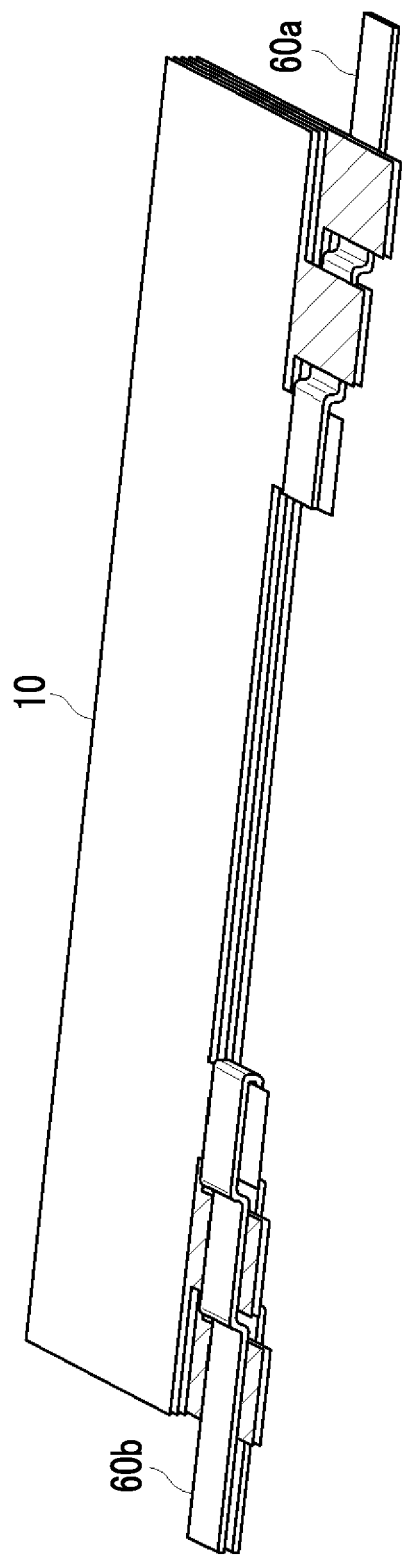
FIG. 16 is a diagram conceptually showing another example of the laminated piezoelectric element of the present invention.
Figure 17:
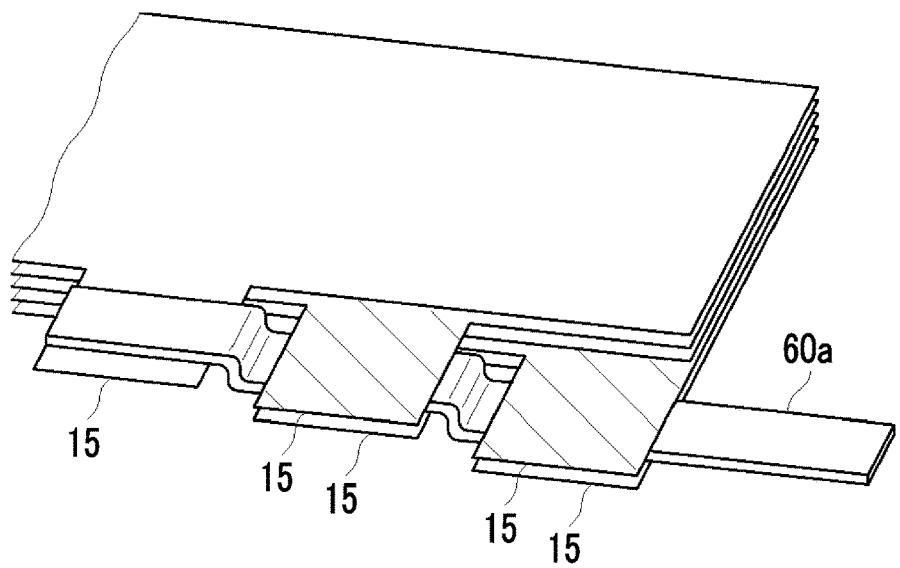
FIG. 17 is a partially enlarged view of FIG. 16.
Figure 18:
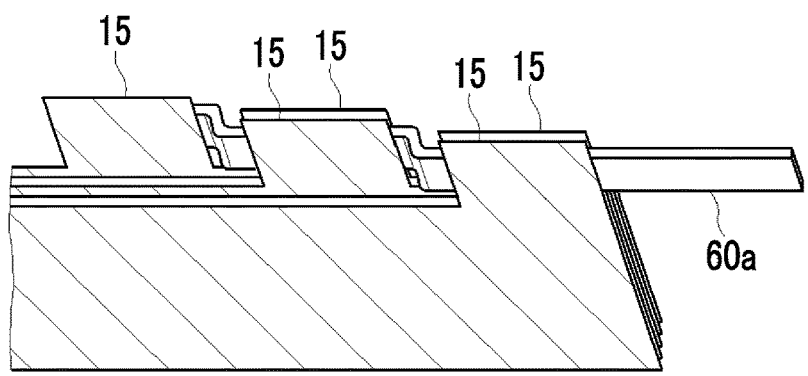
FIG. 18 is a partially enlarged view of FIG. 16.
Figure 19:
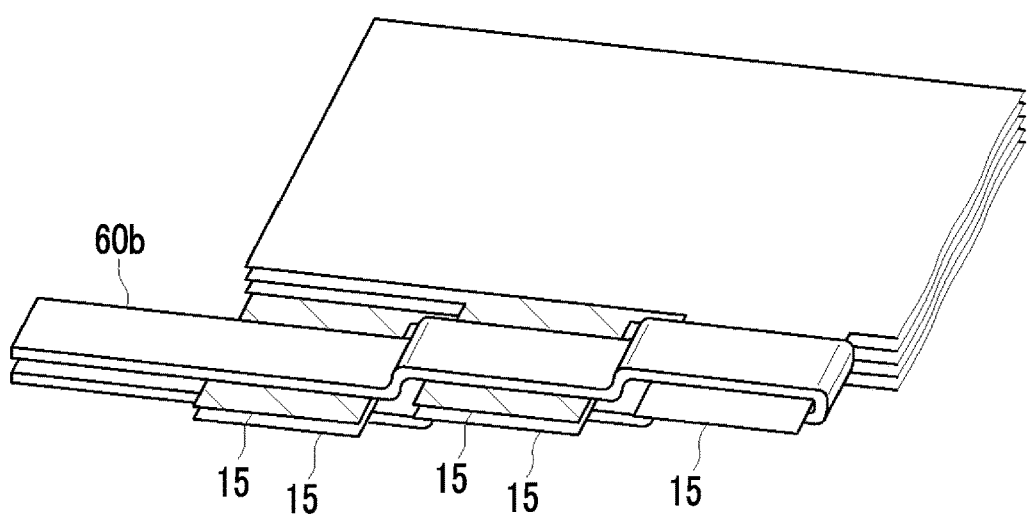
FIG. 19 is a partially enlarged view of FIG. 16.
Figure 20:
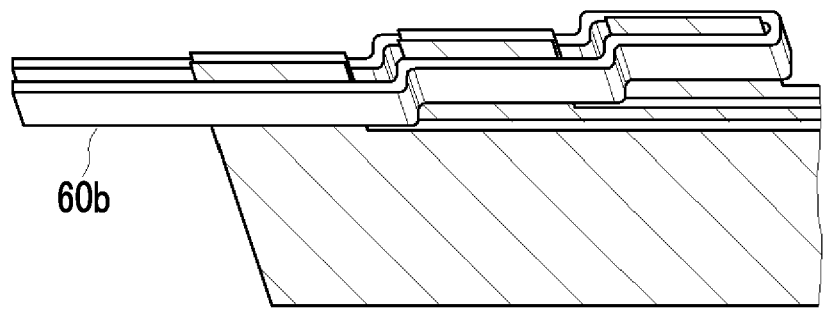
FIG. 20 is a partially enlarged view of FIG. 16.

FIG. 16 is a perspective view conceptually showing another example of the laminated piezoelectric element of the present invention. FIG. 17 is an enlarged view of the right side portion of the laminated piezoelectric element shown in FIG. 16. FIG. 18 is a view of FIG. 17 as viewed from a rear side. FIG. 19 is an enlarged view of the left side portion of the laminated piezoelectric element shown in FIG. 16. FIG. 20 is a view of FIG. 19 as viewed from a rear side.

The laminated piezoelectric elements shown in FIGS. 16 to 20 each have a configuration in which five piezoelectric films are laminated. The piezoelectric films are laminated such that the polarization directions are alternated.

As shown in FIG. 16, each piezoelectric film has a rectangular cemented portion and two protruding portions 15 protruding outward in the plane direction from the long side of the cemented portion. The two protruding portions 15 are formed on one end side and the other end side of the long side of the cemented portion, respectively. In the example shown in the drawing, the size of the cemented portion of each piezoelectric film is substantially the same.

In the example shown in FIG. 16, the first contact is formed on the protruding portion 15 formed on the end surface side on the right side in FIG. 16, and the second contact is formed on the protruding portion 15 formed on the end surface side on the left side in FIG. 16.

As shown in FIGS. 17 and 18, the protruding portions 15 formed on the end surface side on the right side in FIG. 16 are formed at the same positions in the plane direction on the second and third layers and the fourth and fifth layers.

The first contact formed on the second layer protruding portion 15 faces the third layer side, and the first contact formed on the protruding portion of the third layer faces the second layer side. Consequently, the first contact of the second layer and the first contact of the third layer face each other.

In a similar manner, the first contact formed on the fourth layer protruding portion 15 faces the fifth layer side, and the first contact formed on the fifth layer protruding portion faces the fourth layer side. Consequently, the first contact of the fourth layer and the first contact of the fifth layer face each other.

In addition, the first contact formed on the first layer protruding portion 15 faces the side opposite to the second layer.

The first contacts formed on the protruding portions 15 in such a manner are connected to each other by the conductive film 60a. Specifically, as shown in FIGS. 17 and 18, the conductive film 60a is disposed so as to cover the first contact of the first layer protruding portion, be interposed between the second layer and the third layer, and be interposed between the fourth layer and the fifth layer. Thereby, the first contacts of the first to fifth layers are connected.

On the other hand, as shown in FIGS. 19 and 20, the protruding portions 15 formed on the end surface side on the left side in FIG. 16 are formed at the same positions in the plane direction on the second and third layers and the fourth and fifth layers.

The second contact formed on the second layer protruding portion 15 faces the opposite side to the third layer, and the second contact formed on the protruding portion of the third layer faces the opposite side to the second layer. Consequently, the second contact is formed on both sides of the portion where the second and third layer protruding portions are laminated.

In a similar manner, the second contact formed on the fourth layer protruding portion 15 faces the opposite side to the fifth layer, and the second contact formed on the fifth layer protruding portion faces the opposite side to the fourth layer. Consequently, a second contact is formed on both sides of the portion where the fourth and fifth layer protruding portions are laminated.

Further, the second contact formed on the first layer protruding portion 15 faces the second layer side.

The second contacts formed on the protruding portions 15 in such a manner are connected to each other by the conductive film 60b. Specifically, as shown in FIGS. 19 and 20, the conductive film 60b is cemented from the front surface side to the rear surface side of each protruding portion. Thereby, the second contacts of the first to fifth layers are connected.

Here, in the examples shown in FIGS. 10 to 12, the protruding portions of the piezoelectric films are disposed at positions where they do not overlap with each other in the plane direction, but the configuration is not limited to this. The protruding portions of the piezoelectric films may protrude from the same position on the cemented portion in the plane direction, and the lengths in the protrusion directions may be different from each other.

Figure 21:
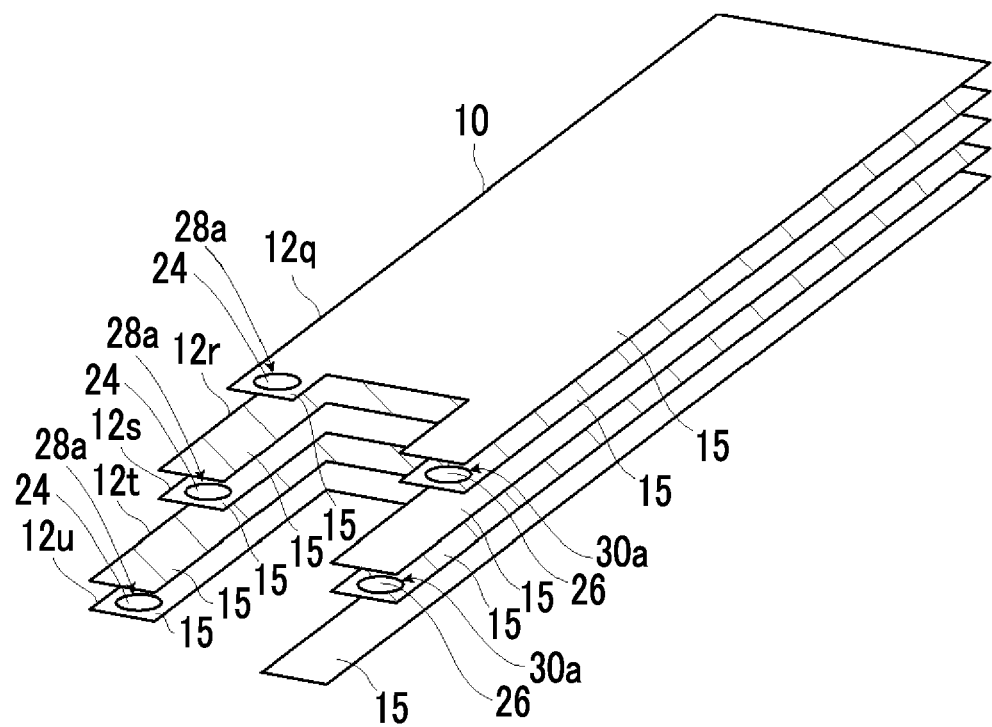
FIG. 21 is a diagram conceptually showing another example of the laminated piezoelectric element of the present invention.

FIG. 21 is a perspective view conceptually showing another example of the laminated piezoelectric element of the present invention. FIG. 21 is an exploded view.

The laminated piezoelectric element shown in FIG. 21 has a configuration in which five piezoelectric films (12q to 12u) are laminated. The piezoelectric films are laminated such that the polarization directions are alternated. That is, in FIG. 21, the first layer piezoelectric film 12q in FIG. 21 is laminated with the first protective layer 28 side facing upward, the second layer piezoelectric film 12r is laminated with the second protective layer 30 side facing upward, the third layer piezoelectric film 12s is laminated with the first protective layer 28 side facing upward, the fourth layer piezoelectric film 12t is laminated with the second protective layer 30 side facing upward, and the fifth layer piezoelectric film 12u is laminated with the first protective layer 28 side facing upward.

As shown in FIG. 21, each piezoelectric film has a rectangular cemented portion and two protruding portions 15 protruding outward in the plane direction from the short side of the cemented portion. The two protruding portions 15 are provided at one end part and the other end part of the short side. In the example shown in the drawing, the size of the cemented portion of each piezoelectric film is substantially the same.

First, the protruding portion formed at the left side end part in FIG. 21 will be described. As shown in FIG. 21, the first layer piezoelectric film 12q has the protruding portion 15 formed at the left side end part of the short side. The second layer piezoelectric film 12r is formed with the protruding portion 15 protruding from the same position as the position of the first layer protruding portion 15 piezoelectric film 12q. The second layer protruding portion 15 has a longer length in the protrusion direction than the first layer protruding portion 15. The third layer piezoelectric film 12s is formed with the protruding portion 15 protruding from the same position as the second layer protruding portion 15 piezoelectric film 12r. The third layer protruding portion 15 has the same length as the second layer protruding portion 15. The fourth layer piezoelectric film 12t is formed with the protruding portion 15 protruding from the same position as the third layer protruding portion 15 piezoelectric film 12s. The fourth layer protruding portion 15 has a longer length in the protrusion direction than the third layer protruding portion 15. The fifth layer piezoelectric film 12u is formed with the protruding portion 15 protruding from the same position as the fourth layer protruding portion 15 piezoelectric film 12t. The fifth layer protruding portion 15 has the same length as the fourth layer protruding portion 15.

The protruding portion 15 on the left side in FIG. 21 is provided with a hole portion 28a penetrating the first protective layer 28, and the first electrode layer 24 is exposed in the hole portion 28a. That is, the first contact 28a is formed on each protruding portion 15.

As described above, the first, third, and fifth layer piezoelectric films and the second and fourth layer piezoelectric films are laminated in the opposite directions. Therefore, as shown in FIG. 21, the first contact of the second layer and the first contact of the third layer face each other. In a similar manner, the first contact of the fourth layer and the first contact of the fifth layer face each other.

The first contacts formed on the protruding portions 15 in such a manner are connected to each other by a conductive film (not shown). Specifically, a conductive film that covers the first contact of the first layer protruding portion, a conductive film interposed between the protruding portions 15 of the second layer and the third layer, and a conductive film interposed between the protruding portions 15 of the fourth and fifth layers are disposed, and the three conductive films are connected. Thereby, the first contacts of the first to fifth layers are connected. The disposition of the conductive films is the same as the example of FIGS. 24 to 26 to be described later.

Next, the protruding portion formed at the right side end part in FIG. 21 will be described. As shown in FIG. 21, the first layer piezoelectric film 12q has the protruding portion 15 formed at the right side end part of the short side. The second layer piezoelectric film 12r is formed with the protruding portion 15 protruding from the same position as the position of the first layer protruding portion 15 piezoelectric film 12q. The second layer protruding portion 15 has the same length as the first layer protruding portion 15. The third layer piezoelectric film 12s is formed with the protruding portion 15 protruding from the same position as the second layer protruding portion 15 piezoelectric film 12r. The third layer protruding portion 15 has a longer length in the protrusion direction than the second layer protruding portion 15. The fourth layer piezoelectric film 12t is formed with the protruding portion 15 protruding from the same position as the third layer protruding portion 15 piezoelectric film 12s. The fourth layer protruding portion 15 has the same length as the third layer protruding portion 15. The fifth layer piezoelectric film 12u is formed with the protruding portion 15 protruding from the same position as the fourth layer protruding portion 15 piezoelectric film 12t. The fifth layer protruding portion 15 has a longer length in the protrusion direction than the fourth layer protruding portion 15.

The protruding portion 15 on the right side in FIG. 21 is provided with a hole portion 30a penetrating the second protective layer 30, and the second electrode layer 26 is exposed in the hole portion 30a. That is, the second contact 30a is formed on each protruding portion 15.

As described above, the first, third, and fifth layer piezoelectric films and the second and fourth layer piezoelectric films are laminated in the opposite directions. Therefore, as shown in FIG. 21, the second contact of the first layer and the second contact of the second layer face each other. In a similar manner, the second contact of the third layer and the second contact of the fourth layer face each other.

The second contacts formed on the protruding portions 15 in such a manner are connected to each other by a conductive film (not shown). Specifically, a conductive film interposed between the first layer and the second layer, a conductive film interposed between the third layer and the fourth layer, and a conductive film that covers the second contact of the fifth layer protruding portion are disposed, and the three conductive films are connected. Thereby, the second contacts of the first to fifth layers are connected. The disposition of the conductive films is the same as the example of FIGS. 24 to 26 to be described later.

In such a manner, by making the first contacts of adjacent conductive films or the second contacts face each other and disposing the conductive film between them, the number of substantial extraction electrodes (the number of conductive films) can be reduced.

Here, in the example shown in FIG. 21, in a configuration in which the piezoelectric films are laminated such that the polarization directions are alternated, the protruding portion of each piezoelectric film protrudes from the same position on the cemented portion in the plane direction, and the lengths in the protrusion directions are different from each other. In such a case, the contacts of the adjacent piezoelectric films are faced to each other and connected to each other. However, the present invention is not limited to this configuration. One protruding portion of the adjacent piezoelectric film may be bent in the protrusion direction.

Figure 22:
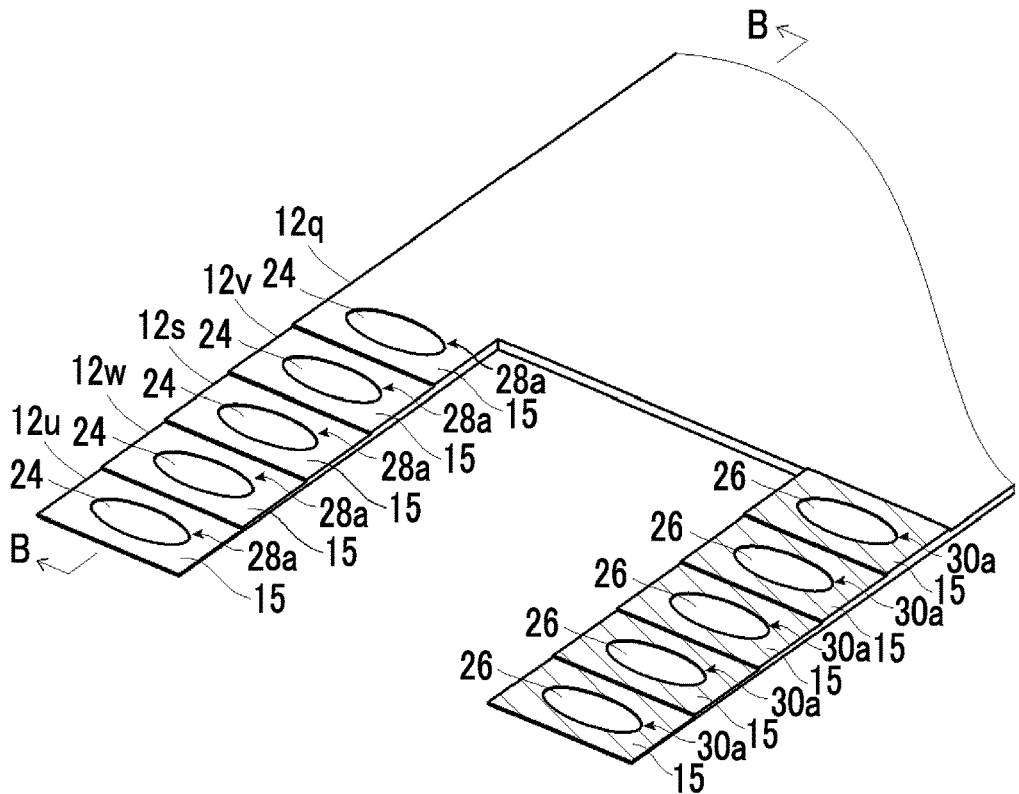
FIG. 22 is a diagram conceptually showing another example of the laminated piezoelectric element of the present invention.
Figure 23:
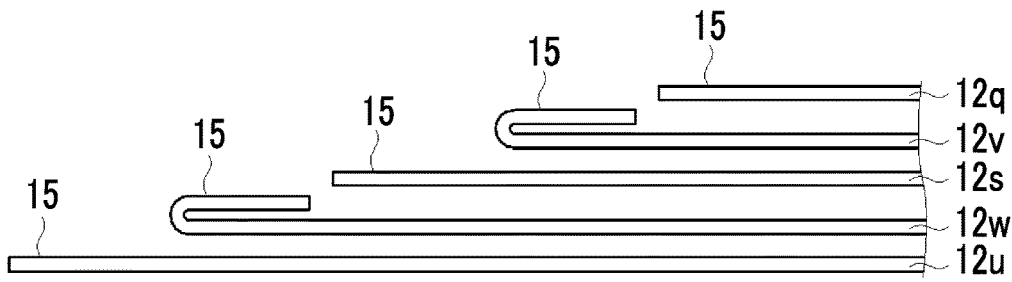
FIG. 23 is a cross-sectional view taken along a line BB of FIG. 22.

FIG. 22 is a partially enlarged perspective view conceptually showing another example of the laminated piezoelectric element of the present invention. FIG. 23 is a cross-sectional view taken along the line BB of FIG. 22.

The laminated piezoelectric element shown in FIG. 22 has a configuration in which five piezoelectric films ($12q$, $12v$, $12s$, $12w$, and $12u$) are laminated. The piezoelectric films are laminated such that the polarization directions are alternated. That is, in FIG. 22, the first layer piezoelectric film $12q$ in FIG. 22 is laminated with the first protective layer 28 side facing upward, the second layer piezoelectric film $12v$ is laminated with the second protective layer 30 side facing upward, the third layer piezoelectric film $12s$ is laminated with the first protective layer 28 side facing upward, the fourth layer piezoelectric film $12w$ is laminated with the second protective layer 30 side facing upward, and the fifth layer piezoelectric film $12u$ is laminated with the first protective layer 28 side facing upward. In the piezoelectric films of the laminated piezoelectric element shown in FIG. 22, the first, third, and fifth layer piezoelectric films have the same configurations as the first, third, and fifth layer piezoelectric films of the laminated piezoelectric element shown in FIG. 21.

As shown in FIG. 22, each piezoelectric film has a rectangular cemented portion and two protruding portions 15 protruding outward in the plane direction from the short side of the cemented portion. The two protruding portions 15 are provided at one end part and the other end part of the short side. In the example shown in the drawing, the size of the cemented portion of each piezoelectric film is substantially the same.

In FIG. 22, the protruding portion formed at the left side end part will be described with reference to FIG. 23. As shown in FIG. 22, the first layer piezoelectric film $12q$ has the protruding portion 15 formed at the left side end part of the short side. The second layer piezoelectric film $12v$ is formed with the protruding portion 15 protruding from the same position as the first layer protruding portion 15 piezoelectric film $12q$. Here, as shown in FIG. 23, the second layer protruding portion 15 is folded back in the protrusion direction. Therefore, the surface of the second layer protruding portion on the first protective layer side faces the side of the first layer piezoelectric film $12q$. That is, the first contact $28a$ of the second layer is disposed so as to face the first layer piezoelectric film $12q$. The folded-back portion of the second layer protruding portion 15 is disposed at a position that does not overlap with the first layer protruding portion 15. The third layer piezoelectric film $12s$ is formed with the protruding portion 15 protruding from the same position as the second layer protruding portion 15 piezoelectric film $12r$. The third layer protruding portion 15 is longer than the length of the second layer protruding portion 15 in the folded-back state. The fourth layer piezoelectric film $12w$ is formed with the protruding portion 15 protruding from the same position as the third layer protruding portion 15 piezoelectric film $12s$. Here, as shown in FIG. 23, the fourth layer protruding portion 15 is folded back in the protrusion direction. Therefore, the surface of the fourth layer protruding portion on the first protective layer side faces the first layer piezoelectric film $12q$ side. That is, the first contact $28a$ of the fourth layer is disposed so as to face the first layer piezoelectric film $12q$. The folded-back portion of the fourth layer protruding portion 15 is disposed at a position that does not overlap with the third layer protruding portion 15. The fifth layer piezoelectric film $12u$ is formed with the protruding portion 15 protruding from the same position as the fourth layer protruding portion 15 piezoelectric film $12t$. The fifth layer protruding portion 15 is longer than the length of the fourth layer protruding portion 15 in the folded-back state.

In such a manner, in a configuration in which the piezoelectric films are laminated such that the polarization directions are alternated, the adjacent piezoelectric films, that is, the protruding portions 15 of the piezoelectric films having the polarization direction in one direction are bent in the protrusion direction. With the configuration, the first contact $28a$ of each piezoelectric film can be disposed on the same surface side. Thereby, it is easier to cement a conductive film or the like to connect the first contact $28a$ of each piezoelectric film.

With respect to the protruding portion formed at the right side end part in FIG. 22, the second contact of each piezoelectric film can be disposed on the same surface side with basically the same configuration as described above. In the example shown in FIG. 22, the protruding portion 15 formed at the right side end part is provided with a second contact, and the protruding portion 15 of the first, third, and fifth layer piezoelectric films is folded back in the protrusion direction. Therefore, the second contact $30a$ of each piezoelectric film can be disposed on the same surface side.

In the examples shown in FIGS. 21 and 22, the piezoelectric films are laminated such that the polarization directions are alternated, but the present invention is not limited to this. Even in a case where the piezoelectric films are laminated so as to have the same polarization direction, the protruding portions of the piezoelectric films may protrude from the same position on the cemented portion in the plane direction, and the lengths in the protrusion directions may be different from each other. In such a case, the lengths of all the overlapping protruding portions are different, and each first contact (or second contact) is formed on the surface of the protruding portions facing the same side.

Here, in the example shown in FIG. 21, the protruding portions of the piezoelectric films protrude from the same position on the cemented portion in the plane direction, and the lengths in the protrusion directions are different from each other, but the present invention is not limited to this. The protruding portion of each piezoelectric film may be configured to protrude from the same position on the cemented portion in the plane direction and have the same length in the protrusion direction.

Figure 24:
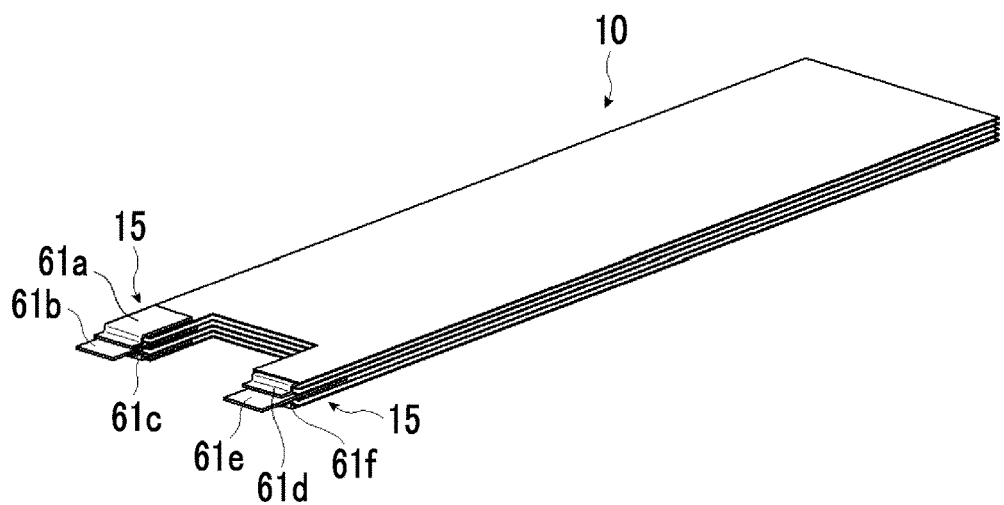
FIG. 24 is a diagram conceptually showing another example of the laminated piezoelectric element of the present invention.
Figure 25:
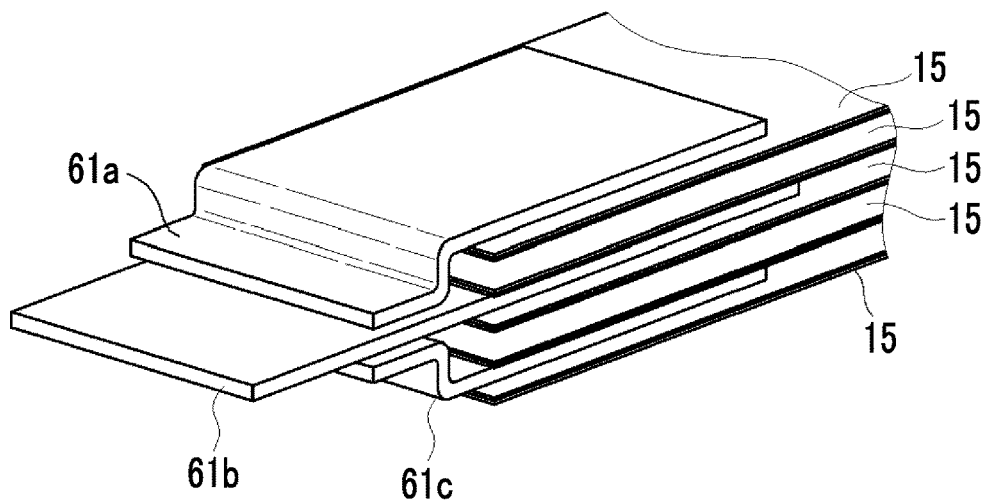
FIG. 25 is a partially enlarged view of FIG. 24.
Figure 26:
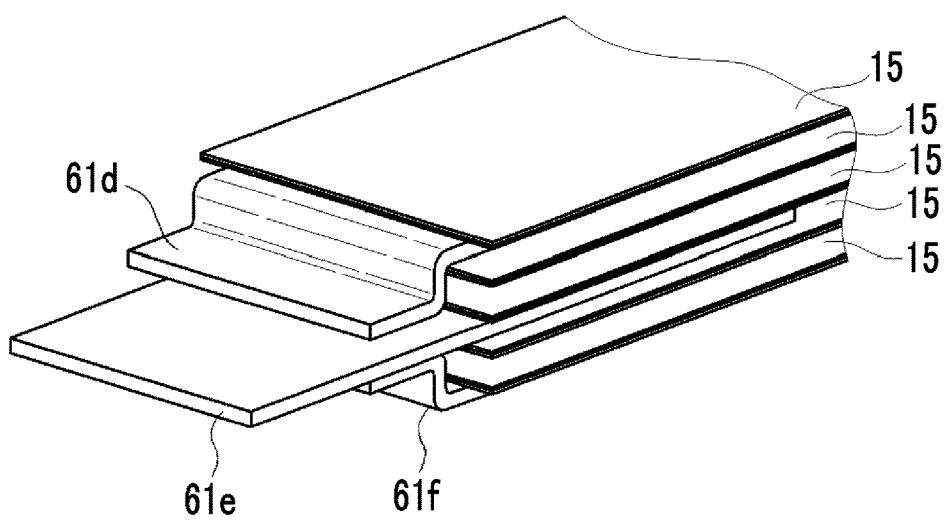
FIG. 26 is a partially enlarged view of FIG. 24.

FIG. 24 is a perspective view conceptually showing another example of the laminated piezoelectric element of the present invention. FIG. 25 is an enlarged view of a part of the protruding portion on the left side of FIG. 24. FIG. 26 is an enlarged view of a part of the protruding portion on the right side of FIG. 24.

The laminated piezoelectric element shown in FIG. 24 has a configuration in which five piezoelectric films are laminated. The piezoelectric films are laminated such that the polarization directions are alternated.

As shown in FIG. 24, each piezoelectric film has a rectangular cemented portion and two protruding portions 15 protruding outward in the plane direction from the short side of the cemented portion. The two protruding portions 15 are provided at one end part and the other end part of the short side. In the example shown in the drawing, the size of the cemented portion of each piezoelectric film is substantially the same.

First, in FIG. 24, the protruding portion formed at the left side end part will be described with reference to FIG. 25.

The protruding portion 15 on the left side in FIG. 24 is provided with a hole portion 28a penetrating the first protective layer 28, and the first electrode layer 24 is exposed in the hole portion 28a. That is, the first contact 28a is formed on each protruding portion 15.

The first, third, and fifth layer piezoelectric films and the second and fourth layer piezoelectric films are laminated in the opposite directions. Therefore, the first contact of the second layer and the first contact of the third layer face each other. In a similar manner, the first contact of the fourth layer and the first contact of the fifth layer face each other.

The three conductive films are disposed on the protruding portions 15. Specifically, the conductive film 61a covering the first contact of the first layer of the protruding portion 15, the conductive film 61b interposed between the protruding portions 15 of the second layer and the third layer, and the conductive film 61c interposed between the fourth layer protruding portion 15 and the fifth layer are disposed. Then, the conductive film 61a and the conductive film 61b are brought into contact with each other, and the conductive film 61b and the conductive film 61c are brought into contact with each other. Thereby, the first contacts of the first to fifth layers are connected.

In a similar manner, in FIG. 24, the protruding portion formed at the right side end part will be described with reference to FIG. 26.

The protruding portion 15 on the right side in FIG. 24 is provided with the hole portion 30a penetrating the second protective layer 30, and the second electrode layer 26 is exposed in the hole portion 30a. That is, the second contact 30a is formed on each protruding portion 15.

The first, third, and fifth layer piezoelectric films and the second and fourth layer piezoelectric films are laminated in the opposite directions. Therefore, the second contact of the first layer and the second contact of the second layer face each other. In a similar manner, the second contact of the third layer and the second contact of the fourth layer face each other.

The three conductive films are disposed on the protruding portions 15. Specifically, the conductive film 61d interposed between the protruding portions 15 of the first layer and the second layer, the conductive film 61e interposed between the protruding portions 15 of the third layer and the fourth layer, and the conductive film 61f covering the second contact of the fifth layer protruding portion 15 are disposed. Then, the conductive film 61d and the conductive film 61e are brought into contact with each other, and the conductive film 61e and the conductive film 61f are brought into contact with each other. Thereby, the second contacts of the first to fifth layers are connected.

Further, in each of the above-mentioned examples, the protruding portion of each piezoelectric film is formed on a part in the width direction of the end side of the cemented portion on which the protruding portion is formed. That is, the width of the protruding portion in the direction orthogonal to the protrusion direction is shorter than the width of the end side of the cemented portion on which the protruding portion is formed. However, the width is not limited to this. The width of the protruding portion of each piezoelectric film in the direction orthogonal to the protrusion direction may be the same as the width of the end side of the cemented portion on which the protruding portion is formed.

Figure 27:
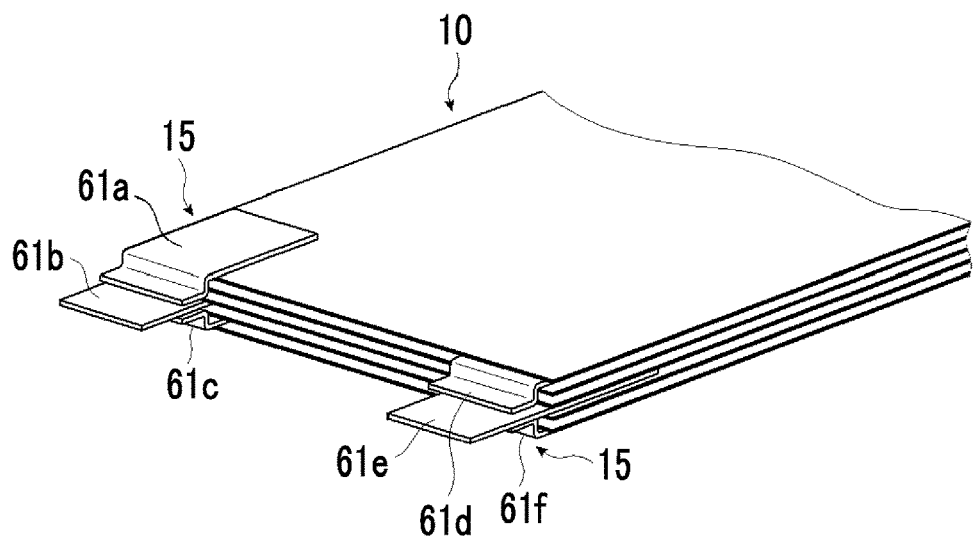
FIG. 27 is a diagram conceptually showing another example of the laminated piezoelectric element of the present invention.

FIG. 27 is a partially enlarged perspective view conceptually showing another example of the laminated piezoelectric element of the present invention.

The laminated piezoelectric element shown in FIG. 27 has a configuration in which five piezoelectric films are laminated. The piezoelectric films are laminated such that the polarization directions are alternated.

In the laminated piezoelectric element shown in FIG. 27, each piezoelectric film has a rectangular cemented portion and one protruding portion 15 protruding outward in the plane direction from the short side of the cemented portion. The protruding portion 15 has the same width as the width of the short side.

The hole portion 28a (first contact 28a) penetrating the first protective layer 28 is formed at the left side end part of the protruding portion 15.

The first, third, and fifth layer piezoelectric films and the second and fourth layer piezoelectric films are laminated in the opposite directions. Therefore, the first contact of the second layer and the first contact of the third layer face each other. In a similar manner, the first contact of the fourth layer and the first contact of the fifth layer face each other.

The three conductive films (61a, 61b, and 61c) are disposed at the positions of these first contacts 28a. The disposition of the three conductive films (61a, 61b, and 61c) is the same as in FIG. 25. Consequently, the conductive film 61a covering the first contact 28a of the first layer piezoelectric film, the conductive film 61b interposed between the second layer and the third layer and connected to each first contact 28a, and the conductive film 61c interposed between the fourth layer and the fifth layer and connected to each first contact 28a are provided. Then, by bringing three conductive films (61a, 61b, and 61c) into contact with each other, the first contacts of the first to fifth layers are connected.

Further, the hole portion 30a (second contact 30a) penetrating the second protective layer 30 is formed at the right side end part of the protruding portion 15.

The first, third, and fifth layer piezoelectric films and the second and fourth layer piezoelectric films are laminated in the opposite directions. Therefore, the second contact of the first layer and the second contact of the second layer face each other. In a similar manner, the second contact of the third layer and the second contact of the fourth layer face each other.

The three conductive films (61d, 61e, and 61f) are disposed at the positions of these second contacts 30a. The disposition of the three conductive films (61d, 61e, and 61f) is the same as in FIG. 26. Consequently, the conductive film 61d interposed between the first layer and the second layer and connected to each second contact 30a, the conductive film 61e interposed between the third layer and the fourth layer and connected to each second contact 30a, and the conductive film 61f covering the second contact 30a of the fifth layer piezoelectric film are provided. Then, by bringing the three conductive films (61d, 61e, and 610 into contact with each other, the second contacts of the first to fifth layers are connected.

In a case where the width in the direction orthogonal to the protrusion direction of the protruding portion is shorter than the width of the end side of the cemented portion where the protruding portion is formed, it is preferable that the corner portion of the connection portion between the protruding portion and the cemented portion has the R structure. R is preferably 0.3 mm or greater, and more preferably 0.5 mm or greater. Since each piezoelectric film is thin, the protruding portions that are not laminated hang down from the root. This can be suppressed by providing the R structure at the corner portion of the connection portion between the protruding portion and the cemented portion.

Further, the R structure indicates that there is a portion where the shape of the ridge line of the protruding portion changes within the above-mentioned radius regulation at the intersection of the straight line forming the protruding portion and the straight line forming the cemented portion, and the R structure does not have to be a circle. That is, the connection portion between the protruding portion and the cemented portion may have a region where the protruding portion gradually widens from the distal end side toward the root portion. More specifically, the ridge line of the protruding portion and the ridge line of the cemented portion are applied to the coordinates. A tangent R0.5 is drawn on the coordinate axis made by extending the straight line of the part separated by 5 mm or greater from the connection portion between the protruding portion and the cemented portion, and the area A surrounded by the tangent R0.5 and the coordinate axes are defined. Then, it is preferable that the area B surrounded by the ridge line and the coordinate axis of the wide region formed in the actual protruding portion is larger than the area A.

Here, it is preferable that the width of the protruding portion in the direction orthogonal to the protrusion direction (hereinafter, also simply referred to as "the width of the protruding portion") is narrower on the distal end side than on the cemented portion side (root side), and it is preferable that the width gradually narrows as the distance from the cemented portion increases. Further, it is preferable that the specific shape of the protruding portion is a trapezoidal shape as viewed from a direction perpendicular to the principal surface of the cemented portion (hereinafter, also referred to as "in a plan view").

This point will be described with reference to FIGS. 54 to 57.

Figure 54:
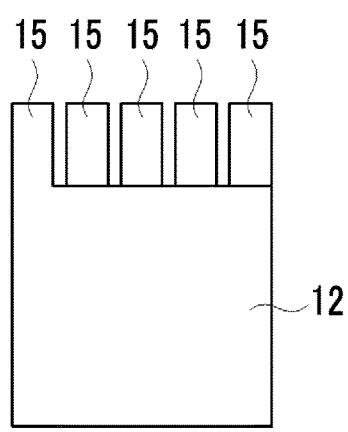
FIG. 54 is a diagram conceptually showing another example of the laminated piezoelectric element of the present invention.
Figure 55:
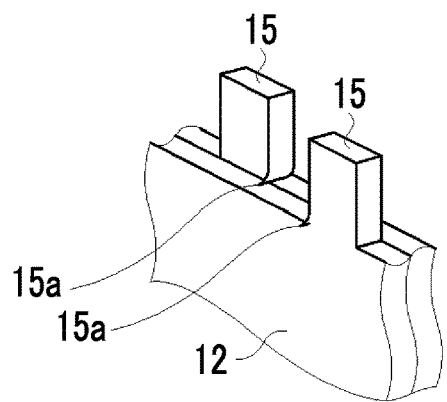
FIG. 55 is an enlarged perspective view showing a part of the laminated piezoelectric element shown in FIG. 54.
Figure 56:
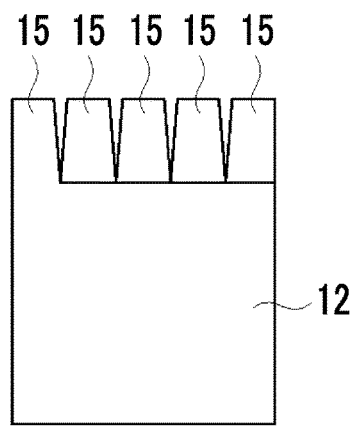
FIG. 56 is a diagram conceptually showing another example of the laminated piezoelectric element of the present invention.
Figure 57:
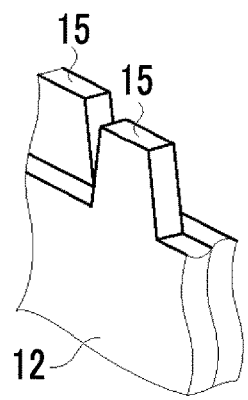
FIG. 57 is an enlarged perspective view showing a part of the laminated piezoelectric element shown in FIG. 56.

FIG. 54 is a conceptual diagram showing an example of a laminated piezoelectric element having a rectangular protruding portion. FIG. 55 is an enlarged view showing a part of the laminated piezoelectric element of FIG. 54. FIG. 56 is a conceptual diagram showing an example of a laminated piezoelectric element having a trapezoidal protruding portion. FIG. 57 is an enlarged view showing a part of the laminated piezoelectric element of FIG. 56.

In the laminated piezoelectric element shown in FIG. 54, each of the five piezoelectric films 12 has the protruding portion 15 on the side which is the same side in a case where the film is laminated. The protruding portions 15 of the respective piezoelectric films 12 are formed at positions displaced in the direction along the side on which the protruding portions 15 are formed so as not to overlap as viewed from a direction perpendicular to the principal surface. Further, the protruding portion 15 of the laminated piezoelectric element shown in FIG. 54 has the same width in the direction orthogonal to the protrusion direction on the cemented portion side (root side) and the distal end side. Consequently, the shape of the protruding portion in a plan view is rectangular.

As described above, electric contacts are formed in the respective protruding portions 15, and the contacts are electrically connected. Therefore, it is preferable that the protruding portions 15 are formed to be a close. That is, it is preferable that the distances between the protruding portions 15 in the plane direction are narrow. However, since the piezoelectric film 12, that is, the protruding portion 15, is extremely thin, the protruding portion 15 tends to bend. Therefore, in a case where the shape of the protruding portions is rectangular, if the distance between the protruding portions 15 is narrow and the protruding portions 15 are bent, the side surfaces of the protruding portions 15 are likely to come into contact with each other, the first electrode layer of one protruding portion 15 and the second electrode layer of the other protruding portion 15 may come into contact with each other to cause a short circuit.

In order to prevent such contact between the protruding portions 15, it is conceivable that the widths of the protruding portions 15 are reduced to increase the distances between the protruding portions 15. However, in a case where the widths of the protruding portions 15 are reduced, the current density of the current flowing through the protruding portions 15 is high and tend to generate heat. Thus, this configuration is not preferable.

Further, in a case where the shape of the protruding portion 15 is rectangular, as shown in FIG. 55, excessive cutting is likely to occur in a case where the piezoelectric film is cut to form the protruding portion 15. In a case where pressure is applied when laminating such a piezoelectric film, the excessively cut portion 15a may interfere with the adjacent piezoelectric film 12 to cause a short circuit.

On the other hand, the laminated piezoelectric element shown in FIG. 56 has the protruding portion 15 on the side which is the same side in a case where the five piezoelectric films 12 are laminated. The protruding portions 15 of the respective piezoelectric films 12 are formed at positions displaced in the direction along the side on which the protruding portions 15 are formed so as not to overlap as viewed from a direction perpendicular to the principal surface. Further, the width of the protruding portion 15 of the laminated piezoelectric element shown in FIG. 56 in the direction orthogonal to the protrusion direction is narrower on the distal end side than on the cemented portion side (root side). In the example shown in the drawing, the shape of the protruding portion in the plan view is trapezoidal.

As described above, in a case where the width of the protruding portion 15 is narrow on the distal end side, it is difficult for the side surfaces of the protruding portion 15 to come into contact with each other even in a case where the protruding portion 15 is bent. Therefore, it is possible to prevent a short circuit from occurring even in a case where the distance between the protruding portions 15 is narrowed. Further, since the width of the root part of the protruding portion 15 is large, it is possible to suppress an increase in current density of the current flowing through the protruding portion 15, and it is possible to suppress heat generation.

Further, in a case where the shape of the protruding portion 15 is trapezoidal, as shown in FIG. 57, excessive cutting is unlikely to occur in a case where the piezoelectric film is cut to form the protruding portion 15. Therefore, even in a case where pressure is applied when laminating the piezoelectric films, it is possible to prevent the excessively cut portion from interfering with the adjacent piezoelectric film 12 and causing a short circuit.

In the example shown in FIG. 56, the shape of the protruding portion is trapezoidal, but the shape is not limited to this, and the width on the distal end side may be narrower than the width on the root side. For example, the side of the protruding portion in contact with the cemented portion may be curved. Further, the width of the protruding portion may be gradually narrowed from the root side to the distal end side (stepped shape).

Here, in each of the above-mentioned examples, each piezoelectric film has a single-layered sheet shape, but the present invention is not limited to this. At least one of the plurality of piezoelectric films may have a bellows shape that is folded back at least once.

Figure 28:
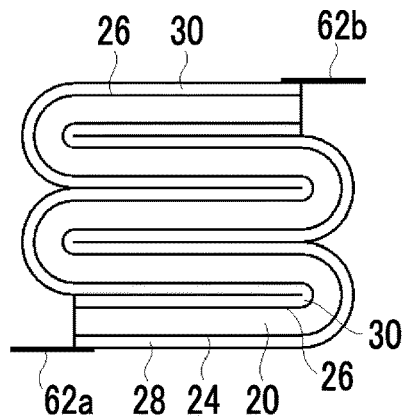
FIG. 28 is a diagram conceptually showing an example of a bellows-like piezoelectric film.

FIG. 28 shows an example of a bellows-like piezoelectric film.

The piezoelectric film shown in FIG. 28 is obtained by laminating a plurality of layers of a piezoelectric film by folding the piezoelectric film a plurality of times. Further, as a preferred embodiment, each layer of the piezoelectric film laminated by folding is cemented by the adhesive layer.

By folding back and laminating one sheet of the piezoelectric film polarized in the thickness direction, the polarization directions of the piezoelectric film adjacent (facing) in the lamination direction become opposite directions.

With this configuration, only one power source for applying the driving voltage is required, and moreover, an electrode may be led out from the piezoelectric film at one place.

Therefore, by making the laminated piezoelectric element a lattice having a bellows-like piezoelectric film, the number of components can be reduced, the configuration can be simplified, the reliability of the piezoelectric element (module) can be improved, and a further reduction in cost can be achieved.

Like the piezoelectric film shown in FIG. 28, in the piezoelectric film obtained by folding the piezoelectric film, the number of times of folding is set to an even number, and the odd-numbered layers are laminated such that the first protective layer 28 is a surface on one surface and the second protective layer 30 is a surface on the other surface. Therefore, by forming the first contact 28a on the surface on the first protective layer 28 side and forming the second contact 30a on the surface on the second protective layer 30 side, the electrode can be easily pulled out.

Examples of laminated piezoelectric elements including one or greater such bellows-like piezoelectric films are shown in FIGS. 29 to 36.

Each of the laminated piezoelectric elements shown in FIGS. 29 to 32 has a configuration in which a bellows-like piezoelectric film 12L and a sheet-like piezoelectric film 12 are laminated. The bellows-like piezoelectric film 12L has the protruding portion 15 that is not cemented to the sheet-like piezoelectric film 12, and the first contact and the second contact (not shown) are formed in the protruding portion 15. A conductive film 62a is connected to the first contact. Further, a conductive film 62b is connected to the second contact.

The sheet-like piezoelectric film 12 has the protruding portion 15 that is not cemented to the bellows-like piezoelectric film 12L, and the first contact and the second contact (not shown) are formed in the protruding portion 15. A conductive film 62c is connected to the first contact. Further, a conductive film 62d is connected to the second contact.

Figure 29:
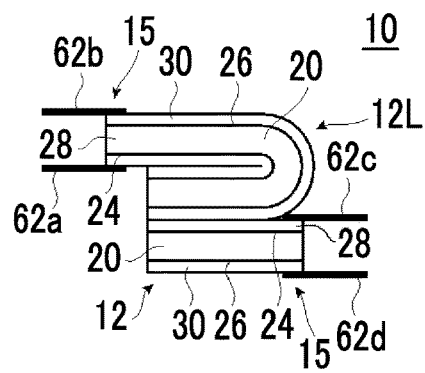
FIG. 29 is a diagram conceptually showing another example of the laminated piezoelectric element of the present invention.

In the example shown in FIG. 29, the polarization direction of the sheet-like piezoelectric film 12 and the polarization direction of the bellows-like piezoelectric film 12L in the layer in contact with the sheet-like piezoelectric film 12 coincide with each other. Further, the protruding portion 15 of the sheet-like piezoelectric film 12 and the protruding portion 15 of the bellows-like piezoelectric film 12L are formed at different positions in the plane direction.

Figure 30:
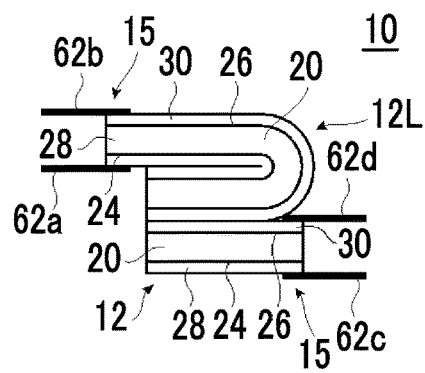
FIG. 30 is a diagram conceptually showing another example of the laminated piezoelectric element of the present invention.

In the example shown in FIG. 30, the polarization direction of the sheet-like piezoelectric film 12 and the polarization direction of the bellows-like piezoelectric film 12L in the layer in contact with the sheet-like piezoelectric film 12 is opposite to each other. Further, the protruding portion 15 of the sheet-like piezoelectric film 12 and the protruding portion 15 of the bellows-like piezoelectric film 12L are formed at different positions in the plane direction.

Figure 31:
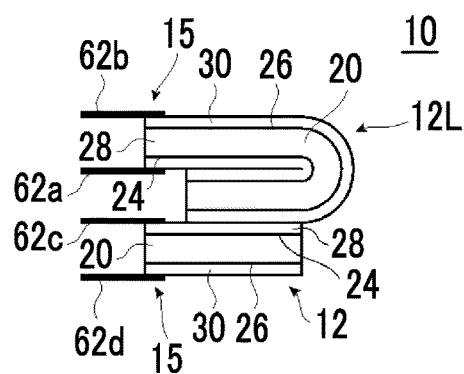
FIG. 31 is a diagram conceptually showing another example of the laminated piezoelectric element of the present invention.

In the example shown in FIG. 31, the polarization direction of the sheet-like piezoelectric film 12 and the polarization direction of the bellows-like piezoelectric film 12L in the layer in contact with the sheet-like piezoelectric film 12 coincide with each other. Further, the protruding portion 15 of the sheet-like piezoelectric film 12 and the protruding portion 15 of the bellows-like piezoelectric film 12L are formed at the same positions in the plane direction.

Figure 32:
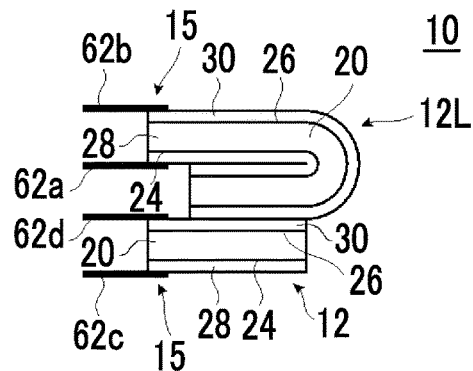
FIG. 32 is a diagram conceptually showing another example of the laminated piezoelectric element of the present invention.

In the example shown in FIG. 32, the polarization direction of the sheet-like piezoelectric film 12 and the polarization direction of the bellows-like piezoelectric film 12L in the layer in contact with the sheet-like piezoelectric film 12 is opposite to each other. Further, the protruding portion 15 of the sheet-like piezoelectric film 12 and the protruding portion 15 of the bellows-like piezoelectric film 12L are formed at the same positions in the plane direction.

Each of the laminated piezoelectric elements shown in FIGS. 33 to 36 has a configuration in which two bellows-like piezoelectric films are laminated. The bellows-like piezoelectric film 12La has the protruding portion 15 that is not cemented to the bellows-like piezoelectric film 12Lb, and the first contact and the second contact (not shown) are formed in the protruding portion 15. A conductive film 62a is connected to the first contact. Further, a conductive film 62b is connected to the second contact.

The bellows-like piezoelectric film 12Lb has the protruding portion 15 that is not cemented to the bellows-like piezoelectric film 12La, and the first contact and the second contact (not shown) are formed in the protruding portion 15. A conductive film 62e is connected to the first contact. Further, a conductive film 62f is connected to the second contact.

Figure 33:
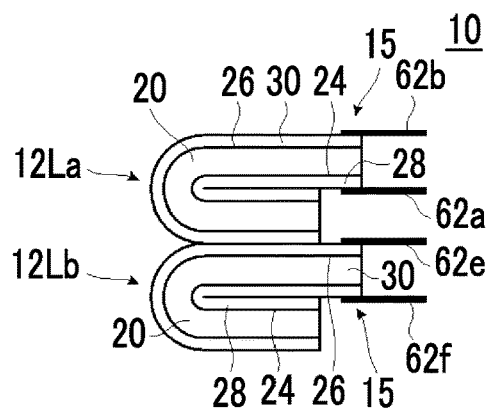
FIG. 33 is a diagram conceptually showing another example of the laminated piezoelectric element of the present invention.

In the example shown in FIG. 33, the polarization direction of the bellows-like piezoelectric film 12La in the layer in contact with the bellows-like piezoelectric film 12Lb and the polarization direction of the bellows-like piezoelectric film 12Lb in the layer in contact with the bellows-like piezoelectric film 12La are opposite to each other. Further, the protruding portions 15 of the two bellows-like piezoelectric films are formed at the same positions in the plane direction. Further, the protruding portion 15 of the bellows-like piezoelectric film 12La is formed on the layer on the side not in contact with the bellows-like piezoelectric film 12Lb. On the other hand, the protruding portion 15 of the bellows-like piezoelectric film 12Lb is formed on the layer on the side in contact with the bellows-like piezoelectric film 12La.

Figure 34:
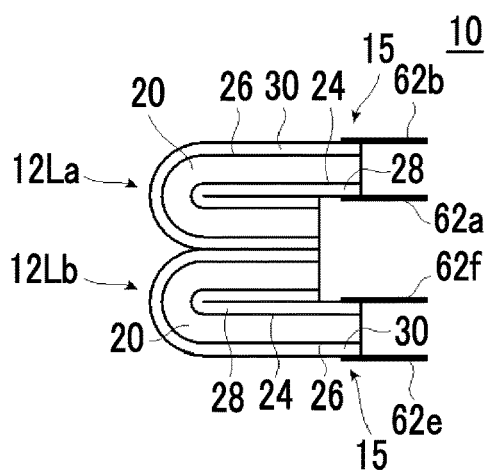
FIG. 34 is a diagram conceptually showing another example of the laminated piezoelectric element of the present invention.

In the example shown in FIG. 34, the polarization direction of the bellows-like piezoelectric film 12La in the layer in contact with the bellows-like piezoelectric film 12Lb and the polarization direction of the bellows-like piezoelectric film 12Lb in the layer in contact with the bellows-like piezoelectric film 12La are opposite to each other. Further, the protruding portions 15 of the two bellows-like piezoelectric films are formed at the same positions in the plane direction. Further, the protruding portion 15 of the bellows-like piezoelectric film 12La is formed on the layer on the side not in contact with the bellows-like piezoelectric film 12Lb. Further, the protruding portion 15 of the bellows-like piezoelectric film 12Lb is formed on a layer on the side not in contact with the bellows-like piezoelectric film 12La.

Figure 35:
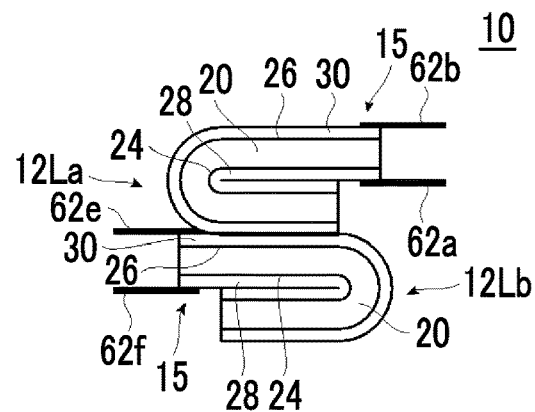
FIG. 35 is a diagram conceptually showing another example of the laminated piezoelectric element of the present invention.

In the example shown in FIG. 35, the polarization direction of the bellows-like piezoelectric film 12La in the layer in contact with the bellows-like piezoelectric film 12Lb and the polarization direction of the bellows-like piezoelectric film 12Lb in the layer in contact with the bellows-like piezoelectric film 12La are opposite to each other. Further, the protruding portions 15 of the two bellows-like piezoelectric films are formed at different positions in the plane direction. Further, the protruding portion 15 of the bellows-like piezoelectric film 12La is formed on the layer on the side not in contact with the bellows-like piezoelectric film 12Lb. On the other hand, the protruding portion 15 of the bellows-like piezoelectric film 12Lb is formed on the layer on the side in contact with the bellows-like piezoelectric film 12La.

Figure 36:
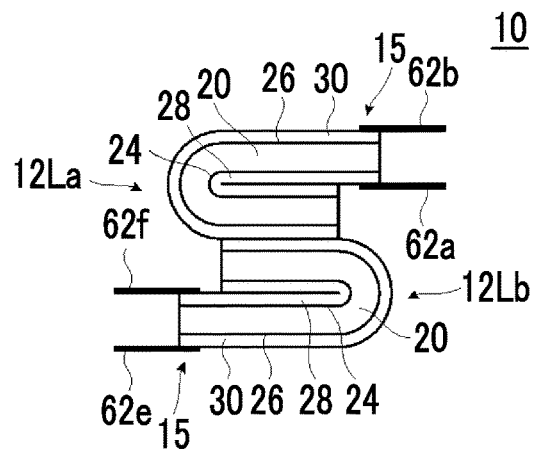
FIG. 36 is a diagram conceptually showing another example of the laminated piezoelectric element of the present invention.

In the example shown in FIG. 36, the polarization direction of the bellows-like piezoelectric film 12La in the layer in contact with the bellows-like piezoelectric film 12Lb and the polarization direction of the bellows-like piezoelectric film 12Lb in the layer in contact with the bellows-like piezoelectric film 12La are opposite to each other. Further, the protruding portions 15 of the two bellows-like piezoelectric films are formed at different positions in the plane direction. Further, the protruding portion 15 of the bellows-like piezoelectric film 12La is formed on the layer on the side not in contact with the bellows-like piezoelectric film 12Lb. Further, the protruding portion 15 of the bellows-like piezoelectric film 12Lb is formed on a layer on the side not in contact with the bellows-like piezoelectric film 12La.

As described above, even in a case where at least one of the plurality of piezoelectric films has a bellows shape that is folded back at least once, the layer configuration of each piezoelectric film, the formation position of the protruding portion, and the like can be various.

Here, in the example shown in FIG. 1 and the like, the protruding portion 15 has a configuration in which the first protective layer 28, the first electrode layer 24, the piezoelectric layer 20, the second electrode layer 26, and the second protective layer 30 are laminated. That is, the protruding portion 15 has the same layer configuration as that of the piezoelectric film 12, but is not limited thereto. The protruding portion may have a configuration in which at least the first electrode layer 24 and the first protective layer 28, or the second electrode layer 26 and the second protective layer 30 are laminated.

Figure 37:
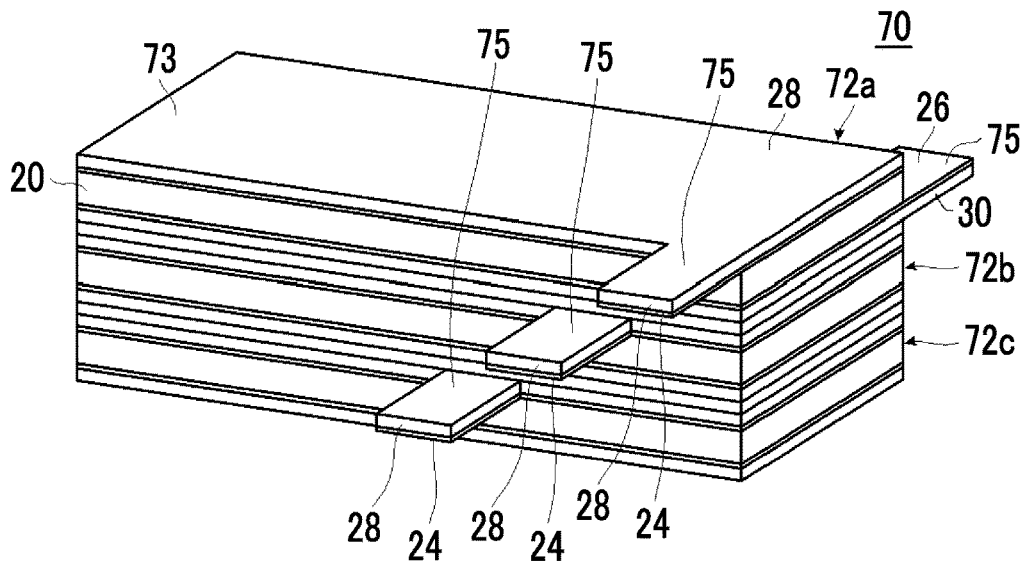
FIG. 37 is a diagram conceptually showing another example of the laminated piezoelectric element of the present invention.
Figure 38:
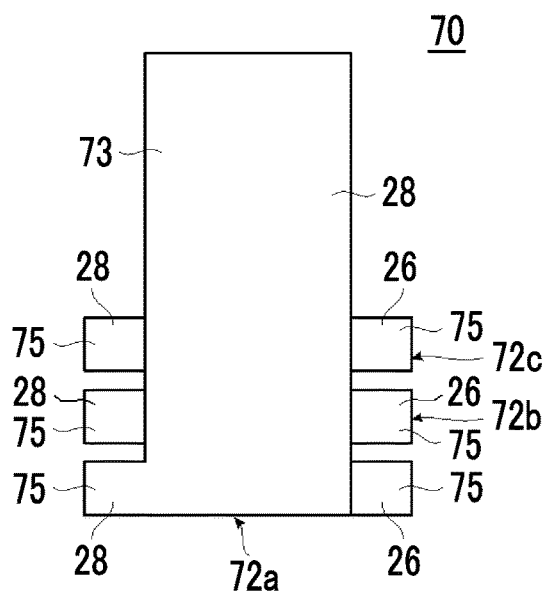
FIG. 38 is a top view of FIG. 37.
Figure 39:
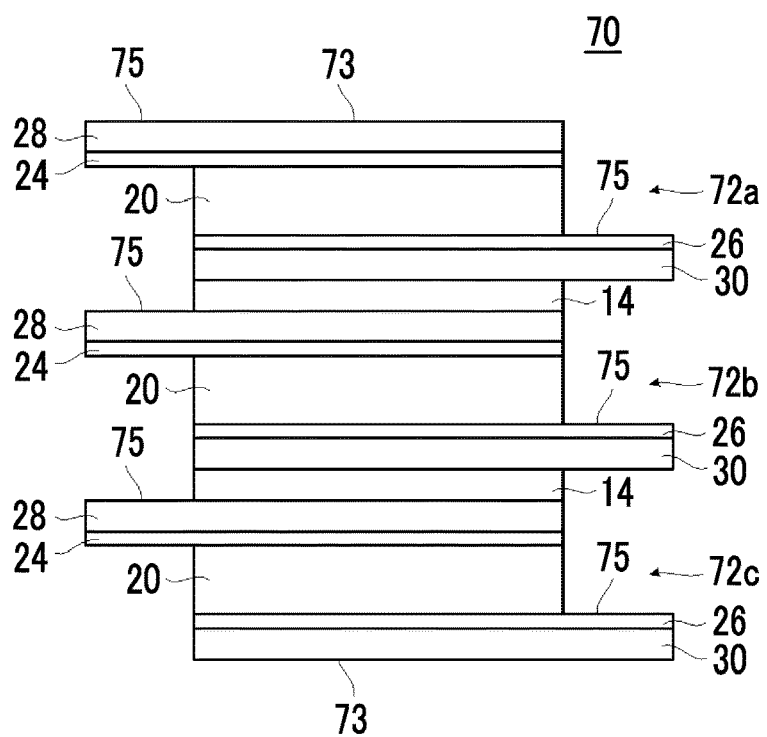
FIG. 39 is a side view of FIG. 37.
Figure 40:
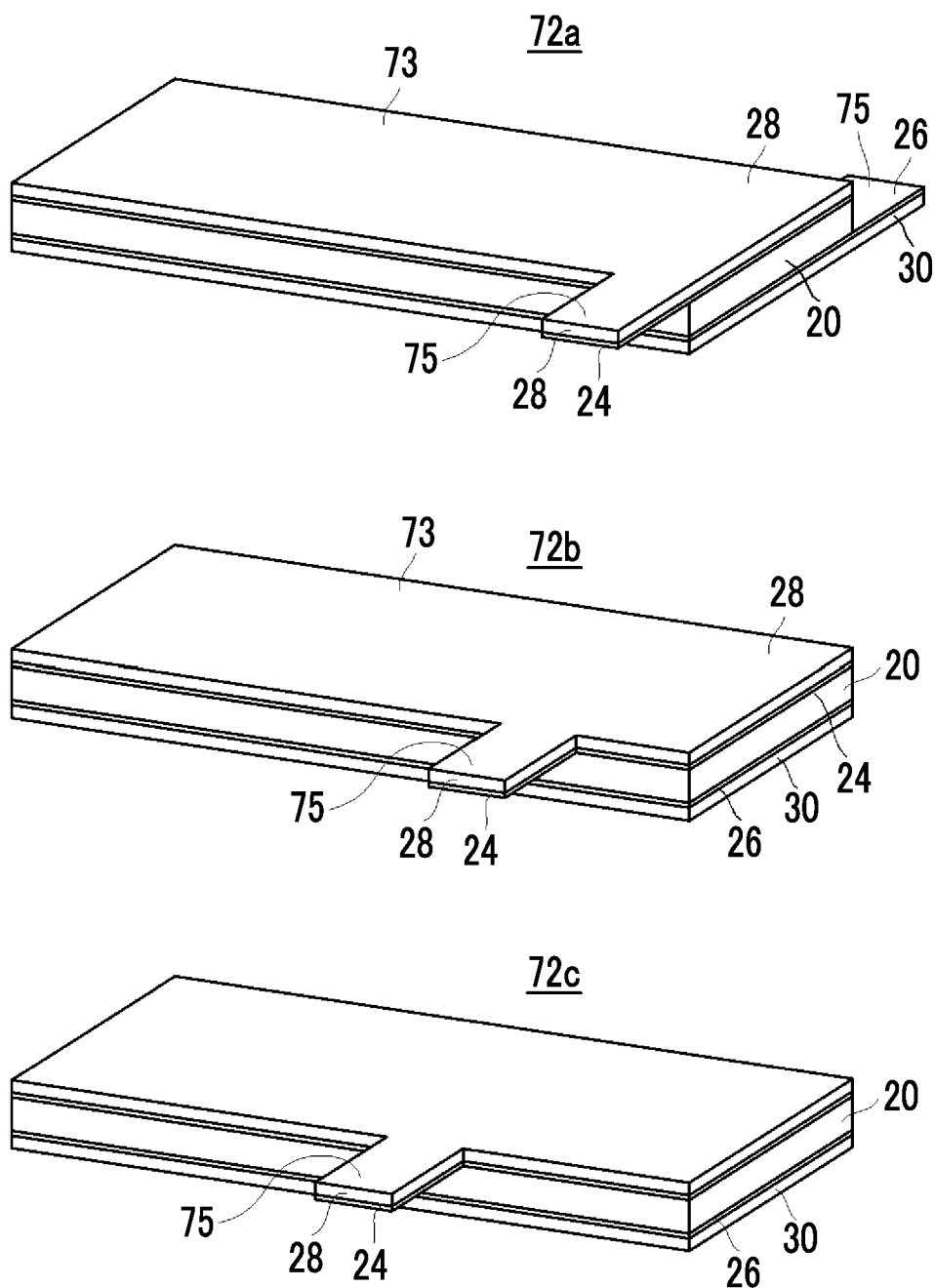
FIG. 40 is a diagram showing a piezoelectric film included in the laminated piezoelectric element of FIG. 37.

FIG. 37 is a diagram conceptually showing another example of the laminated piezoelectric element of the present invention. FIG. 38 is a top view of FIG. 37. FIG. 39 is a side view of FIG. 37. FIG. 40 is a diagram showing each of a plurality of piezoelectric films included in the laminated piezoelectric element of FIG. 37.

The examples shown in FIGS. 37 to 39 each have a configuration in which three piezoelectric films are laminated. The piezoelectric films are laminated such that the polarization directions are the same. In FIGS. 37 to 39, the first layer piezoelectric film 72a in FIG. 37 is laminated with the first protective layer 28 side facing upward, the second layer piezoelectric film 72b is laminated with the first protective layer 28 side facing upward, and the third layer piezoelectric film 72c is laminated with the first protective layer 28 side facing upward.

As shown in FIG. 37, each piezoelectric film has a rectangular cemented portion 73 and two protruding portions 75a and 75b protruding outward in the plane direction from the long side of the cemented portion 73. The protruding portion 75a has a configuration in which the first protective layer 28 and the first electrode layer 24 are laminated. The protruding portion 75a is provided so as to protrude outward from one long side of the cemented portion 73. The protruding portion 75b has a configuration in which the second protective layer 30 and the second electrode layer 26 are laminated. The protruding portion 75b is provided so as to protrude outward from the other long side of the cemented portion 73.

In the example shown in the drawing, the size of the cemented portion 13 of each piezoelectric film is substantially the same.

Further, each piezoelectric film is laminated such that a long side, on which the protruding portion 75a consisting of the first protective layer 28 and the first electrode layer 24 is disposed, and a long side, on which the protruding portion 75b consisting of the second protective layer 30 and the second electrode layer 26 is disposed, coincide with each other in the plane direction.

As shown in FIG. 40, in the first layer piezoelectric film 72a, the protruding portion 75a is formed on one end side of one long side of the cemented portion 73, and the protruding portion 75b is formed on one end side of the other long side thereof. In the second layer piezoelectric film 72b, the protruding portions 75a and 75b are formed at positions shifted from the positions of the protruding portions of the first layer piezoelectric film 72a toward the other end thereof, respectively. The third layer piezoelectric film 72c is formed with protruding portions 75a and 75b at positions shifted from the positions of the protruding portions of the second layer piezoelectric film 72b toward the other end thereof, respectively.

In the example shown in FIG. 40, the protruding portions of the piezoelectric films have substantially the same size and shape. Further, the protruding portion of each piezoelectric film is formed at a position shifted by one protruding portion from the position of the protruding portion of the adjacent piezoelectric film.

As shown in FIG. 40, in the protruding portion 75a on the long side of one of the piezoelectric films, the first electrode layer 24 is exposed on the surface on the side surface in the drawing. Further, the second electrode layer 26 is exposed at the protruding portion 75b on the other long side of each piezoelectric film. Consequently, the exposed first electrode layer 24 of the protruding portion 75a formed on one long side of each piezoelectric film serves as the first contact, and the exposed second electrode layer 26 of the protruding portion 75b formed on the other long side serves as the second contact.

In a case where such three piezoelectric films are laminated such that the positions of the cemented portions 73 in the plane direction are aligned, as shown in FIG. 37, the protruding portions 75a and 75b of the piezoelectric films do not overlap with each other in the plane direction.

Further, the first contact (first electrode layer 24) is formed on each of the protruding portions 75a on the long side of one of the piezoelectric films.

Figure 41:
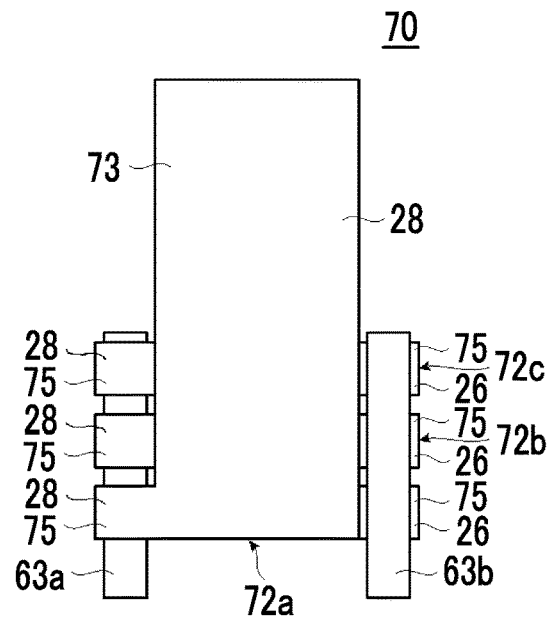
FIG. 41 is a diagram showing an example in which a conductive film is cemented to the laminated piezoelectric element of FIG. 37.

As shown in FIG. 41, the conductive film 63a is cemented to the surface of the protruding portions 75a on the side of the first contact (first electrode layer 24). Thereby, the first contact of each piezoelectric film is easily electrically connected.

In a similar manner, the second contact (second electrode layer 26) is formed on each of the protruding portions 75b on the other long side of each piezoelectric film.

As shown in FIG. 41, the conductive film 63b is cemented to the surface of the protruding portions 75b on the side of the second contact (second electrode layer 26). Thereby, the second contact of each piezoelectric film is easily electrically connected.

As described above, even in a case where the protruding portion has a configuration in which at least the first electrode layer 24 and the first protective layer 28 or the second electrode layer 26 and the second protective layer 30 are laminated, a protruding portion that is not cemented to the adjacent piezoelectric film is provided, and the first contact or the second contact is provided on the protruding portion. Thereby, the first electrode layers 24 and the second electrode layers 26 can be easily connected to each other.

Figure 42:
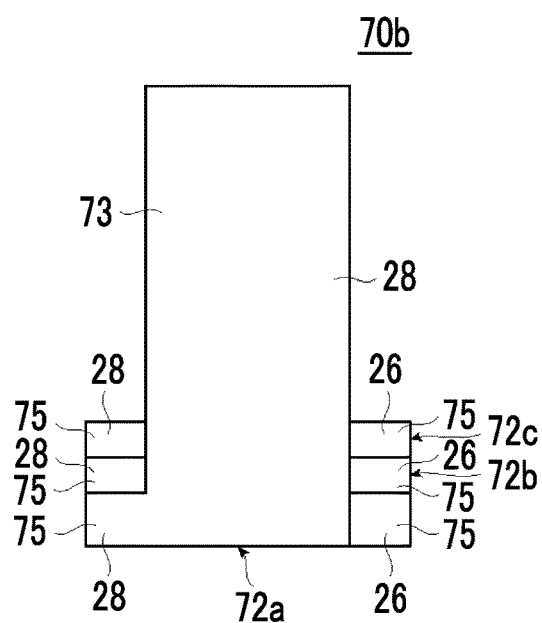
FIG. 42 is a diagram conceptually showing another example of the laminated piezoelectric element of the present invention.

Here, in the example shown in FIG. 38, the protruding portions of the piezoelectric films are disposed so as not to overlap in the plane direction, but the present invention is not limited to this. As shown in FIG. 42, The protruding portions of the film adjacent piezoelectric films may be disposed so as to partially overlap in the plane direction.

Further, in the example shown in FIG. 37, the piezoelectric films are laminated so as to have the same polarization direction, but the present invention is not limited to this. The piezoelectric films may be laminated such that the polarization directions are alternated. In such a case, as in the example shown in FIG. 16, the protruding portions 75$a$ of the adjacent piezoelectric films or the protruding portions 75$b$ may be formed at the same position in the plane direction.

Further, in a case where the protruding portion has a configuration in which at least the first electrode layer 24 and the first protective layer 28, or the second electrode layer 26 and the second protective layer 30 are laminated, as in the above-mentioned example shown in FIG. 21, the protruding portions 75$a$ and/or the protruding portions 75$b$ of the piezoelectric film each may be configured to protrude from the same position on the cemented portion in the plane direction and have lengths different from each other in the protrusion directions.

Further, in a case where the piezoelectric films are laminated such that the polarization directions are alternated and the protruding portions 75$a$ and/or the protruding portions 75$b$ of the piezoelectric films each protrude from the same position on the cemented portion in the plane direction, as in the example of FIG. 23, the protruding portion may be bent in the protrusion direction such that the first contact or the second contact of each piezoelectric film is disposed on the same surface side.

Further, as in the example shown in FIG. 24, the protruding portions 75$a$ and/or the protruding portions 75$b$ of each piezoelectric film may be configured to protrude from the same position on the cemented portion in the plane direction, have the same length in the protrusion direction, and be connected by using a plurality of conductive films.

Further, at least one piezoelectric film is a bellows-like piezoelectric film. The bellows-like piezoelectric film may be configured to have the protruding portion 75$a$ consisting of the first protective layer 28 and the first electrode layer 24 and the protruding portion 75$b$ consisting of the second protective layer 30 and the second electrode layer 26.

Figure 43:
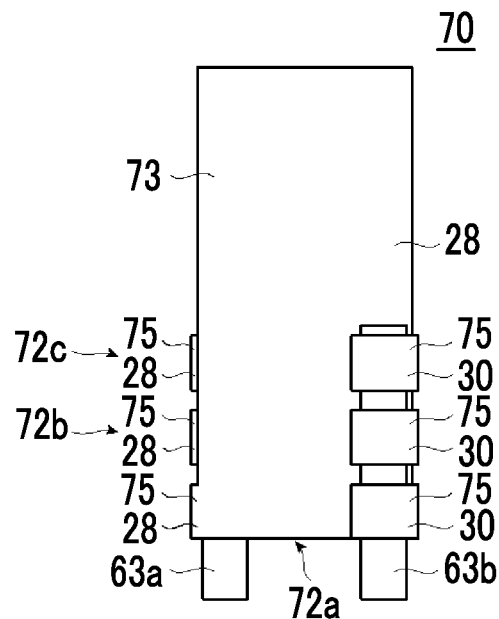
FIG. 43 is a diagram conceptually showing another example of the laminated piezoelectric element of the present invention.
Figure 44:
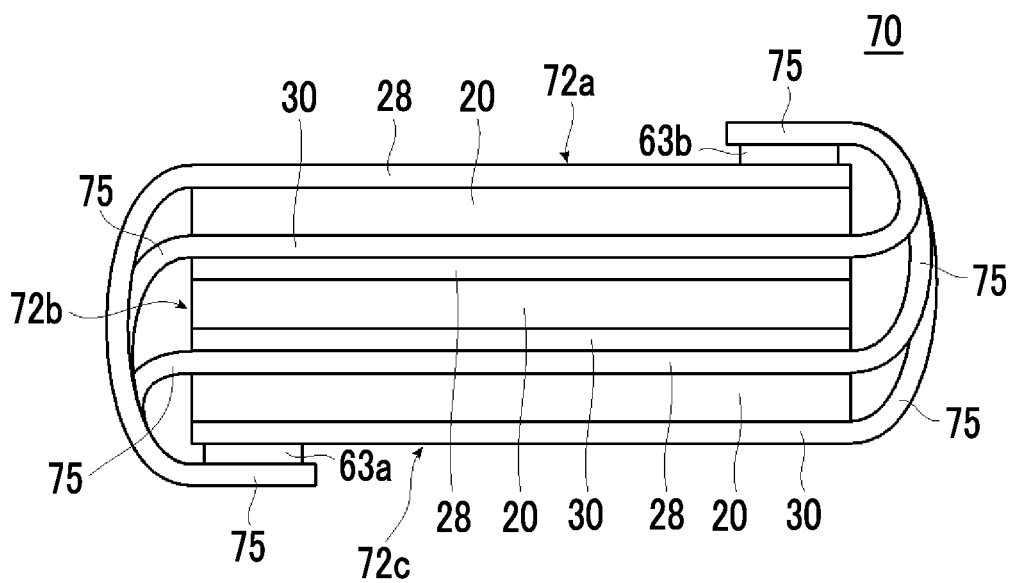
FIG. 44 is a side view of FIG. 43.

Further, in a configuration in which the first contact and the second contact of each piezoelectric film are connected by a conductive film, the protruding portion may be bent toward one principal surface of the cemented portion as shown in FIGS. 43 and 44. Space can be saved by bending the protruding portion. In FIG. 44, the drawing of the electrode layer is omitted.

In this respect, it is the same for a case where the above-mentioned protruding portion may have a configuration in which the first protective layer 28, the first electrode layer 24, the piezoelectric layer 20, the second electrode layer 26, and the second protective layer 30 are laminated.

As shown in FIG. 40, in the piezoelectric film, as a method for forming a protruding portion in which only the electrode layer and the protective layer protrude in the plane direction, a method described in paragraphs [0082] to [0084] of JP2014-209724A or the like can be used.

While the laminated piezoelectric element and the electroacoustic transducer of the present invention have been described in detail, the present invention is not limited to the examples described above, and various improvements or modifications may be naturally performed within a range not deviating from the gist of the present invention.

INDUSTRIAL APPLICABILITY

The laminated piezoelectric element can be suitably used as an exciter or the like that abuts on various members to generate a sound.

EXPLANATION OF REFERENCES 10, 70, 70$b$: laminated piezoelectric element
11$a$, 11$c$: sheet-like member
11$b$: laminate
12, 12$a$ to 12$w$, 12L, 12La, 12Lb, 72$a$ to 72$c$: piezoelectric film
13, 73: cemented portion
14, 52: adhesive layer
15, 75$a$, 75$b$: protruding portion
20: piezoelectric layer
24: first electrode layer
26: second electrode layer
28: first protective layer
28$a$: hole portion (first contact)
30: second protective layer
30$a$: hole portion (second contact)
34: viscoelastic matrix
36: piezoelectric particles
40: corona electrode
42: direct-current power source
50, 50$a$ to 50$c$: vibration plate
60$a$ to 60$b$, 61$a$ to 61$f$, 62$a$ to 62$f$, 63$a$, 63$b$: conductive film
80, 80$a$ to 80$f$: fixing unit

What is claimed is:

1. A laminated piezoelectric element,
wherein a plurality of layers of piezoelectric films, each of which is formed by laminating a first protective layer, a first electrode layer, a piezoelectric layer, a second electrode layer, and a second protective layer in this order, are laminated,
each of the piezoelectric layers is polarized in a thickness direction,
in each of the piezoelectric films, the first electrode is disposed on an upstream side in a polarization direction of the piezoelectric layer, and the second electrode is disposed on a downstream side,
each of the plurality of piezoelectric films has a cemented portion which is cemented to an adjacent piezoelectric film and a protruding portion which is not cemented to the adjacent piezoelectric film and in which at least the first electrode layer and the first protective layer or the second electrode layer and the second protective layer protrude from the cemented portion toward the outside in a plane direction, and at the protruding portion of each of the piezoelectric films, at least one of a first contact, to which the first electrode layers of the piezoelectric films are electrically connected to each other, or a second contact, to which the second electrode layers of the piezoelectric films are electrically connected to each other, is formed.

2. The laminated piezoelectric element according to claim 1, wherein the protruding portion has a configuration in which the first protective layer, the first electrode layer, the piezoelectric layer, the second electrode layer, and the second protective layer are laminated.

3. The laminated piezoelectric element according to claim 1, wherein the protruding portions of the piezoelectric films are disposed such that at least parts thereof do not overlap with each other in the plane direction.

4. The laminated piezoelectric element according to claim 1, wherein the protruding portions of the piezoelectric films protrude from same positions on the cemented portions in the plane direction, and lengths thereof in a protrusion direction are different from each other.

5. The laminated piezoelectric element according to claim 1, wherein the protruding portion of each of the piezoelectric films has a width in a direction orthogonal to a protrusion direction being equal to a width of the cemented portion.

6. The laminated piezoelectric element according to claim 1, wherein at least one of the plurality of piezoelectric films has a bellows shape that is folded back at least once.

7. The laminated piezoelectric element according to claim 1, wherein a corner portion of a connection portion between the protruding portion and the cemented portion of the piezoelectric film is provided with an R structure of 0.5 mm or greater.

8. The laminated piezoelectric element according to claim 1, wherein the adjacent piezoelectric films are disposed such that the first electrode sides or the second electrode sides face each other.

9. The laminated piezoelectric element according to claim 8, wherein one of the protruding portions of the adjacent piezoelectric films is bent in a protrusion direction.

10. The laminated piezoelectric element according to claim 1,
wherein a conductive film connecting the first electrode layers to each other or the second electrode layers to each other is cemented to the protruding portion of each of the piezoelectric films, and
the protruding portion of each of the piezoelectric films is bent toward one principal surface side of the cemented portion.

11. The laminated piezoelectric element according to claim 1, wherein a width of the protruding portion in a direction orthogonal to a protrusion direction is narrower on a distal end side than on a cemented portion side.

12. The laminated piezoelectric element according to claim 11, wherein the width of the protruding portion gradually narrows as a distance from the cemented portion increases.

13. The laminated piezoelectric element according to claim 12, wherein the protruding portion has a trapezoidal shape as viewed from a direction perpendicular to a principal surface of the cemented portion.

14. An electroacoustic transducer comprising: the laminated piezoelectric element according to claim 1; and a vibration plate to which the laminated piezoelectric element is fixed.

15. The electroacoustic transducer according to claim 14, wherein the vibration plate and the laminated piezoelectric element are cemented by a cementing agent.

16. The electroacoustic transducer according to claim 15, wherein the vibration plate has a quadrangular shape of which at least one group of two facing sides is fixed, and in a case where a distance between fixed ends of the two facing sides is L, cementing of the laminated piezoelectric element to the vibration plate is performed at positions separated from the fixed ends by "0.1×L" or greater.

17. The electroacoustic transducer according to claim 16, wherein the vibration plate has a rectangular shape or a square shape.

18. The electroacoustic transducer according to claim 16, wherein a spring constant of the vibration plate is equal to or greater than $1 \times 10^4$ N/m and equal to or less than $1 \times 10^7$ N/m.

19. The laminated piezoelectric element according to claim 2, wherein the protruding portions of the piezoelectric films are disposed such that at least parts thereof do not overlap with each other in the plane direction.

20. The laminated piezoelectric element according to claim 2, wherein the protruding portions of the piezoelectric films protrude from same positions on the cemented portions in the plane direction, and lengths thereof in a protrusion direction are different from each other.

* * * * *